(12) United States Patent
Yeh et al.

(10) Patent No.: US 11,798,897 B2
(45) Date of Patent: Oct. 24, 2023

(54) PACKAGE STRUCTURE AND METHODS OF MANUFACTURING THE SAME

(71) Applicant: Taiwan Semiconductor Manufacturing Company, Ltd., Hsinchu (TW)

(72) Inventors: Shu-Shen Yeh, Taoyuan (TW); Po-Yao Lin, Hsinchu County (TW); Chin-Hua Wang, New Taipei (TW); Chia-Kuei Hsu, Hsinchu (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 3 days.

(21) Appl. No.: 17/363,030

(22) Filed: Jun. 30, 2021

(65) Prior Publication Data
US 2022/0310532 A1   Sep. 29, 2022

Related U.S. Application Data

(60) Provisional application No. 63/166,252, filed on Mar. 26, 2021.

(51) Int. Cl.
*H01L 23/00* (2006.01)
*H01L 21/48* (2006.01)
(Continued)

(52) U.S. Cl.
CPC .......... *H01L 23/562* (2013.01); *H01L 21/486* (2013.01); *H01L 21/4853* (2013.01);
(Continued)

(58) Field of Classification Search
CPC ............... H01L 23/562; H01L 21/4853; H01L 21/4857; H01L 21/486; H01L 21/4871;
(Continued)

(56) References Cited

U.S. PATENT DOCUMENTS

| 8,993,380 B2 | 3/2015 | Hou et al. |
| 9,281,254 B2 | 3/2016 | Yu et al. |

(Continued)

FOREIGN PATENT DOCUMENTS

| TW | 202008479 | 2/2020 |
| TW | 202111861 | 3/2021 |
| TW | I721884 | 3/2021 |

OTHER PUBLICATIONS

"Office Action of Taiwan Counterpart Application", dated May 26, 2022, p. 1-p. 10.

*Primary Examiner* — Selim U Ahmed
*Assistant Examiner* — Evan G Clinton
(74) *Attorney, Agent, or Firm* — JCIPRNET

(57) ABSTRACT

A package structure includes a circuit substrate, a semiconductor device and a ring structure. The circuit substrate has a first region and a second region connected thereto. The circuit substrate includes at least one routing layer including a dielectric portion and a conductive portion disposed thereon. A first ratio of a total volume of the conductive portion of the routing layer within the first region to a total volume of the dielectric and conductive portions of the routing layer within the first region is less than a second ratio of a total volume of the conductive portion of the routing layer within the second region to a total volume of the dielectric and conductive portions of the routing layer within the second region. The semiconductor device is disposed over the circuit substrate within the first region, and is electrically coupled to the circuit substrate. The ring structure is disposed over the circuit substrate within the second region.

20 Claims, 45 Drawing Sheets

(51) Int. Cl.
*H01L 23/16* (2006.01)
*H01L 21/56* (2006.01)
*H01L 21/683* (2006.01)
*H01L 23/31* (2006.01)
*H01L 23/367* (2006.01)
*H01L 23/538* (2006.01)
*H01L 23/58* (2006.01)

(52) U.S. Cl.
CPC ...... *H01L 21/4857* (2013.01); *H01L 21/4871* (2013.01); *H01L 21/563* (2013.01); *H01L 21/565* (2013.01); *H01L 21/568* (2013.01); *H01L 21/6835* (2013.01); *H01L 23/16* (2013.01); *H01L 23/3128* (2013.01); *H01L 23/3135* (2013.01); *H01L 23/3675* (2013.01); *H01L 23/5383* (2013.01); *H01L 23/5384* (2013.01); *H01L 23/5385* (2013.01); *H01L 23/5386* (2013.01); *H01L 23/585* (2013.01); *H01L 2221/68372* (2013.01)

(58) Field of Classification Search
CPC ... H01L 21/563; H01L 21/565; H01L 21/568; H01L 21/6835; H01L 23/16; H01L 23/3128; H01L 23/3135; H01L 23/3675; H01L 23/5383; H01L 23/5384; H01L 23/5385; H01L 23/5386; H01L 23/585; H01L 2221/68372; H01L 23/10; H01L 23/5389; H01L 23/36; H01L 23/42; H01L 23/49816; H01L 2224/16225; H01L 2224/32145; H01L 2224/32225; H01L 2224/48091; H01L 2224/48227; H01L 2224/73204; H01L 2224/73265; H01L 2224/81192; H01L 224/92125; H01L 2924/15311; H01L 2924/18161; H01L 23/3107; H01L 23/49822; H01L 23/552

See application file for complete search history.

(56) References Cited

U.S. PATENT DOCUMENTS

| | | | |
|---|---|---|---|
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 2014/0124913 | A1* | 5/2014 | Zhang ............... H01L 23/49822 257/691 |
| 2020/0152546 | A1* | 5/2020 | Refai-Ahmed ....... H01L 23/481 |
| 2020/0185300 | A1* | 6/2020 | Xu ...................... H01L 21/4853 |

* cited by examiner

PACKAGE STRUCTURE AND METHODS OF MANUFACTURING THE SAME

CROSS-REFERENCE TO RELATED APPLICATION

This application claims the priority benefit of U.S. provisional application Ser. No. 63/166,252, filed on Mar. 26, 2021. The entirety of the above-mentioned patent application is hereby incorporated by reference herein and made a part of this specification.

BACKGROUND

Developments in shrinking sizes of semiconductor devices and electronic components make the integration of more devices and components into a given volume possible and lead to high integration density of various semiconductor devices and/or electronic components.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
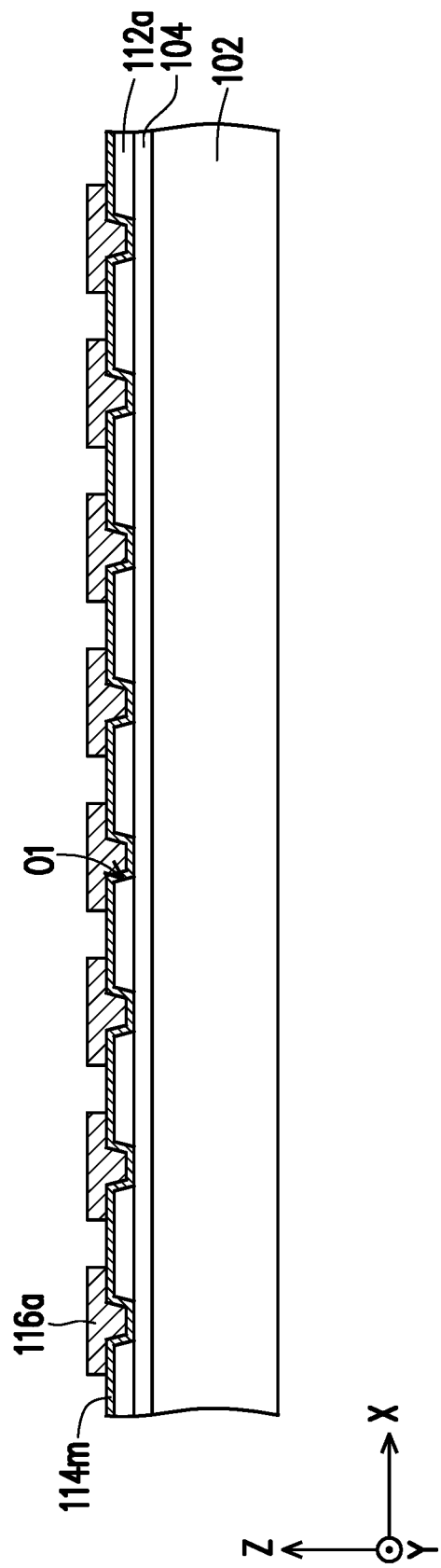
FIG. 1, FIG. 2, FIG. 3, FIG. 4, FIG. 5, FIG. 6, FIG. 7, FIG. 8, FIG. 9, FIG. 10, FIG. 11, FIG. 12A, FIG. 13A and FIG. 14A are schematic cross-sectional views showing a method of manufacturing a package structure in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth", "fifth", "sixth" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

It should be appreciated that the following embodiment(s) of the disclosure provides applicable concepts that can be embodied in a wide variety of specific contexts. The specific embodiment(s) discussed herein is merely illustrative and is not intended to limit the scope of the disclosure. A (semi-conductor) package structure and the method of manufacturing the same are provided in accordance with various exemplary embodiments. Before addressing the illustrated embodiments specifically, certain advantageous features and aspects of the present disclosed embodiments will be addressed generally. A package structure may be adopted for improving stress concentration and/or warpage issues during manufacturing and/or operation process. Described below is a package structure having a semiconductor device and a ring structure disposed over a substrate with a supporting structure embedded therein, where a positioning location of the ring structure is overlapped with a positioning location of the supporting structure in a stacking direction of the semiconductor device and the substrate. Owing to the supporting structure is a structure of metallic material (such as copper or like) being embedded in the substrate, it's positioning location is considered as a region having a high density of metallic material (e.g. a high Cu density region), such that a coefficient of thermal expansion (CET) between the ring structure and the substrate is suppressed, so as to avoid or reduce stress concentration and/or warpage issues (e.g., between the ring structure and the substrate). Besides, a lid is adopted in the package structure to be disposed over the semiconductor device and the ring structure, where the lid is thermally coupled to the semiconductor device and the ring structure, thereby enhancing the heat dissipation. Moreover, the lid, the ring structure and adhesives adopted to fix the lid and the ring structure onto the substrate can together constitute an electromagnetic interference shielding structure for the semiconductor device. The intermediate stages of forming the package structure are illustrated in accordance with some embodiments. Some variations of some embodiments are discussed. Throughout the various views and illustrative embodiments, like reference numbers are used to designate like elements.

The embodiments are intended to provide further explanations but are not used to limit the scope of the disclosure. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

FIG. 1 through FIG. 14B are schematic cross-sectional views or plane views showing a method of manufacturing a package structure 1000A in accordance with some embodiments of the disclosure, where the cross-sectional views are taken along a line A-A' depicted in the plane views. FIG. 15 is a flow chart illustrating a method of manufacturing a package structure in accordance with some embodiments of the disclosure. FIG. 16A through FIG. 16D are schematic and enlarged cross-sectional views showing various embodiments of a supporting structure in a dashed area U outlined in FIG. 12A in accordance with some embodiments of the disclosure. In embodiments, the manufacturing method is part of a wafer level packaging process. It is to be noted that the process steps described herein cover a portion of the manufacturing processes used to fabricate a (semi-conductor) package structure involving a semiconductor component such as a semiconductor device (or die/chip). The embodiments are intended to provide further explanations but are not used to limit the scope of the disclosure.

Referring to FIG. 1, in some embodiments, a carrier 102 is provided. In some embodiments, the carrier 102 is a glass carrier or any suitable carrier for carrying a semiconductor wafer or a reconstituted wafer for the manufacturing method of a semiconductor device (or component/die/chip, etc.) P1. In some embodiments, the carrier 102 is coated with a debond layer 104 (as shown in FIG. 1). The material of the debond layer 104 may be any material suitable for bonding and debonding the carrier 102 from the above layer(s) or any wafer(s) disposed thereon.

In some embodiments, the debond layer 104 includes a dielectric material layer made of a dielectric material including any suitable polymer-based dielectric material (such as benzocyclobutene (BCB), polybenzoxazole (PBO)). In an alternative embodiment, the debond layer 104 includes a dielectric material layer made of an epoxy-based thermal-release material, which loses its adhesive property when heated, such as a light-to-heat-conversion (LTHC) release coating film. In a further alternative embodiment, the debond layer 104 includes a dielectric material layer made of an ultra-violet (UV) glue, which loses its adhesive property when exposed to UV lights. The debond layer 104 may be dispensed as a liquid and cured, may be a laminate film laminated onto the carrier 102, or may be the like. For example, as shown in FIG. 1, an illustrated top surface of the debond layer 104, which is opposite to an illustrated bottom surface contacting the carrier 102, is leveled and has a high degree of coplanarity. In certain embodiments, the debond layer 104 is a LTHC layer with good chemical resistance, and such layer enables room temperature debonding from the carrier 102 by applying laser irradiation, however the disclosure is not limited thereto.

In an alternative embodiment, a buffer layer (not shown) is coated on the debond layer 104, where the debond layer 104 is sandwiched between the buffer layer and the carrier 102, and the top surface of the buffer layer may further provide a high degree of coplanarity. In some embodiments, the buffer layer may be a dielectric material layer. In some embodiments, the buffer layer may be a polymer layer which made of polyimide (PI), PBO, BCB, or any other suitable polymer-based dielectric material. In some embodiments, the buffer layer may be Ajinomoto Buildup Film (ABF), Solder Resist film (SR), or the like. In other words, the buffer layer is an optional dielectric layer, and may be omitted based on the demand and the design layout; the disclosure is not limited thereto.

Continued on FIG. 1, in some embodiments, a dielectric layer 112a is formed on the debond layer 104 and over the carrier 102. In some embodiments, the dielectric layer 112a is formed by, but not limited to, forming a blanket layer of dielectric material over the illustrated top surface of the debond layer 104 to completely cover the debond layer 104 and patterning the dielectric material blanket layer to form the dielectric layer 112a with a plurality of openings O1 exposing portions of the debond layer 104 underneath thereto.

The material of the dielectric layer 112a may be PI, PBO, BCB, a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric material blanket layer is formed by suitable fabrication techniques such as spin-on coating, chemical vapor deposition (CVD), (e.g. plasma-enhanced chemical vapor deposition (PECVD)), or the like.

Thereafter, in some embodiments, a seed layer material 114m is formed over the dielectric layer 112a, as shown in FIG. 1. In some embodiments, the seed layer material 114m is formed on the dielectric layer 112a and extends into the openings O1 formed in the dielectric layer 112a. In other words, the seed layer material 114m penetrates through the dielectric layer 112a, and sidewalls of the openings O1 are completely covered by the seed layer material 114m.

In some embodiments, the seed layer material 114m is formed on the debond layer 104 and over the carrier 102 in a manner of a blanket layer made of metal or metal alloy materials, the disclosure is not limited thereto. In some embodiments, the seed layer material 114m is referred to as a metal layer, which can be a single layer or a composite layer including a plurality of sub-layers formed of different materials. In some embodiments, the seed layer material 114m includes titanium, copper, molybdenum, tungsten, titanium nitride, titanium tungsten, combinations thereof, or the like. For example, the seed layer material 114m may include a titanium layer and a copper layer over the titanium layer. The seed layer material 114m may be formed using, for example, sputtering, physical vapor deposition (PVD), or the like. In some embodiments, the seed layer material 114m is conformally formed on the dielectric layer 112a by sputtering, and is in contact with the dielectric layer 112a and the debond layer 104 exposed by the openings O1. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

As illustrated in FIG. 1, in some embodiments, after the formation of the seed layer material 114m, a patterned conductive layer 116a is formed on the seed layer material 114m and over the dielectric layer 112a. In some embodiments, the patterned conductive layer 116a may be formed by, but not limited to, forming a blanket layer of conductive material over the dielectric layer 112a to completely cover the seed layer material 114m and patterning the conductive material blanket layer to form the patterned conductive layer 116a. The patterned conductive layer 116a may be made of conductive materials formed by electroplating or deposition, such as copper, copper alloy, aluminum, aluminum alloy, or combinations thereof, which may be patterned to form a plurality of conductive patterns/segments using a photolithography and etching process. In some embodiments, the conductive patterns/segments each includes a line portion extending over the seed layer material 114m along a horizontal direction (e.g. a direction X or Y) and/or a line portion extending over the seed layer material 114m along a horizontal direction (e.g. the direction X or Y) in addition to a via portion connecting to the line portion and extending into a respective one opening O1 along a vertical direction (e.g. a direction Z). The directions X, Y and Z may be different from each other. For example, as shown in FIG. 1, the directions X, Y and Z are perpendicular to each other. In some embodiments, the patterned conductive layer 116a is a patterned copper layer or other suitable patterned metal layer. For example, portions of the patterned conductive layer 116a further extend into the openings O1.

Figure 2:
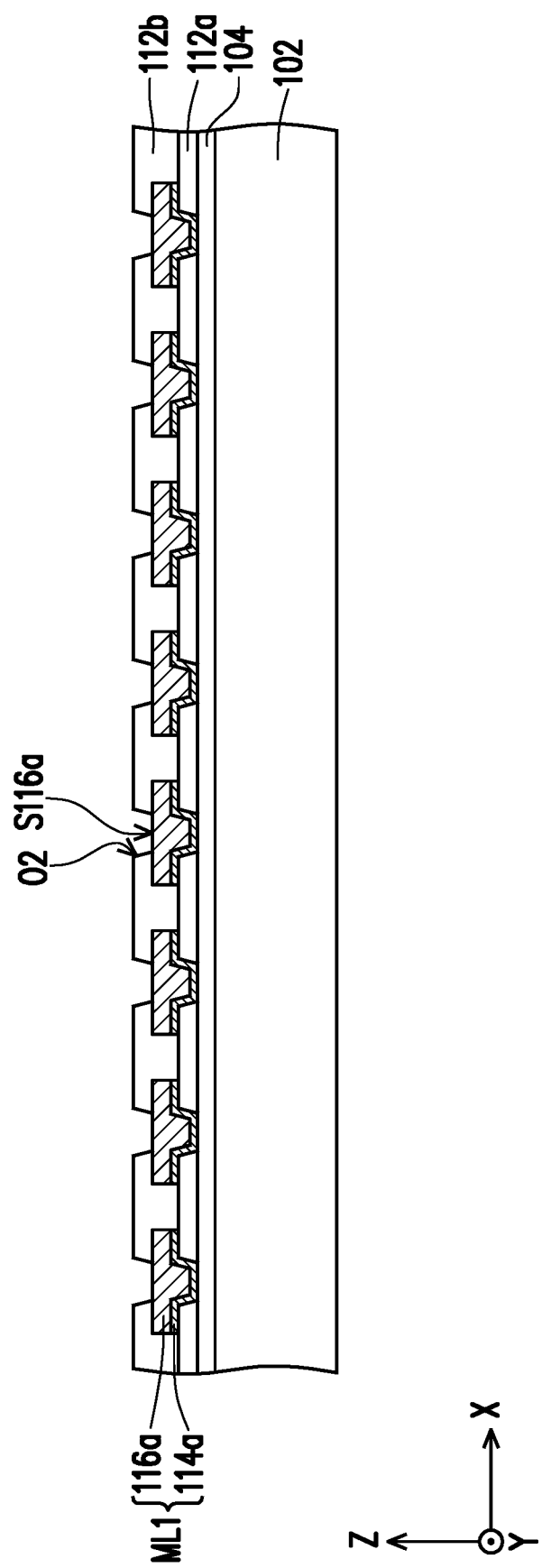

Referring to FIG. 2, in some embodiments, the see layer material 114m is patterned to form a seed layer 114a. In some embodiments, the seed layer material 114m is patterned by using the patterned conductive layer 116a as an etching mask to form the seed layer 114a. For example, the etching process may be a dry etching process, a wet etching process, or a combination thereof; the disclosure is not limited thereto. In other words, for example, in a vertical projection on the dielectric layer 112a along the direction Z, the patterned conductive layer 116a is completely overlapped with the seed layer 114a. That is to say, a sidewall of the patterned conductive layer 116a is substantially aligned with a sidewall of the seed layer 114a. In some embodiments, as shown in FIG. 2, the patterned conductive layer 116a is electrically connected to the seed layer 114a respectively underlying thereto. In some embodiments, the patterned conductive layer 116a and the seed layer 114a together are referred to as a metallization layer ML1 (or a redistribution layer).

Continued on FIG. 2, in some embodiments, a dielectric layer 112b is formed over the patterned conductive layer 116a. In some embodiments, the dielectric layer 112b has a plurality of openings O2 each exposing a portion of the patterned conductive layer 116a. As show in FIG. 2, through the openings O2, a surface S116a of the patterned conductive layer 116a is partially exposed for electrically connecting to later-formed connectors, for example. The formation and material of the dielectric layer 112b may be the same or similar to the process and material of forming the dielectric layer 112a as described in FIG. 1, and thus are not repeated therein for brevity. In one embodiment, the material of the dielectric layer 112b is the same as the material of the dielectric layer 112a. In an alternative embodiment, the material of the dielectric layer 112b is different from the material of the dielectric layer 112a; the disclosure is not limited thereto.

Figure 3:
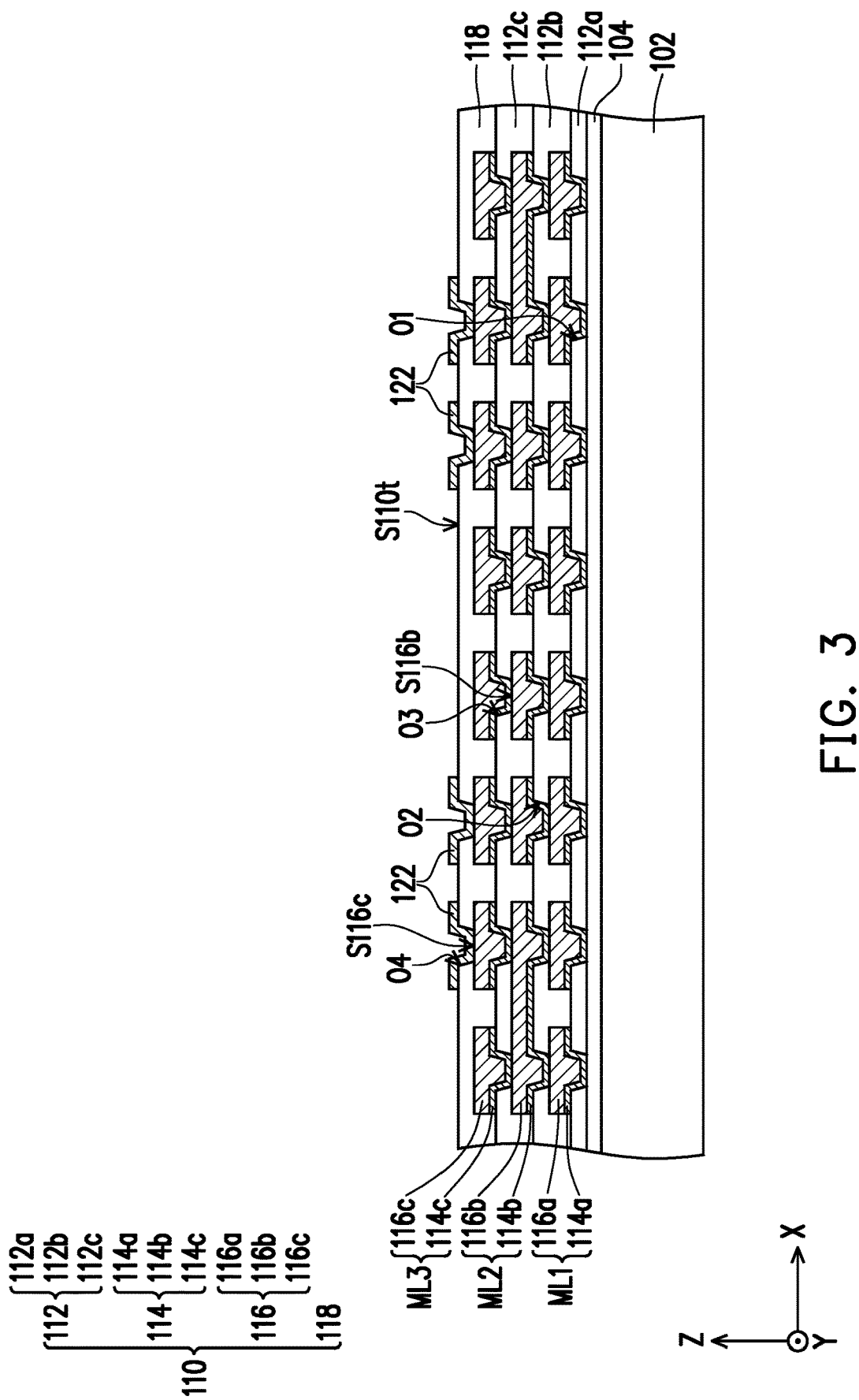

Referring to FIG. 3, in some embodiments, a seed layer 114b, a patterned conductive layer 116b, a dielectric layer 112c, a seed layer 114c, a patterned conductive layer 116c and a dielectric layer 118 are sequentially formed on the structure depicted on FIG. 2 to form a redistribution circuit structure 110 on the debond layer 104 and over the carrier 102. In some embodiments, the seed layer 114b is formed on the dielectric layer 112b and extends into openings O2 formed in the dielectric layer 112b to physically contact the patterned conductive layer 116a exposed by the openings O2. In other words, the seed layer 114b penetrates through the dielectric layer 112b, and sidewalls of the openings O2 are completely covered by the seed layer 114b. In some embodiments, the patterned conductive layer 116b is formed on (e.g. in physical contact with) the seed layer 114b, where the patterned conductive layer 116b is overlapped with the seed layer 114b in the vertical projection on the dielectric layer 112a along the direction Z. That is to say, a sidewall of the seed layer 114b is substantially aligned with a sidewall of the patterned conductive layer 116b. For example, as shown in FIG. 3, the patterned conductive layer 116b is electrically coupled to the patterned conductive layer 116a through the seed layer 114b. In some embodiments, the patterned conductive layer 116b and the seed layer 114b together are referred to as a metallization layer ML2 (or a redistribution layer).

In some embodiments, the dielectric layer 112c is formed on the patterned conductive layer 116b with a plurality of openings O3 each exposing a portion of the patterned conductive layer 116b. As show in FIG. 3, through the openings O3, a surface S116b of the patterned conductive layer 116b is partially exposed for electrically connecting to later-formed connectors.

In some embodiments, the seed layer 114c is formed on the dielectric layer 112c and extends into the openings O3 formed in the dielectric layer 112c to physically contact the patterned conductive layer 116b exposed by the openings O3. In other words, the seed layer 114c penetrates through the dielectric layer 112c, and sidewalls of the openings O3 are completely covered by the seed layer 114c. In some embodiments, the patterned conductive layer 116c is formed on (e.g. in physical contact with) the seed layer 114c, where the patterned conductive layer 116c is overlapped with the seed layer 114c in the vertical projection on the dielectric layer 112a along the direction Z. That is to say, a sidewall of the seed layer 114c is substantially aligned with a sidewall of the patterned conductive layer 116c. For example, as shown in FIG. 3, the patterned conductive layer 116c is electrically coupled to the patterned conductive layer 116b through the seed layer 114c. In some embodiments, the patterned conductive layer 116c and the seed layer 114c together are referred to as a metallization layer ML3 (or a redistribution layer).

In some embodiments, the dielectric layer 118 is formed on the patterned conductive layer 116c with a plurality of openings O4 each exposing a portion of the patterned conductive layer 116c. As shown in FIG. 3, through the openings O4, a surface S116c of the patterned conductive layer 116c is partially exposed for electrically connecting to later-formed connectors. Upon this, the redistribution circuit structure 110 is manufactured.

The formations and materials of the seed layers 114b and 114c may be independently the same or similar to the process and material of forming the seed layer 114a as described in FIG. 1 through FIG. 2, the formations and materials of the patterned conductive layers 116b and 116c may be independently the same or similar to the process and material of forming the patterned conductive layer 116a as described in FIG. 1, and the formations and materials of the dielectric layers 112b, 112c and 118 may be independently the same or similar to the process and material of forming the dielectric layer 112a as described in FIG. 1, and thus are not repeated herein. In one embodiment, the materials of the seed layers 114a, 114b and 114c are the same to each other. Alternatively, the materials of the seed layers 114a, 114b and 114c may be different to one another, in part or all. In one embodiment, the materials of the patterned conductive layers 116a, 116b and 116c are the same to each other. Alternatively, the materials of the patterned conductive layers 116a, 116b and 116c may be independently different to one another, in part or all. In one embodiment, the materials of the dielectric layers 112a, 112b, 112c and 118 are the same to each other. Alternatively, the materials of the dielectric layers 112a, 112b, 112c and 118 may be different to one another, in part or all.

In some embodiments, as shown in FIG. 3, the redistribution circuit structure 110 is formed on the debond layer 104 and includes a dielectric layer 112 (e.g. the dielectric layers 112a through 112c), a seed layer 114 (e.g. the seed layers 114a through 114c), a patterned conductive layer 116 (e.g. the patterned conductive layers 116a through 116c), and the dielectric layer 118. However, in the disclosure, the numbers of layers of the dielectric layer 112, the seed layer 114 and the patterned conductive layer 116 are not limited to the drawing of FIG. 3, where the numbers of the layer of each of the dielectric layer 112, the seed layer 114 and the patterned conductive layer 116 may be one or more than one. In some embodiments, the dielectric layer 112, the seed layer 114 and the patterned conductive layer 116 are sandwiched between the debond layer 104 and the dielectric layer 118 and are sequentially stacked.

In the disclosure, a set of the layers (e.g. the dielectric layer 112a, the seed layer 114a and the patterned conductive layer 116a), a set of the layers (e.g. the dielectric layer 112b, the seed layer 114b and the patterned conductive layer 116b), and a set of the layers (e.g. the dielectric layer 112c, the seed layer 114c and the patterned conductive layer 116c) may be individually referred to as a build-up layer of the redistribution circuit structure 110, while the dielectric layer 118 may be referred to as a passivation layer of the redistribution circuit structure 110 for providing protection to the underneath build-up layers. For illustration purpose, three build-up layers are included in the redistribution circuit structure 110 of FIG. 3; however, the disclosure is not limited thereto. The number of the build-up layer included in the redistribution circuit structure 110 is not limited in the disclosure, and may be selected based on the demand and design layout. That is, the number of the build-up layer included in the redistribution circuit structure 110 may be one or more than one as long as the redistribution circuit structure 110 can provide a sufficient routing function to a semiconductor die (e.g., 230 and/or 240 will be later presented in FIG. 5).

Continued on FIG. 3, in some embodiments, after the redistribution circuit structure 110 is formed, a plurality of under-bump metallurgy (UBM) patterns 122 are formed on the dielectric layer 118 and extend into the openings O4 formed in the dielectric layer 118 to physically contact the patterned conductive layer 116c exposed by the openings O4 for electrically connecting the redistribution circuit structure 110. In the disclosure, the UBM patterns 122 facilitate electrical connections between the redistribution circuit structure 110 and later-formed conductive elements (e.g., connectors such as conductive balls or conductive bumps; semiconductor components such as semiconductor passive elements; or the like). However, the disclosure is not limited thereto; alternatively, the UBM patterns 122 may be omitted based on the design layout and demand.

The material of the UBM patterns 122 may include copper, nickel, titanium, tungsten, or alloys thereof or the like, and may be formed in a manner of a mono-layer or a multi-layer (e.g. with different materials in any two or more stacked layers in one UBM pattern 122) by an electroplating process and an etching process. The number of the UBM patterns 122 is not limited in the disclosure, and corresponds to the numbers of the later-formed conductive elements.

Figure 4:
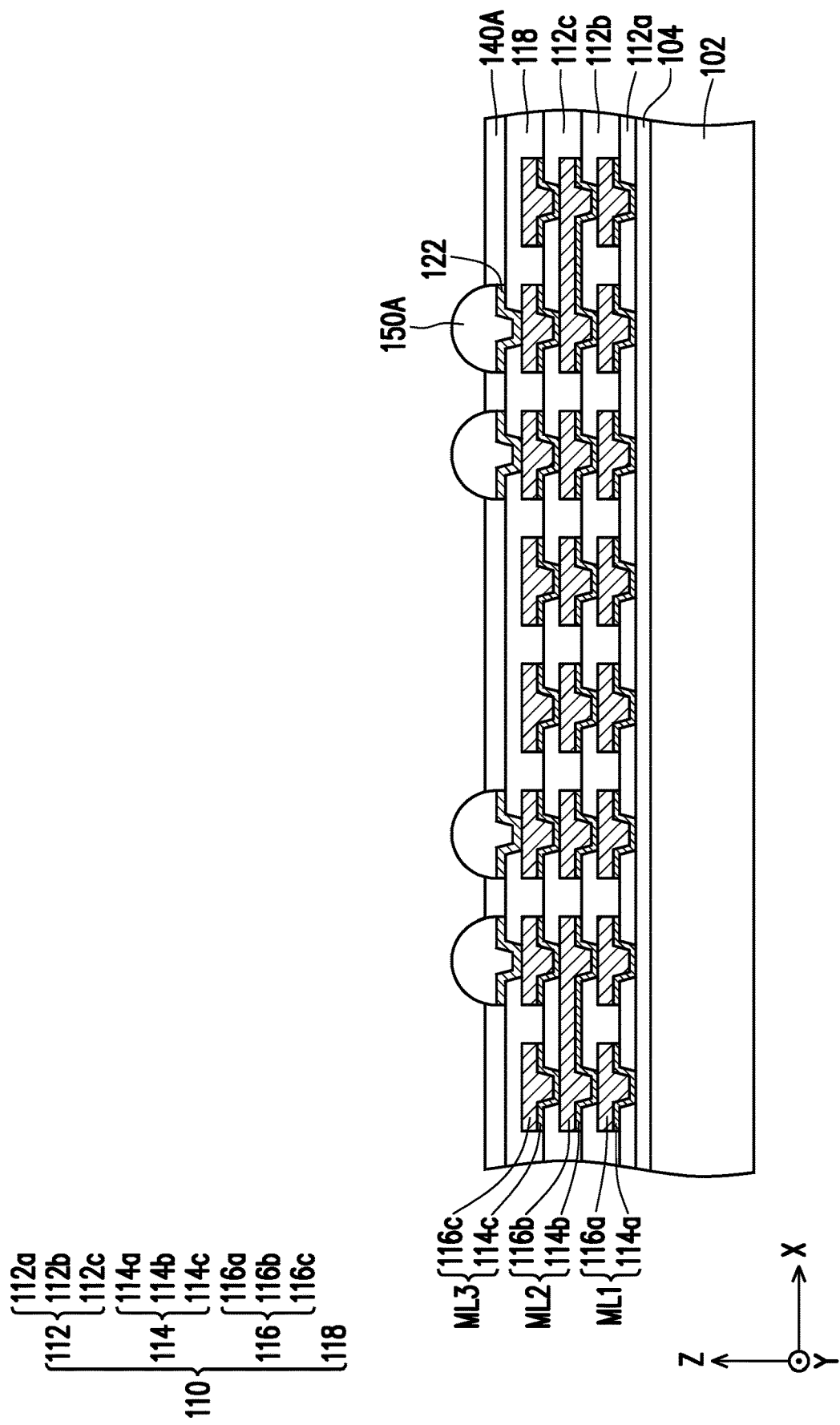

Referring to FIG. 4, in some embodiments, a passivation layer 140A is formed over the redistribution circuit structure 110. In some embodiments, the passivation layer 140A is formed on the UBM patterns 122, where the UBM patterns 122 are confined by the redistribution circuit structure 110 (e.g. the dielectric layer 118) and the passivation layer 140A. In some embodiments, the passivation layer 140A accessibly reveals each of the UBM patterns 122 through a plurality of openings O5 formed in the passivation layer 140A for electrically connecting to the later-formed connectors. The UBM patterns 122 each are completely exposed by the openings O5 formed in the passivation layer 140A, as shown in FIG. 4, for example. However, the disclosure is not limited thereto; alternatively, the passivation layer 140A may accessibly reveal a part of each of the UBM patterns 122 through the openings O5 formed in the passivation layer 140A.

In some embodiments, the passivation layer 140A is formed by, but not limited to, forming a blanket layer of dielectric material over an outermost surface S110$t$ of the redistribution circuit structure 110 to completely cover the UBM patterns 122 and patterning the dielectric material blanket layer to form the passivation layer 140A with the openings O5 exposing the portions of the UBM patterns 122 underneath thereto. The material of the passivation layer 140A may be PI, PBO, BCB, a nitride such as silicon nitride, an oxide such as silicon oxide, PSG, BSG, BPSG, a combination thereof or the like, which may be patterned using a photolithography and/or etching process. In some embodiments, the dielectric material blanket layer is formed by suitable fabrication techniques such as spin-on coating, CVD, (e.g. PECVD), or the like.

In some embodiments, the passivation layer 140A is referred to as a protective layer of the redistribution circuit structure 110 and the UBM patterns 122 for providing protection thereto. In one embodiment, the material of the passivation layer 140A is the same as the material of the dielectric layers 112 (e.g. 112$a$, 112$b$, or 112$c$) or 118. In an alternative embodiment, the material of the passivation layer 140A is the different from the material of the dielectric layers 112 (e.g. 112$a$, 112$b$, or 112$c$) or 118. However, the disclosure is not limited thereto; alternatively, the passivation layer 140A may be omitted.

Continued on FIG. 4, in some embodiments, a plurality of conductive terminals 150A are formed on the UBM patterns 122 and over the redistribution circuit structure 110. In some embodiments, the conductive terminals 150A are electrically coupled to the redistribution circuit structure 110 through the UBM patterns 122. Due to the UBM patterns 122, the adhesive strength between the conductive terminals 150A and the redistribution circuit structure 110 is enhanced.

In some embodiments, the conductive terminals 150A are attached to the UBM patterns 122 through a solder flux. In some embodiments, the conductive terminals 150A are disposed on the UBM patterns 122 by ball placement process or reflow process. The conductive terminals 150A are, for example, micro-bumps, chip connectors (e.g. controlled collapse chip connection (C4) bumps), ball grid array (BGA) balls, solder balls or other connectors. The number of the conductive terminals 150A is not limited to the disclosure, and may be designated and selected based on the numbers of the openings O5 (or saying the number the UBM patterns 122 exposing by the openings O5). When solder is used, the solder may include either eutectic solder or non-eutectic solder. The solder may include lead or be lead-free, and may include Sn—Ag, Sn—Cu, Sn—Ag—Cu, or the like.

In one embodiment, the conductive terminals 150A are referred to as conductive connectors for connecting with another package or a circuit substrate (e.g. organic substrate such as printed circuit board (PCB)). In an alternative embodiment, the conductive terminals 150A are referred to as conductive terminals for inputting/outputting electric and/or power signals. In a further alternative embodiment, the conductive terminals 150A are referred to as conductive terminals for connecting with one or more than one semiconductor dies independently including active devices (e.g., transistors, diodes, etc.) and/or passive devices (e.g., capacitors, resistors, inductors, etc.), other components such as one or more than one integrated passive device (IPDs), or combinations thereof. The disclosure is not limited thereto.

Figure 5:
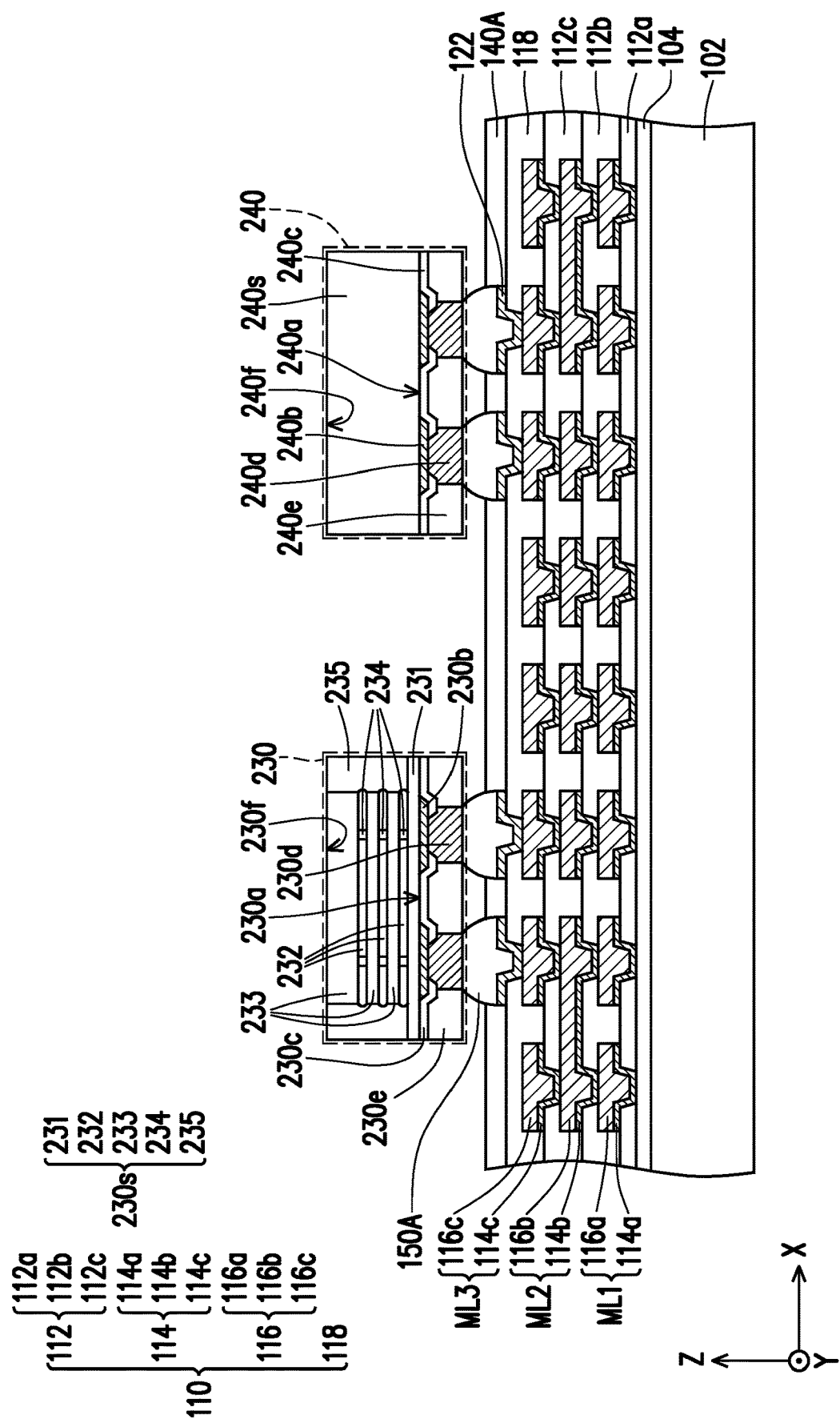

Referring to FIG. 5, in some embodiments, at least one semiconductor die is provided. For example, semiconductor dies 230 and 240 are arranged aside to each other on the X-Y plane (also see FIG. 13B). In some embodiments, as shown in FIG. 5, the semiconductor dies 230 and 240 are picked and placed on the redistribution circuit structure 110 (e.g. the outermost surface S110$t$ of the redistribution circuit structure 110). In some embodiments, the semiconductor dies 230 and 240 are bonded to the redistribution circuit structure 110 through the conductive terminals 150A and the UBM patterns 122. In the disclosure, it should be appreciated that the illustration of the semiconductor dies 230, 240 and other components throughout all figures is schematic and is not in scale.

As illustrated in FIG. 5, in some embodiments, the semiconductor die 230 includes a die stack 230$s$ having an active surface 230$a$ and a backside surface 230$f$ opposite to the active surface 230$a$, a plurality of pads 230$b$ distributed on the active surface 230$a$, a passivation layer 230$c$ covering the active surface 230$a$ and a portion of the pads 230$b$, a plurality of conductive vias 230$d$ connecting to the pads 230$b$ exposing by the passivation layer 230$c$, and a protection layer 230$e$ disposed on the conductive vias 240$d$. The pads 230$b$, the passivation layer 230$c$, the conductive vias 230$d$ and the protection layer 230$e$ are formed on the die stack 230$s$. The pads 230$b$ are partially exposed by the passivation layer 230$c$, the conductive vias 230$d$ are respectively disposed on and electrically connected to the pads 230$b$, and the protection layer 230$e$ covers the passivation layer 230$c$ exposed by the conductive vias 230$d$ and the conductive vias 230$d$.

However, the disclosure may not be limited thereto. For example, the conductive vias 230$d$ and the protection layer 230$e$ may be omitted. In an alternative embodiment, the semiconductor die 230 may include the semiconductor substrate 230$s$ having the active surface 230$a$ and the backside surface 230$f$ opposite to the active surface 230$a$, the plurality of pads 230$b$ distributed on the active surface 230$a$, and the passivation layer 230$c$ covering the active surface 230$a$ and a portion of the pads 230$b$.

The pads 230$b$ are aluminum pads or other suitable metal pads, for example. In some embodiments, the passivation layer 230$c$ and the protection layer 230$e$ may be a PBO layer, a PI layer or other suitable polymers. In some alternative embodiments, the passivation layer 230$c$ and the protection layer 230$e$ may be made of inorganic materials, such as silicon oxide, silicon nitride, silicon oxynitride, or any suitable dielectric material. The material of the passivation layer 230c can be the same or different from the material of the protection layer 230e, for example. The conductive vias 230d are copper pillars, copper alloy pillar or other suitable metal pillars containing copper metal, for example.

The die stack 230s may include a base tier and at least one inner tier stacked thereon. As shown in FIG. 5, for example, the die stack 230s includes a carrier die 231, a plurality of dielectric films 232, a plurality of dies 233, a plurality of conductive vias 234 and an encapsulant 235, where the dies 233 are sequentially disposed on the carrier die 231 along the direction Z, and the conductive vias 234 are grouped into different groups to electrically connect two adjacent and overlapping dies of the carrier die 231 and the dies 233. In some embodiments, the different groups of the conductive vias 234 are independently covered by a respective one of the dielectric films 232, and a surface of the carrier die 231 exposed by the dielectric films 232 and the dies 233, sidewalls of the dielectric films 232 and sidewalls of the dies 233 are covered by the encapsulant 235. As shown in FIG. 5, in some embodiments, the conductive vias 234 are separated from the encapsulant 235 by the dielectric films 232. For example, the carrier die 231 is referred to as a base tier of the die stack 230s while the each of the dies 233 is referred to as a stacking tier or an inner tier of the die stack 230s. As illustrated in FIG. 5, for example, the carrier die 231 (e.g., the base tier) of the die stack 230s is electrically connected to the conductive vias 230d through the pads 230b, where the conductive vias 230d are referred to as conductive terminals of the semiconductor die 230 for electrical connection to external components. The number of the carrier die 231 included in the base tier and the number of the dies 233 included in each inner tier are, independently, not limited to the disclosure, and may be one or more than one based on the demand and design layout.

It is noted that, each of the carrier die 231 and the dies 233 may further include an interconnect structure (not shown), conductive pads (not shown), a passivation layer (not shown), and a post-passivation layer (not shown). The carrier die 231 described herein may be referred as a semiconductor chip or an integrated circuit (IC). In some embodiments, the carrier die 231 includes one or more digital chips, analog chips or mixed signal chips, such as an application-specific integrated circuit ("ASIC") chips, a sensor chip, a wireless and radio frequency (RF) chip, a logic chip or a voltage regulator chip. The logic chip may be a central processing unit (CPU), a graphics processing unit (GPU), a system-on-a-chip (SoC), a microcontroller, or the like. In some embodiments, each of the dies 233 includes a memory die (e.g., a dynamic random-access memory (DRAM) die, static random-access memory (SRAM) die, a synchronous dynamic random-access memory (SDRAM), a NAND flash, etc.). That is to say, the semiconductor die 230 includes a hybrid memory cube (HMC) module, a high bandwidth memory (HBM) module, or the like, in some embodiments. For example, the dies 233 included in the die stack 230s of the semiconductor die 230 are high bandwidth memory (HBM) dies, and the carrier die 231 is a logic die providing control functionality for these memory dies, as shown in FIG. 5.

In some embodiments, the dielectric films 232 independently include a PBO layer, a PI layer or other suitable polymers. In some alternative embodiments, a material of the dielectric films 232 includes an inorganic material, such as silicon oxide, silicon nitride, silicon oxynitride, or any suitable dielectric material. The dielectric films 232 may be formed by suitable fabrication techniques such as spin-on coating, CVD, (e.g. PECVD), or the like. Alternatively, the dielectric films 232 each are, for example, a non-conductive film (NCF) which can be formed by lamination. The conductive vias 234 are copper pillars, copper alloy pillar or other suitable metal pillars containing copper metal, for example.

In some embodiments, the material of the encapsulant 235 includes a molding compound, a molding underfill, a resin (such as epoxy), or the like. In some alternative embodiments, the material of the encapsulant 235 includes nitride such as silicon nitride, oxide such as silicon oxide, PSG, BSG, BPSG, a combination thereof, or the like. In yet alternative embodiments, the material of each of the encapsulant 235 includes an organic material (e.g., epoxy, PI, PBO, or the like), or the mixture of inorganic and organic materials (e.g., the mixture of silicon oxide and epoxy, or the like). In some embodiments, the encapsulant 235 may be formed by a molding process, such as a compression molding process. In some alternative embodiments, the encapsulant 235 may be formed through suitable fabrication techniques such as CVD (e.g., high-density plasma chemical vapor deposition (HDPCVD) or PECVD). As illustrated in FIG. 5, for example, the backside surface 230f of the semiconductor die 230 includes a surface of the encapsulant 235 and a surface of the die 233 included in an outmost tier of the inner tiers in the die stack 230s, where the surface of the die 233 included in the outmost tier and the surface of the encapsulant 235 are substantially leveled with and coplanar to each other.

As illustrated in FIG. 5, in some embodiments, the semiconductor die 240 includes a semiconductor substrate 240s having an active surface 240a and a backside surface 240f opposite to the active surface 240a, a plurality of pads 240b distributed on the active surface 240a, a passivation layer 240c covering the active surface 240a and a portion of the pads 240b, a plurality of conductive vias 240d connecting to the pads 240b exposing by the passivation layer 240c, and a protection layer 240e disposed on the conductive vias 240d. The pads 240b, the passivation layer 240c, the conductive vias 240d, and the protection layer 240e are formed on the semiconductor substrate 240s. The pads 240b are partially exposed by the passivation layer 240c, the conductive vias 240d are respectively disposed on and electrically connected to the pads 240b, and the protection layer 240e covers the passivation layer 240c exposed by the conductive vias 240d and the conductive vias 240d.

The material of the semiconductor substrate 240s may include a silicon substrate including active components (e.g., transistors and/or memories such as N-type metal-oxide semiconductor (NMOS) and/or P-type metal-oxide semiconductor (PMOS) devices, or the like) and/or passive components (e.g., resistors, capacitors, inductors or the like) formed therein. In some embodiments, such active components and passive components may be formed in a front-end-of-line (FEOL) process. In an alternative embodiment, the semiconductor substrate 240s may be a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto.

In addition, the semiconductor substrate 240s may further include an interconnection structure (not shown) disposed on the active surface 240a. In certain embodiments, the interconnection structure may include one or more inter-dielectric layers and one or more patterned conductive layers stacked alternately for providing routing function to the active components and the passive components embedded in the semiconductor substrate 240s, where the pads 240b may be referred to as an outermost layer of the patterned conductive layers. In one embodiment, the interconnection structure may be formed in a back-end-of-line (BEOL) process. For example, the inter-dielectric layers may be silicon oxide layers, silicon nitride layers, silicon oxy-nitride layers, or dielectric layers formed by other suitable dielectric materials, and the inter-dielectric layers may be formed by deposition or the like. For example, the patterned conductive layers may be patterned copper layers or other suitable patterned metal layers, and the patterned conductive layers may be formed by electroplating or deposition. However, the disclosure is not limited thereto.

The materials of the pads 240b, the passivation layer 240c, the conductive vias 240d and the protection layer 240e may be similar to or substantially identical to materials of the pads 230b, the passivation layer 230c, the conductive vias 230d and the protection layer 230e described above, respectively; thus, are not repeated herein for brevity. The material of the passivation layer 240c is substantially the same as or different from the material of the protection layer 240e, for example.

However, the disclosure may not be limited thereto; alternatively, the conductive vias 240d and the protection layer 240e may be omitted. In an alternative embodiment, the semiconductor die 240 may include the semiconductor substrate 240s having the active surface 240a and the backside surface 240f opposite to the active surface 240a, the plurality of pads 240b distributed on the active surface 240a, and the passivation layer 240c covering the active surface 240a and a portion of the pads 240b.

The semiconductor die 240 may be referred to as semiconductor dies or chips, independently, including a digital chip, analog chip or mixed signal chip. In some embodiments, the semiconductor die 240 is a logic die such as a CPU, a GPU, a neural network processing unit (NPU), a deep learning processing unit (DPU), a tensor processing unit (TPU), a SoC, an application processor (AP), and a microcontroller; a power management die such as a power management integrated circuit (PMIC) die; a wireless and radio frequency (RF) die; a baseband (BB) die; a sensor die such as a photo/image sensor chip; a micro-electro-mechanical-system (MEMS) die; a signal processing die such as a digital signal processing (DSP) die; a front-end die such as an analog front-end (AFE) dies; an application-specific die such as an application-specific integrated circuit (ASIC), a field-programmable gate array (FPGA), etc.); a combination thereof; or the like. In alternative embodiments, the semiconductor die 240 are, independently, an artificial intelligence (AI) engine such as an AI accelerator; a computing system such as an AI server, a high-performance computing (HPC) system, a high power computing device, a cloud computing system, an edge computing system, etc.; a combination thereof; or the like. The type of the semiconductor die 240 may be selected and designated based on the demand and design requirement, and thus are not specifically limited in the disclosure.

As shown in FIG. 5, only one semiconductor die 230 and one semiconductor die 240 are presented for illustrative purposes, however, it should be noted that the number of the semiconductor die 230 and the number of the semiconductor die 240 may be, independently, selected and designated based on the demand and design layout; the disclosure is not limited thereto. In some embodiments, the number of the semiconductor die 230 is one or more than one, and the number of the semiconductor die 240 is zero, one, or more than one. In the embodiments of which the number of the semiconductor die 230 is more than one, the semiconductor dies 230 can be the same types. Alternatively, the semiconductor dies 230 may be different types, in part or all. In the embodiments of which the number of the semiconductor die 240 is more than one, the semiconductor dies 240 can be the same types. Alternatively, the semiconductor dies 240 may be different types, in part or all.

Figure 28:
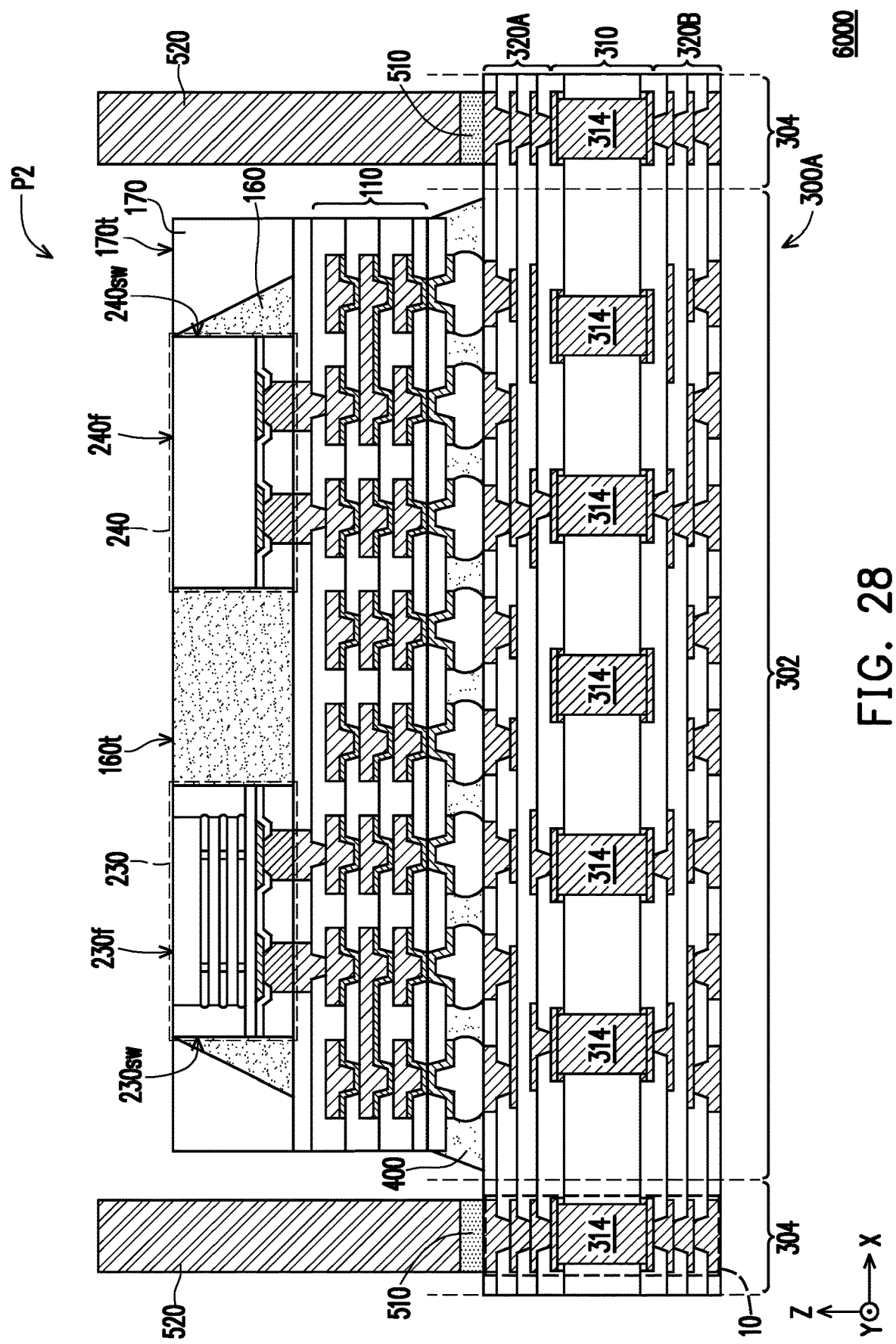
FIG. 28 is a schematic cross-sectional view showing a package structure in accordance with some embodiments of the disclosure.

As illustrated in FIG. 5, for example, the semiconductor dies 230 and 240 are mounted onto the redistribution circuit structure 110 by flip-chip bonding. However, the disclosure is not limited thereto; alternatively, the semiconductor dies 230 and 240 are mounted onto the redistribution circuit structure 110 by hybrid bonding (see a semiconductor device P2 of a package structure 6000 depicted in FIG. 28). In certain embodiments, one or more than one additional semiconductor die, except for the semiconductor dies 230 and 240, is further provided, where the additional semiconductor die(s) may be, independently, the same type or different types as comparing with the types of the semiconductor dies 230 and/or 240. The disclosure is not limited thereto. In the disclosure, the direction Z may be referred to as a stacking direction of the redistribution circuit structure 110 and the semiconductor dies 230, 240.

Figure 6:
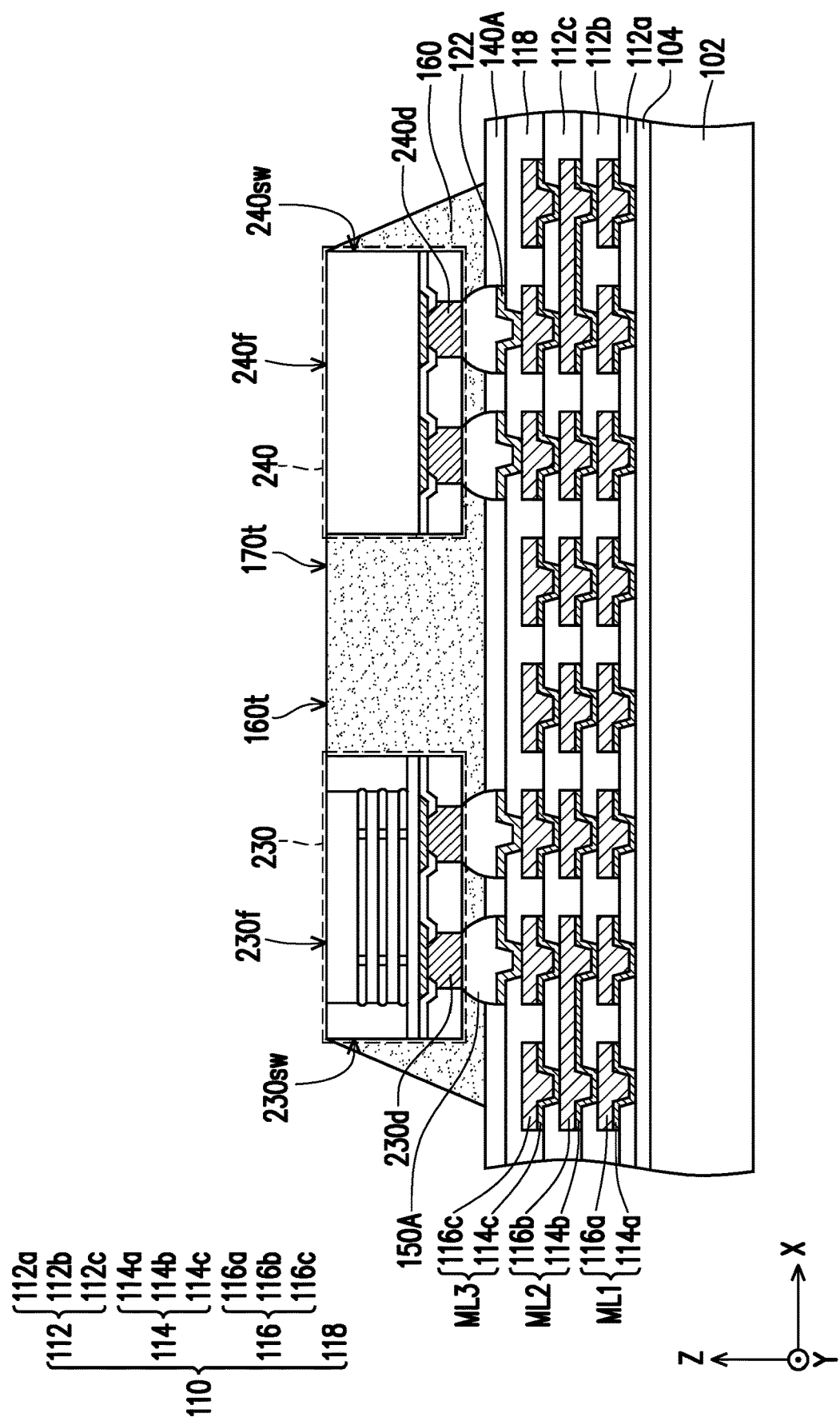

Referring to FIG. 6, in some embodiments, an underfill material 160 is formed between the semiconductor dies 230, 240 and the redistribution circuit structure 110 and dispensed around the conductive terminals 150A. In some embodiments, the underfill material 160 at least fills the gaps between the conductive terminals 150A and between the redistribution circuit structure 110, the conductive terminals 150A, the semiconductor die 230 and the semiconductor die 240. As shown in FIG. 6, for example, the underfill material 160 is disposed on the redistribution circuit structure 110 and wraps sidewalls of the conductive terminals 150A to provide structural support and protection to the conductive terminals 150A. In some embodiments, the underfill material 160 completely covers sidewalls (e.g. 230sw, 240sw) of the semiconductor dies 230, 240 and accessibly exposes the backside surfaces (e.g. 230f, 240f) of the semiconductor dies 230, 240, as shown in FIG. 6.

However, the disclosure is not limited thereto. In an alternative embodiment (not shown), the underfill material 160 covers a part of the sidewall 230sw of the semiconductor die 230 and a part of the sidewall 240sw of the semiconductor die 240, and further completely exposes the backside surface 230f of the semiconductor die 230 and the backside surface 240f of the semiconductor die 240. In a further alternative embodiment (not shown), the underfill material 160 completely covers the sidewalls (e.g. 230sw, 240sw) and the backside surfaces (e.g. 230f, 240f) of the semiconductor dies 230 and 240. In a yet further alternative embodiment (not shown), the underfill material 160 completely and accessibly exposes the sidewalls (e.g. 230sw, 240sw) and the backside surfaces (e.g. 230f, 240f) of the semiconductor dies 230, 240. Due to the underfill material 160, a bonding strength between the conductive vias 230d, 240d and the conductive terminals 150A is enhanced, thereby ensuring the electrical coupling of the semiconductor dies 230, 240 and the redistribution circuit structure 110.

In one embodiment, the underfill material 160 may be formed by underfill dispensing or any other suitable method. In some embodiments, the underfill material 160 may be a molding compound including polymer material (e.g., epoxy, resin, and the like) either with or without hardeners, fillers (e.g., silica filler, glass filler, aluminum oxide, silicon oxide, and the like), adhesion promoters, combinations thereof, and the like. Alternatively, the underfill material 160 may be omitted.

Figure 7:
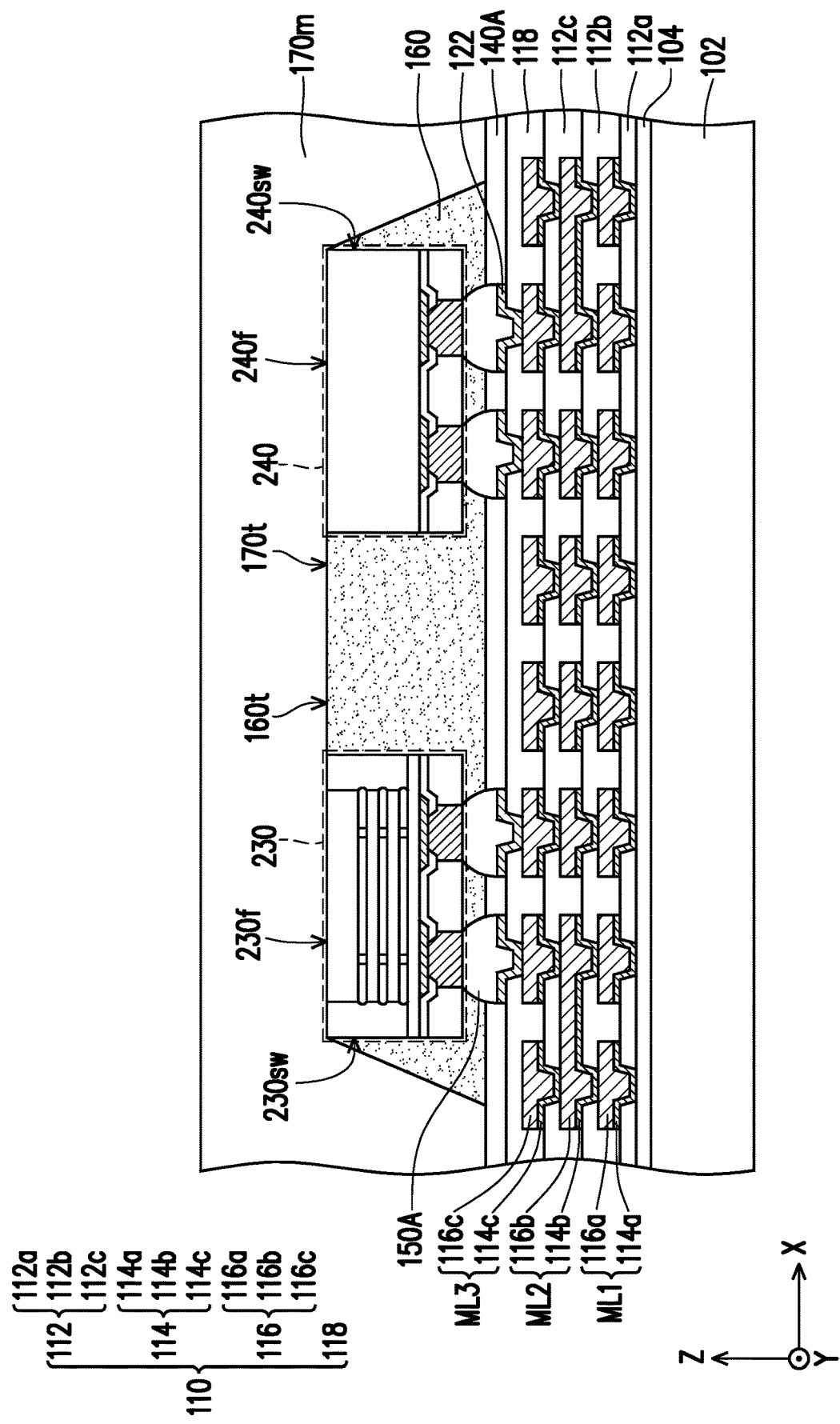

Referring to FIG. 7, in some embodiments, the semiconductor dies 230, 240 are encapsulated in an insulating encapsulation 170m. In some embodiments, the insulating encapsulation 170m is formed on the underfill material 160 and over the redistribution circuit structure 110. The insulating encapsulation 170m may at least fill up the gaps between the semiconductor dies 230 and 240 and between the underfill material 160 and the semiconductor dies 230, 240. In some embodiments, the insulating encapsulation 170m covers the semiconductor dies 230, 240, the underfill material 160 and the redistribution circuit structure 110 exposed by the semiconductor dies 230, 240 and the underfill material 160. In other words, for example, the semiconductor dies 230, 240 are not accessibly revealed by and embedded in the insulating encapsulation 170m.

In some embodiments, the insulating encapsulation 170m is a molding compound formed by a molding process. The molding process may include a compression molding process or a transfer molding process. The insulating encapsulation 170m may include polymers (such as epoxy resins, phenolic resins, silicon-containing resins, or other suitable resins), dielectric materials, or other suitable materials. Alternatively, the insulating encapsulation 170m may include an acceptable insulating encapsulation material. In some embodiments, the insulating encapsulation 170m further includes inorganic filler or inorganic compound (e.g. silica, clay, and so on) which can be added therein to optimize CTE of the insulating encapsulation 170m. The disclosure is not limited thereto.

In one embodiment, a material of the insulating encapsulation 170m may be different from a material of the underfill material 160, where a clear interface (not labeled) is presented between the insulating encapsulation 170m and the underfill material 160, as shown in FIG. 7. However, the disclosure is not limited thereto; the material of the insulating encapsulation 170m may be the same as the material of the underfill material 160, where there is no clear interface between the insulating encapsulation 170m and the underfill material 160.

Figure 8:
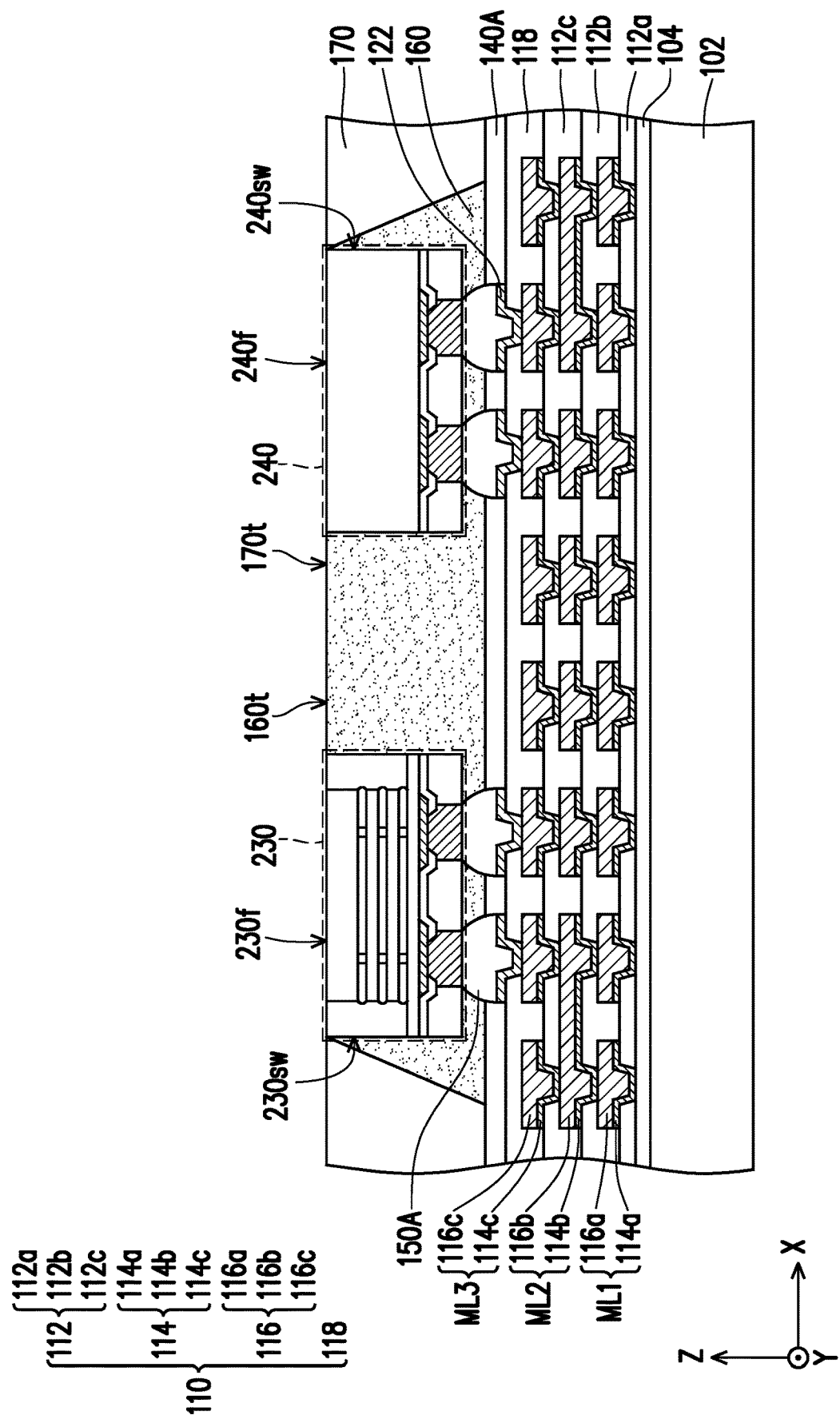

Referring to FIG. 8, in some embodiments, the insulating encapsulation 170m is planarized to form an insulating encapsulation 170 exposing the semiconductor dies 230 and 240. In certain embodiments, as shown in FIG. 8, after the planarization, the backside surface 230f of the semiconductor die 230, the backside surface 240f of the semiconductor die 240 and a surface 160t of the underfill material 160 are exposed by a surface 170t of the insulating encapsulation 170. That is, for example, the backside surface 230f of the semiconductor die 230, the backside surface 240f of the semiconductor die 240 and the surface 160t of the underfill material 160 become substantially leveled with the surface 170t of the insulating encapsulation 170. In other words, the backside surface 230f of the semiconductor die 230, the backside surface 240f of the semiconductor die 240, the surface 160t of the underfill material 160 and the surface 170t of the insulating encapsulation 170 are substantially coplanar to each other.

The insulating encapsulation 170m may be planarized by mechanical grinding or chemical mechanical polishing (CMP), for example. After the planarizing step, a cleaning step may be optionally performed, for example to clean and remove the residue generated from the planarizing step. However, the disclosure is not limited thereto, and the planarizing step may be performed through any other suitable method. In some embodiments, during planarizing the insulating encapsulation 170m, the semiconductor die 230, the semiconductor die 240 and/or the underfill material 160 may also be planarized. In certain embodiments, the planarizing step may be, for example, performed on the overmolded insulating encapsulation 170m to level the surface 170t of the insulating encapsulation 170, the backside surface 230f of the semiconductor die 230, the backside surface 240f of the semiconductor die 240 and/or the surface 160t of the underfill material 160.

The semiconductor dies 230 and 240 are laterally exposed by the insulating encapsulation 170, for example. In some embodiments, as shown in FIG. 8, the semiconductor dies 230 and 240 are accessibly revealed by the insulating encapsulation 170. Owing to such configuration, a better heat dissipation for the semiconductor dies 230 and 240 is ensured.

In an alternative embodiment, the surface 160t of the underfill material 160 is below to the surface 170t of the insulating encapsulation 170. In such alternative embodiments, the underfill material 160 is embedded in the insulating encapsulation 170 and is not accessibly revealed by the surface 170t of the insulating encapsulation 170.

Figure 9:
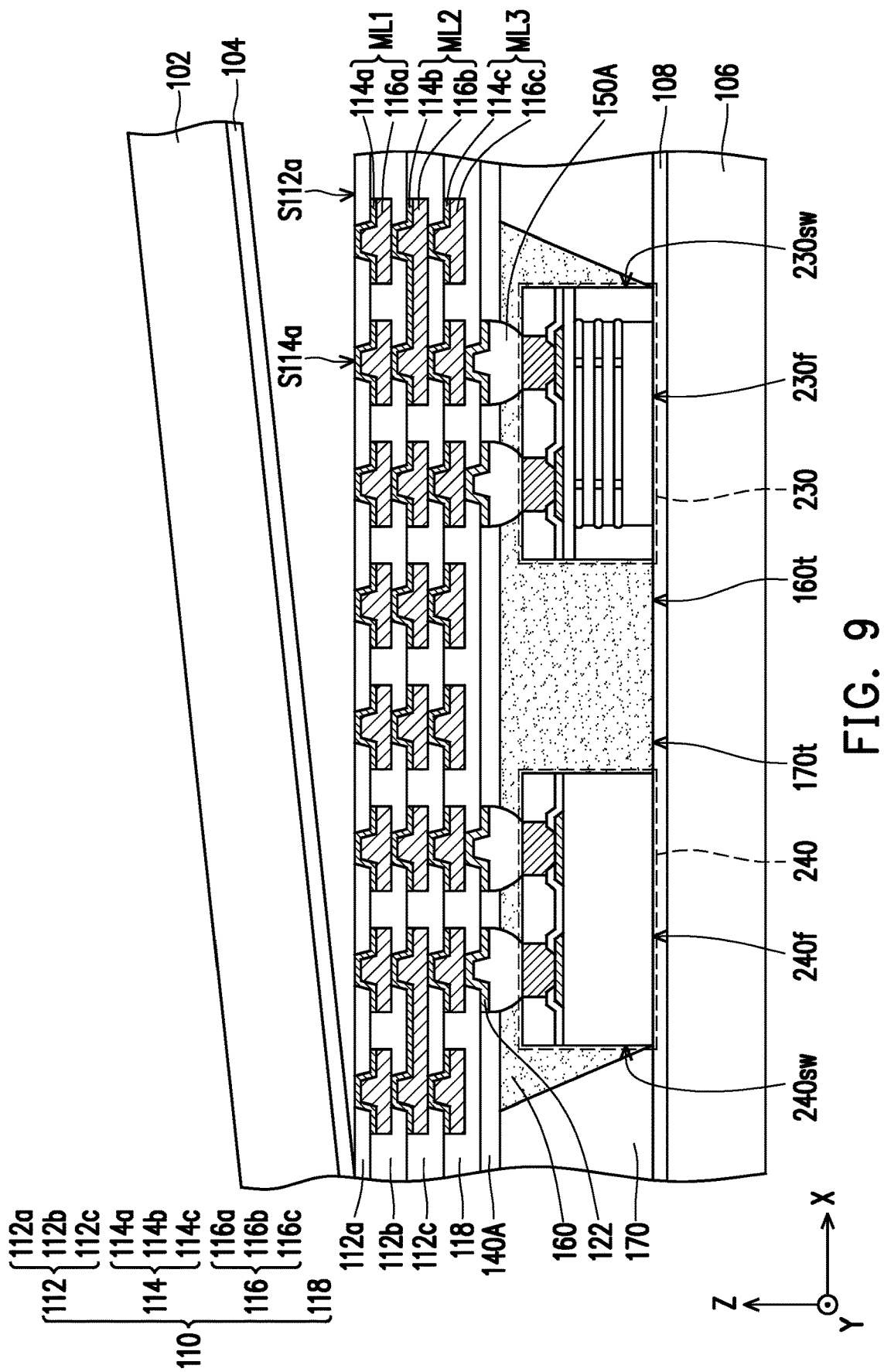

Referring to FIG. 9, in some embodiments, the whole structure depicted in FIG. 8 is flipped (turned upside down) and placed on a carrier 106 coated with a debond layer 108, and the carrier 102 is debonded from the redistribution circuit structure 110. In some embodiments, the redistribution circuit structure 110 (e.g. the dielectric material 112a and the seed layer 114a) are easily separated from the carrier 102 due to the debond layer 104, where the redistribution circuit structure 110 (e.g. a surface S112a of the dielectric layer 112a and a surface S114a of the seed layer 114a) is exposed. In some embodiments, the carrier 102 is detached from the redistribution circuit structure 110 through a debonding process, and the carrier 102 and the debond layer 104 are removed. In one embodiment, the debonding process is a laser debonding process.

In some embodiments, the materials of the carrier 106 and the carrier 102 may be the same, however the disclosure is not limited thereto. In an alternative embodiment, the material of the carrier 106 may be different from the material of the carrier 102. In some embodiments, the material and formation of the debond layer 108 may be the same or different from the material and formation of the debond layer 104, the disclosure is not limited thereto.

Figure 10:
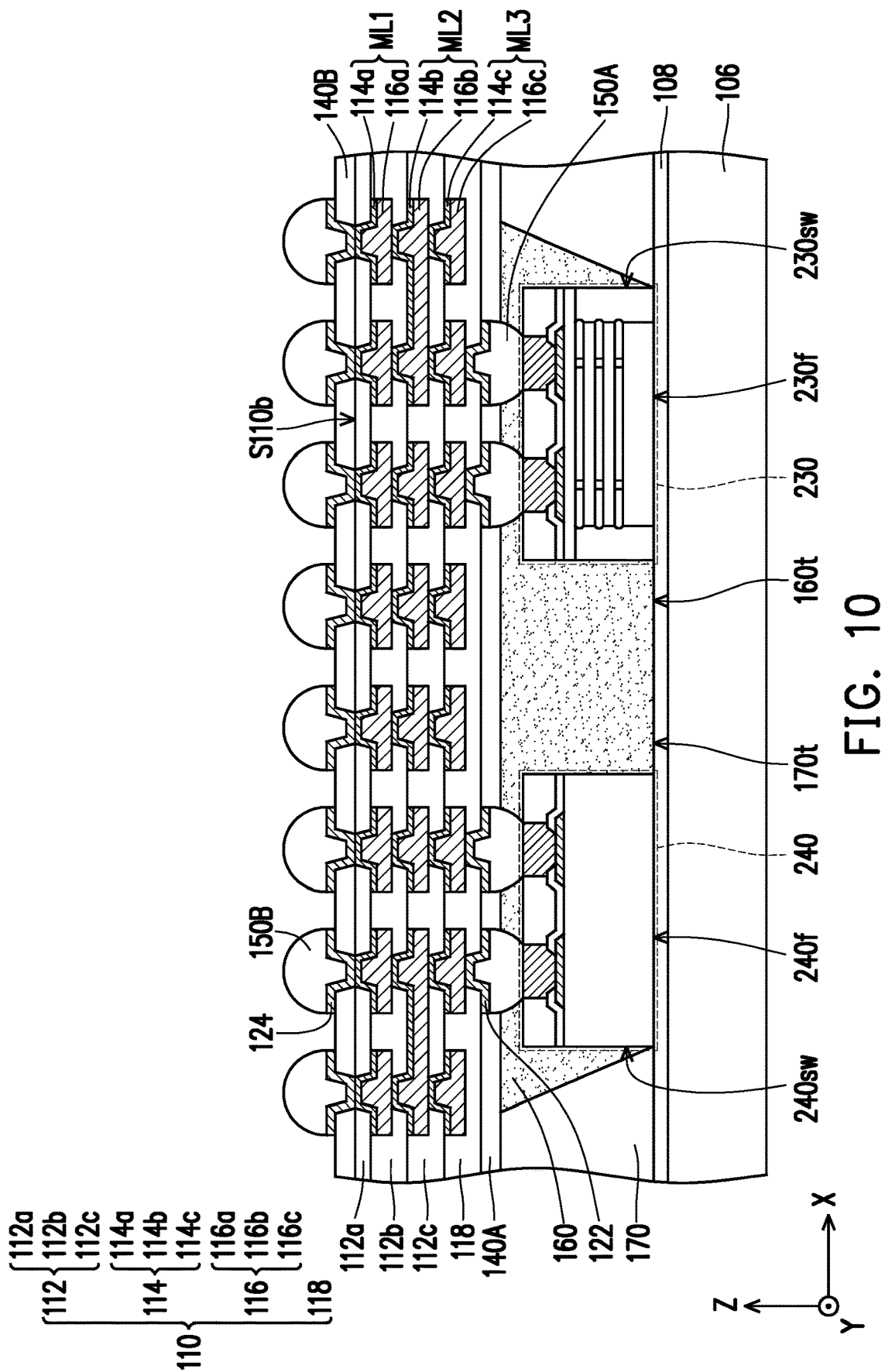

Referring to FIG. 10, a passivation layer 140B is formed on the redistribution circuit structure 110 (e.g., a surface S110b opposite to the surface S110t in the direction Z). For example, the passivation layer 140B accessibly reveals at least a part of the exposed portions of the seed layer 114a through a plurality of openings O6 formed in the passivation layer 140B for electrically connecting to the later-formed connectors. In one embodiment, the exposed portions of the seed layer 114a are partially and accessibly exposed by the openings O6 formed in the passivation layer 140B. However, the disclosure is not limited thereto; alternatively, the exposed portions of the seed layer 114a each may be completely and accessibly exposed by the openings O6 formed in the passivation layer 140B, as shown in FIG. 10.

The formation, material and configuration of the passivation layer 140B are similar to or the same as to the process, material and configuration of forming the passivation layer 140A as previously described in FIG. 4, and thus are not repeated herein for brevity. In some embodiments, the passivation layer 140B is referred to as a protective layer of the redistribution circuit structure 110 for providing protection thereto. Similar to the passivation layer 140A, the passivation layer 140B may be omitted as an alternative.

Continued on FIG. 10, in some embodiments, a plurality of UBM patterns 124 are formed on the passivation layer 140B and extend into the openings O6 formed in the passivation layer 140B to physically contact the seed layer 114a exposed by the openings O6 for electrically connecting the redistribution circuit structure 110. In the disclosure, the UBM patterns 124 facilitate electrical connections between the redistribution circuit structure 110 and later-formed conductive elements (e.g., connectors such as conductive balls or conductive bumps; semiconductor components such as semiconductor passive elements; or the like).

However, the disclosure is not limited thereto; alternatively, the UBM patterns 124 may be omitted based on the design layout and demand. The formation, material and configuration of the UBM patterns 124 are similar to or the same as to the process, material and configuration of forming the UBM patterns 122 as previously described in FIG. 3, and thus are not repeated herein for brevity.

Thereafter, continued on FIG. 10, in some embodiments, a plurality of conductive terminals 150B are formed on the UBM patterns 124 and over the redistribution circuit structure 110. In some embodiments, the conductive terminals 150B are electrically coupled to the redistribution circuit structure 110 through the UBM patterns 124. Due to the UBM patterns 124, the adhesive strength between the conductive terminals 150B and the redistribution circuit structure 110 is enhanced. In some embodiments, the conductive terminals 150B are referred to as conductive connectors for connecting with another package or a circuit substrate (e.g. organic substrate such as PCB).

The disclosure is not limited thereto. In an alternative embodiment, the conductive terminals 150B are referred to as conductive terminals for inputting/outputting electric and/or power signals. In a further alternative embodiment, the conductive terminals 150B are referred to as conductive terminals for connecting with one or more than one semiconductor dies independently including active devices (e.g., transistors, diodes, etc.) and/or passive devices (e.g., capacitors, resistors, inductors, etc.), other components such as one or more than one integrated passive device (IPDs), or combinations thereof. The formation, material and configuration of the conductive terminals 150B are similar to or the same as to the process, material and configuration of forming the conductive terminals 150A as previously described in FIG. 5, and thus are not repeated herein for brevity.

Additionally, the semiconductor dies 230, 240 are arranged in an array, the conductive terminals 150B may be divided into groups corresponding to the number of the semiconductor dies 230, 240. In some embodiments, some of the conductive terminals 150B are electrically connected to the semiconductor die 230 through some of the UBM patterns 124, the redistribution circuit structure 110, some of the UBM patterns 122, and some of the conductive terminals 150A. In some embodiments, some of the conductive terminals 150B are electrically connected to the semiconductor die 240 through some of the UBM patterns 124, the redistribution circuit structure 110, some of the UBM patterns 122, and some of the conductive terminals 150A. In certain embodiments, some of the conductive terminals 150B may be electrically floated or grounded, the disclosure is not limited thereto. However, the disclosure is not limited thereto; the conductive terminals 150B may be omitted as an alternative, where the exposed metallization layer ML1 may take the role of the conductive terminals 150B as mentioned above.

Figure 11:
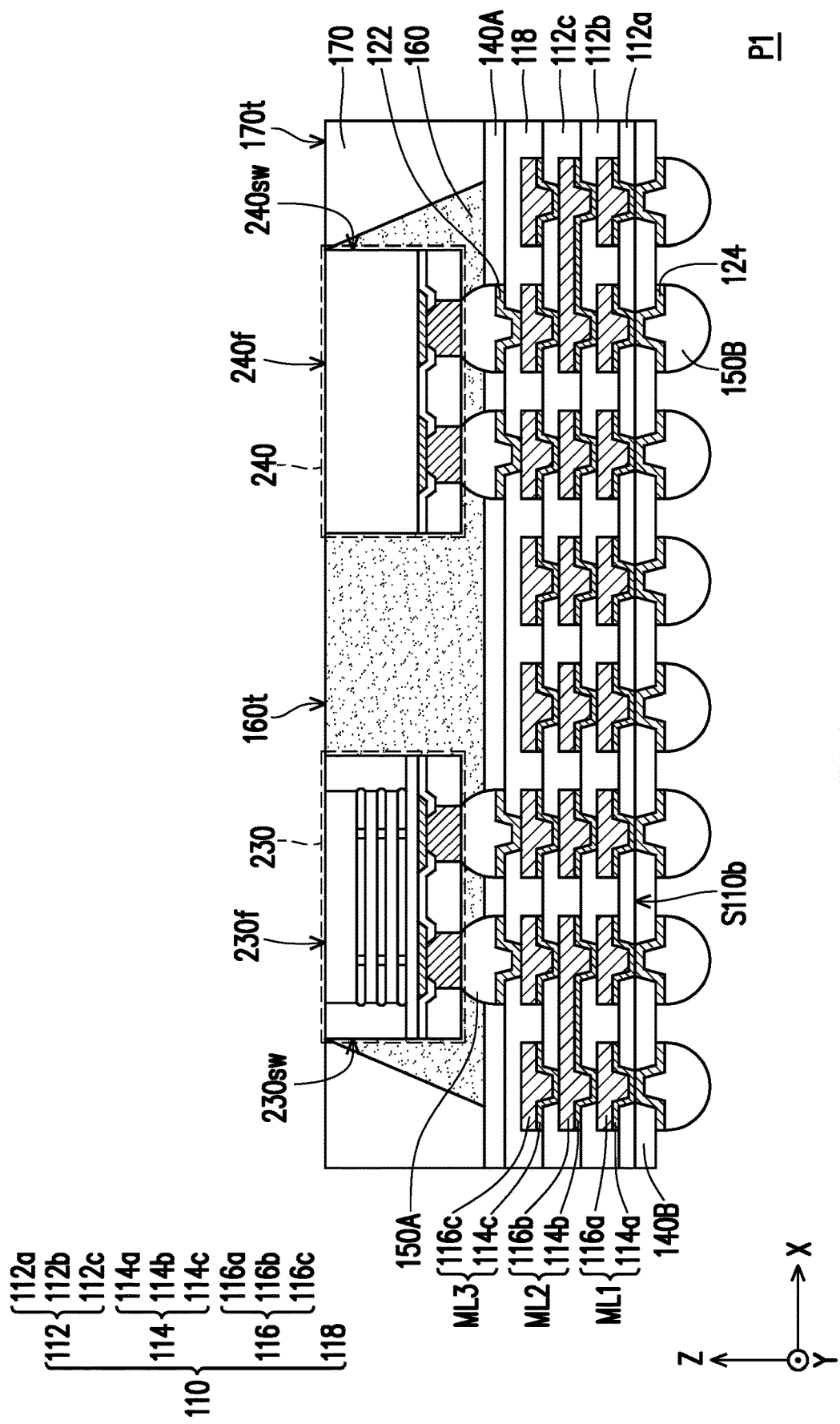

Referring to FIG. 11, in some embodiments, the whole structure depicted in FIG. 10 is flipped (turned upside down), and the carrier 106 is then debonded from the structure to form the semiconductor device P1. In some embodiments, the carrier 106 is detached from the semiconductor dies 230, 240, the underfill material 160 and the insulating encapsulation 170 through a debonding process, where the carrier 106 and the debond layer 108 are removed, and the semiconductor dies 230, 240, the underfill material 160 and the insulating encapsulation 170 are exposed. In one embodiment, the debonding process is a laser debonding process. During the debonding step, a holding device (not shown) is adopted to hold the conductive terminals 150B for securing the semiconductor device P1 before debonding the carrier 106. The holding device may be an adhesive tape, an adhesive carrier or a suction pad.

In some embodiments, the conductive terminals 150B are released from the holding device to form the semiconductor device P1. In some embodiments, prior to releasing the conductive terminals 150B from the holding device, a dicing process is performed to cut the semiconductor devices P1 connected to each other (e.g.in a wafer form) into individual and separated semiconductor devices P1 (e.g. in a singulated form). In one embodiment, the dicing process is a wafer dicing process including mechanical blade sawing or laser cutting. Up to here, the manufacture of the semiconductor device P1 is completed. In some embodiments, the semiconductor device P1 is referred to as an integrated fan-out (InFO) package. The semiconductor device P1 may be further mounted with an interposer, an additional package, chips/dies and/or other electronic devices to form a stacked semiconductor device, such as an InFO package-on-package (PoP) structure, see a semiconductor device P3 of a package structure 7000 depicted in FIG. 29 (which will be discussed later in great details).

Figure 12A:
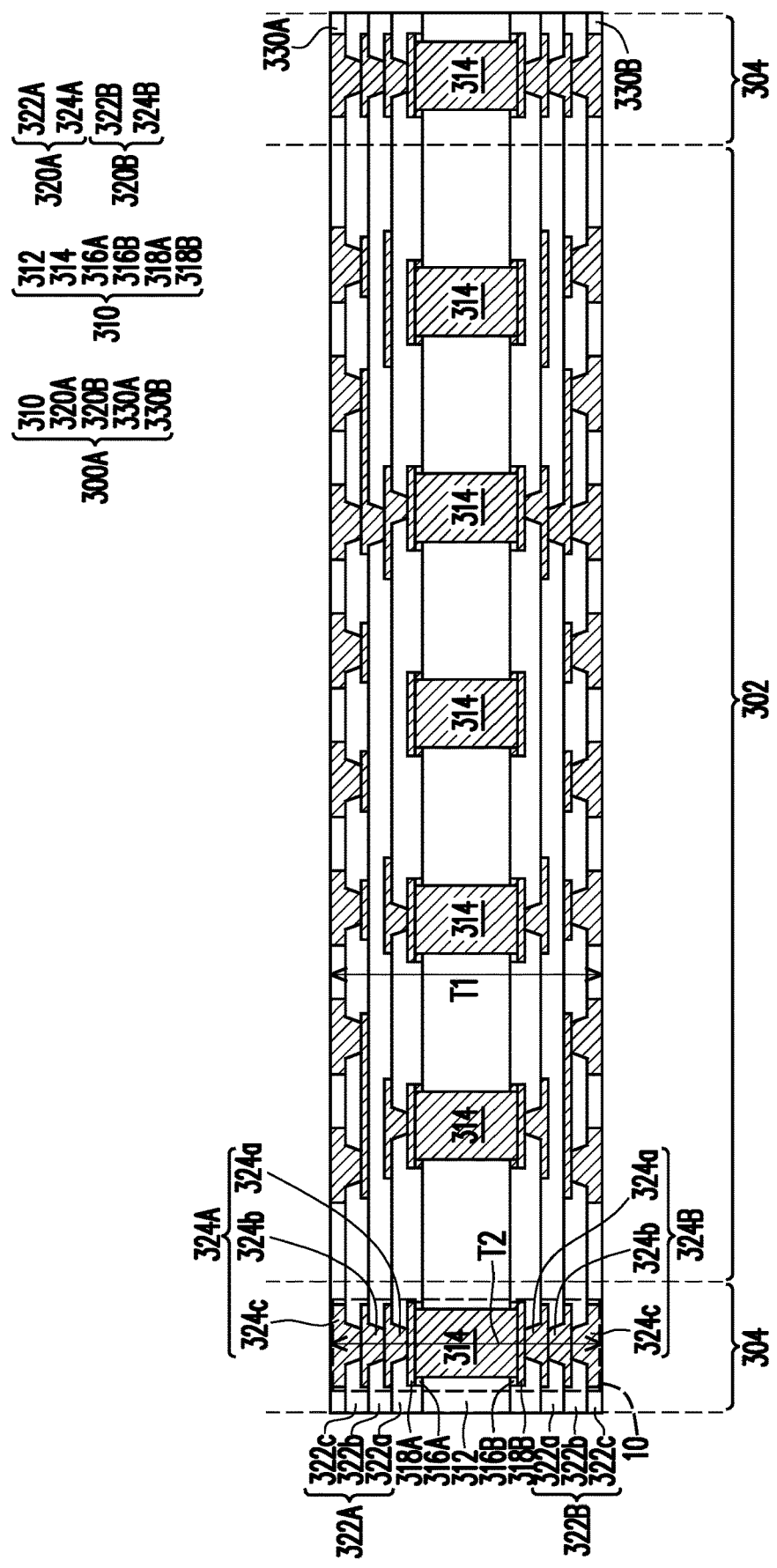
Figure 12B:
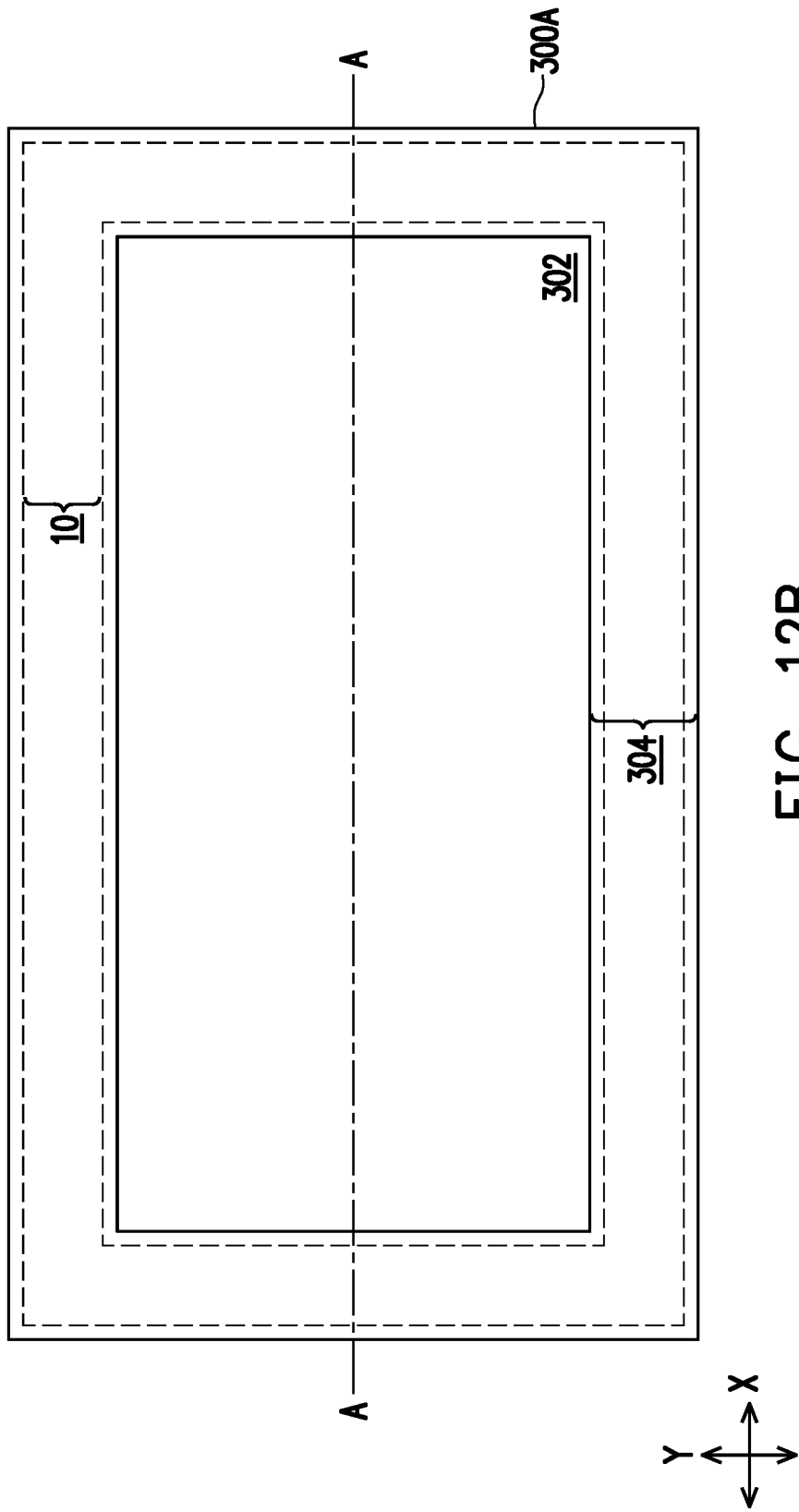
FIG. 12B, FIG. 13B, and FIG. 14B are schematic plane views showing the package structure depicted in FIG. 12A, FIG. 13A and FIG. 14A, respectively.

Referring to FIG. 12A and FIG. 12B, in some embodiments, a substrate 300A with a supporting structure 10 embedded therein is provided, in accordance with a step S10 of FIG. 15. In some embodiments, the substrate 300A includes a core portion 310, routing portions 320A, 320B and solder resist layers 330A, 330B, where the routing portion 320A and the routing portion 320B are respectively located at opposite sides of the core portion 310 along the direction Z, the solder resist layer 330A is disposed on the routing portion 320A, and the solder resist layer 330B is disposed on the routing portion 320B. In some embodiments, the routing portion 320A is sandwiched between the solder resist layer 330A and the core portion 310, and the routing portion 320B is sandwiched between the solder resist layer 330B and the core portion 310.

In some embodiments, the core portion 310 includes a core dielectric layer 312, a plurality of through holes 314, core conductive layers 316A, 316B and conductive lids 318A, 318B. In some embodiments, the core dielectric layer 312 includes prepreg (which contains epoxy, resin, silica filler and/or glass fiber), ABF, resin coated copper foil (RCC), polyimide, photo image dielectric (PID), ceramic core, glass core, molding compound, a combination thereof, or the like. However, the disclosure is not limited thereto, and other dielectric materials may also be used. The core dielectric layer 312 may be formed by a lamination process, a coating process, or the like. In some embodiments, the core conductive layers 316A and 316B are formed on the opposite sides of the core dielectric layer 312. In some embodiments, the core conductive layers 316A and 316B include copper, gold, tungsten, aluminum, silver, gold, a combination thereof, or the like. The conductive lids 318A and 318B are located respectively over the core conductive layers 316A and 316B. In some embodiments, the conductive lids 318A and 318B include copper or other suitable conductive material, for example. The core dielectric layer 312 is referred to as a base substrate or a core substrate, in some embodiments.

In some embodiments, the through holes 314 are disposed in and penetrate through the core dielectric layer 312, which provide electrical connection between the core conductive layer 316A and the core conductive layer 316B. In other words, the through holes 314 provide electrical paths between the electrical circuits located on two opposing sides of the core dielectric layer 312. In some embodiments, the through holes 314 are lined with an insulating material, where the liners (not shown) separate the through holes 314 from the core dielectric layer 312. The liners may be referred to as barrier layers. In some embodiments, the method of forming the through holes 314 includes the following operations. First, opening holes (not shown) are formed at the predetermined positions (of the through holes 314) by, for example, a mechanical or laser drilling, an etching, or another suitable removal technique. A desmear treatment may be performed to remove residues remaining in the opening holes formed in the core dielectric layer 312. Subsequently, the opening holes may be filled with one or more conductive materials to a predetermined thickness, thereby providing the through holes 314. For example, the opening holes may be filled with copper by an electroplating or an electroless plating, a deposition process or the like. The through holes 314 are referred to as conductive vias or through vias, in some embodiments.

The disclosure is not limited thereto; alternatively, the through holes may include plated through vias (not shown), where the opening holes may be lined with a conductive material and filled up with an insulating material. In some alternative embodiments, the method of forming the through holes includes the following operations. First, opening holes (not shown) are formed at the predetermined positions by, for example, a mechanical or laser drilling, an etching, or another suitable removal technique. A desmear treatment may be performed to remove residues remaining in the opening holes. Subsequently, the opening holes may be plated with one or more conductive materials to a predetermined thickness, thereby providing a plurality of plated through holes. For example, the opening holes may be plated with copper by an electroplating or an electroless plating.

Figure 16A:
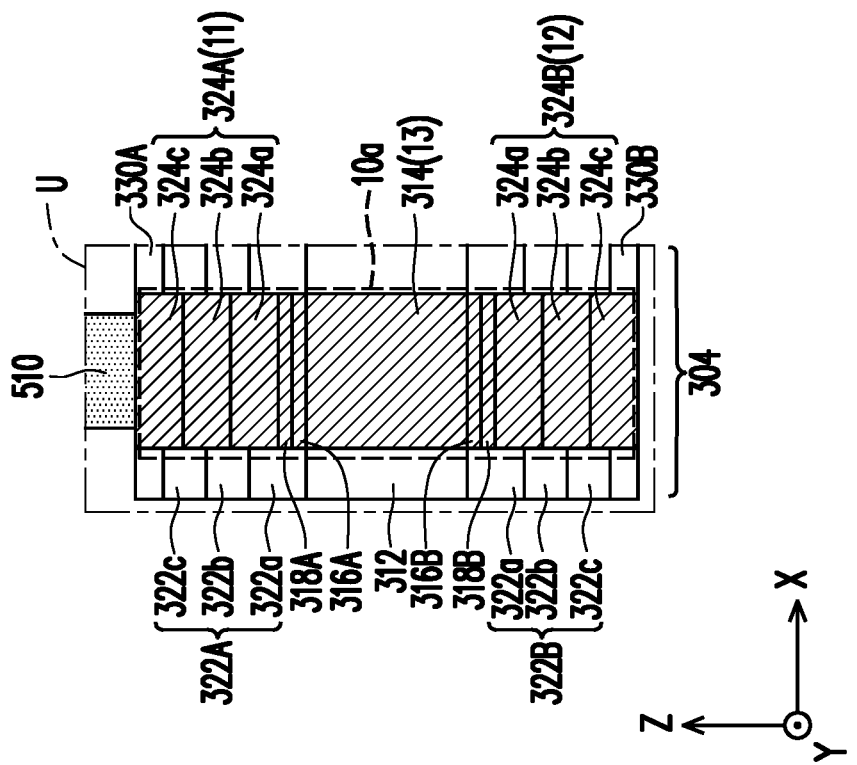
FIG. 16A through FIG. 16D are schematic and enlarged cross-sectional views showing various embodiments of a supporting structure in a dashed area U outlined in FIG. 12A in accordance with some embodiments of the disclosure.
Figure 16B:
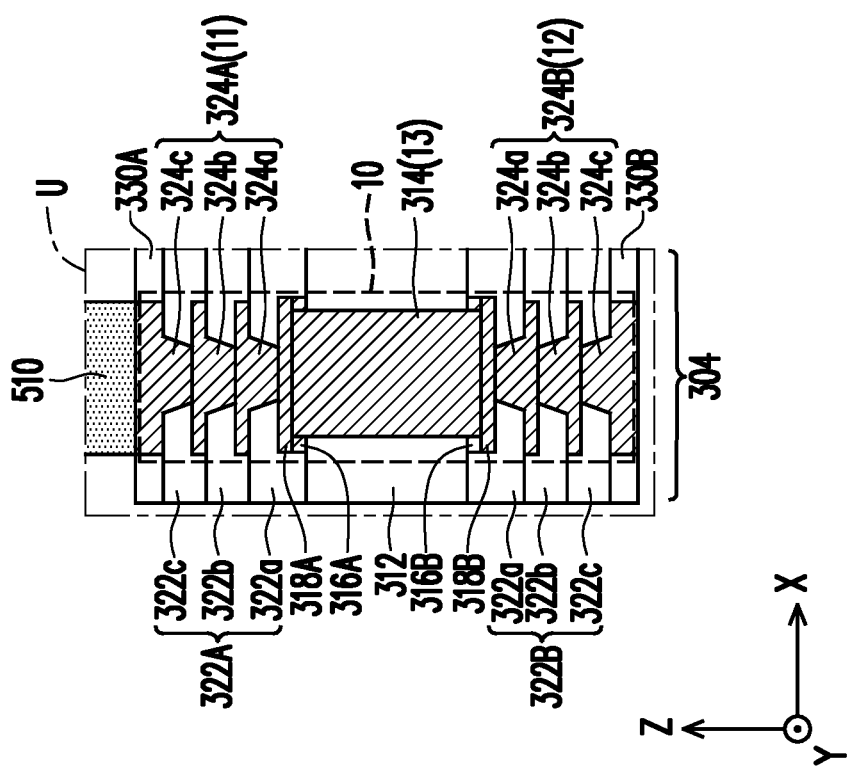
Figure 16C:
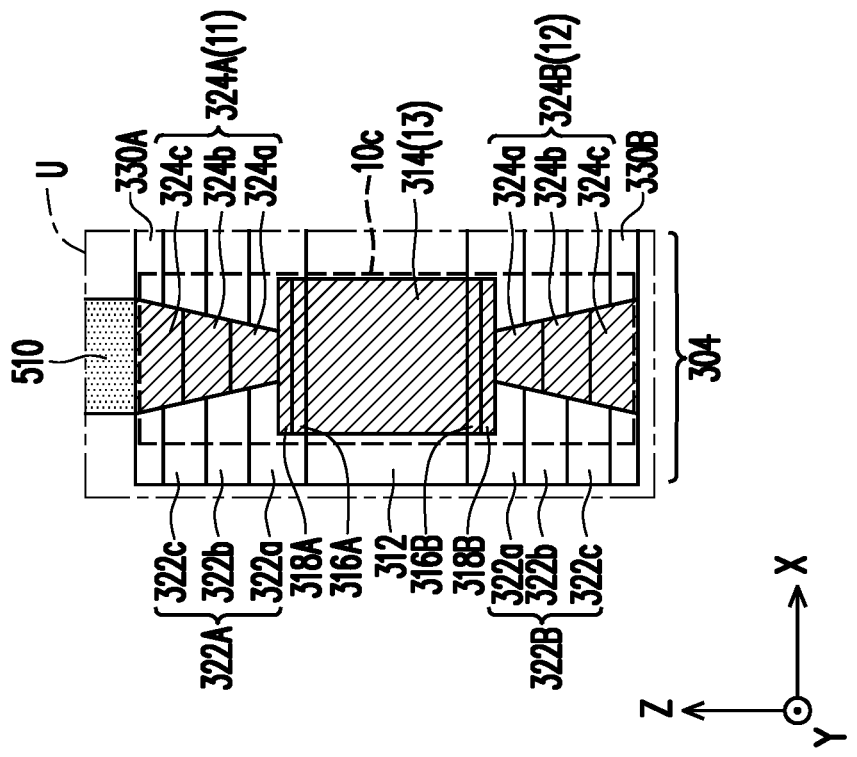
Figure 16D:
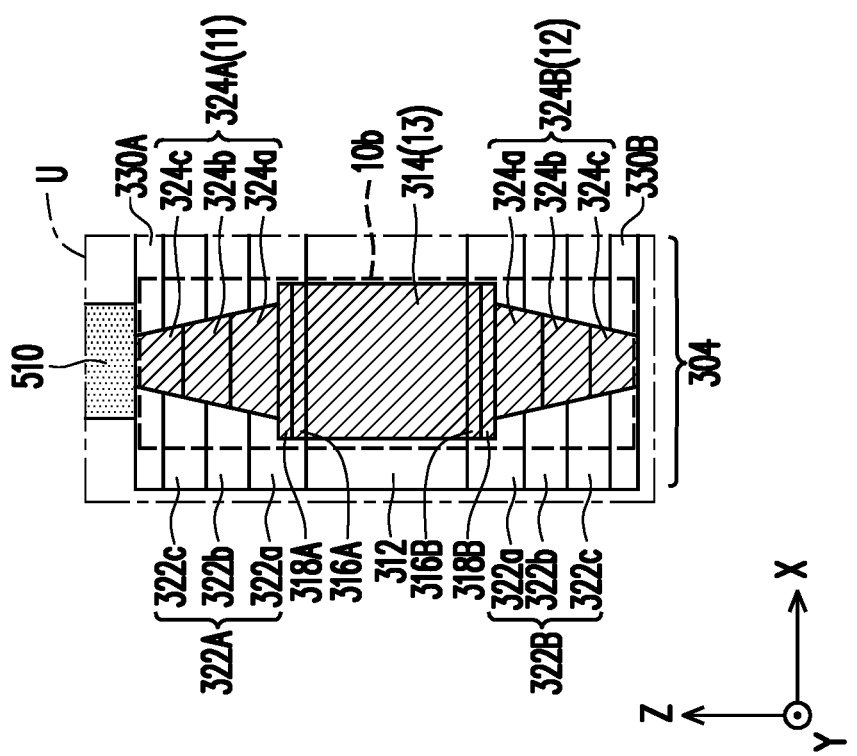

In some embodiments, the core conductive layers 316A and 316B, the conductive lids 318A and 318B, and the through holes 314 may be formed by the following steps. First, a first conductive material (not shown) is respectively formed on two opposite surfaces of the core dielectric layer 312. Then, the through holes 314 are formed to penetrate the core dielectric layer 312 as mentioned above and to provide electrical connection between the first conductive material respectively formed on both surfaces of the core dielectric layer 312. Thereafter, a second conductive material is respectively formed over the first conductive materials on the opposite surfaces of the core dielectric layer 312, where the second conductive material may be different from the first conductive material. In some embodiments, the first and second conductive materials may be formed by any suitable method (e.g., chemical vapor deposition (CVD) sputtering, printing, plating, or the like). Then, the first conductive materials and the second conductive materials may be patterned together to form the core conductive layers 316A, 316B and the conductive lids 318A, 318B respectively. In some embodiments, the first and second conductive materials may be partially removed using a photolithography and etching process or another suitable removal technique. That is, the through holes 314 further penetrate through the core conductive layers 316A and 316B, as shown in FIG. 12A and FIG. 16A, for example.

However, the disclosure is not limited thereto; alternatively, the core conductive layers 316A and 316B, the conductive lids 318A and 318B, and the through holes 314 may be formed by the following steps, forming the through holes 314 to penetrate the core dielectric layer 312 as mentioned above, sequentially forming the first and second conductive materials over the opposite surfaces of the core dielectric layer 312, and patterning the first and second conductive materials to form the core conductive layers 316A, 316B and the conductive lids 318A, 318B; thereby the through holes 314 provide electrical connection between the first and second conductive materials respectively formed on both surfaces of the core dielectric layer 312. With such alternative embodiments, the through holes 314 do not penetrate through the core conductive layers 316A and 316B (see FIG. 16B).

As illustrated in FIG. 12A, in some embodiments, the routing portions 320A and 320B are respectively disposed on the opposite sides of the core portion 310 in the direction Z. For example, the routing portion 320A is formed over the conductive lid 318A of the core portion 310, and the routing portion 320B is formed over the conductive lid 318B of the core portion 310. In some embodiments, the formation of the routing portion 320A may include sequentially forming a plurality of dielectric layers 322A (including dielectric layers 322a, 322b and 322c) and a plurality of conductive layers 324A (including conductive layers 324a, 324b and 324c). For example, the dielectric layers 322A and the conductive layers 324A are alternately stacked over an illustrated top surface (not labeled) of the core portion 310. Similarly, the formation of the routing portion 320B may include sequentially forming a plurality of dielectric layers 322B (including dielectric layers 322a, 322b and 322c) and a plurality of conductive layers 324B (including conductive layers 324a, 324b and 324c). For example, the dielectric layers 322B and the conductive layers 324B are alternately stacked over an illustrated bottom surface (not labeled) of the core portion 310.

In some embodiments, the routing portions 320A and 320B individually are referred to as a redistribution circuit structure or a redistribution structure, where the dielectric layer 322a and the conductive layer 324a together are considered as one routing layer, the dielectric layer 322b and the conductive layer 324b together are considered as a routing layer, and the dielectric layer 322c and the conductive layer 324c together are considered as one routing layer. In some embodiments, a material (of each layer such as the dielectric layers 322a, 322b and 322c) of the dielectric layers 322A and 322B may be ABF, prepreg, RCC, polyimide, PID, molding compound, a combination thereof, or the like. In some alternative embodiments, the core dielectric layer 312 and the dielectric layers 322A, 322B may be made of the same material. For example, the material of the core dielectric layer 312 and the dielectric layers 322A, 322B may be molding compound such as epoxy molding compound (EMC). The dielectric layers 322A and 322B may be formed by a lamination process, a coating process, or the like.

In some embodiments, a material (of each layer such as the conductive layers 324a, 324b and 324c) of the conductive layers 324A and 324B includes aluminum, titanium, copper, nickel, tungsten, and/or alloys thereof. The conductive layers 324A and 324B may be formed by forming a conductive material layer through a lamination process, a deposition process, or the like, and followed by a patterning process. The patterning process may include dry etching, wet etching, or a combination thereof. In certain embodiments, the formation and material of each layer of the conductive layers 324A and 324B are the same or similar to the process and material of forming the metallization layers ML1-ML3 as described in FIG. 1 through FIG. 3.

Although three layers of conductive layers and three layers of dielectric layers are illustrated for each of the routing portions 320A and 320B in FIG. 12A, the disclosure is not limited thereto. In some alternative embodiments, the number of dielectric layers 322A, 322B and the number of the conductive layers 324A, 324B may be adjusted upon the design requirements. In some embodiments, the total number of layers of each of the routing portions 320A and 320B may sum up to a total of one layer to eight layers for each of the conductive layers and the dielectric layers included therein. In some embodiments, the number of layers for each of the conductive layers and the dielectric layers in the routing portion 320A is equal to the number of layers for each of the conductive layers and the dielectric layers in the routing portion 320B. Alternatively, the total number of layers for each of the conductive layers and the dielectric layers in the routing portion 320A may be different from the total number of layers for each of the conductive layers and the dielectric layers in the routing portion 320B.

In some embodiments, a thickness of the core portion 310 is approximately in a range of 30 μm to 2000 μm. In some embodiments, in the direction Z, a thickness of each layer of the dielectric layers 322A, 322B is approximately in a range of 5 μm to 50 μm, and a thickness of each layer of the conductive layers 324A, 324B is approximately in a range of 2 μm to 50 μm. In some embodiments, a thickness of the outermost conductive layers (e.g. 324c) may be larger than a thickness of inner conductive layers (e.g. 324a-324b).

Continued on FIG. 12A, in some embodiments, the solder resist layer 330A is formed on an outmost surface of the routing portion 320A facing away from the core portion 310, and the solder resist layer 330B is formed on an outmost surface of the routing portion 320B facing away from the core portion 310. For example, the outermost conductive layers (e.g. 324c) of the routing portions 320A and 320B are accessibly revealed by an outermost surface of the solder resist layer 330A and an outermost surface of the solder resist layer 330B, respectively. The outermost conductive layer 324c of the routing portion 320A is substantially coplanar to and substantially leveled with the outermost surface of the solder resist layer 330A, and the outermost conductive layer 324c of the routing portion 320B is substantially coplanar to and substantially leveled with the outermost surface of the solder resist layer 330B, for example.

In some embodiments, the substrate 300A has a first region 302 and a second region 304 surrounding the first region 302, see FIG. 12A and FIG. 12B. For example, the first region 302 is connected to (e.g. in contact with) the second region 304. In some embodiments, the first region is referred to as a device region, which is disposed with a later-formed or later-provided semiconductor component, such as the semiconductor device P1. In some embodiments, the second region is referred to as a peripheral region enclosing the device region, which is disposed with a later-formed or later-provided non-semiconductor component, such as connection structure (e.g. a socket or the like), a supporting structure (e.g. a stiffener or the like), a thermal dissipator, combinations thereof, or the like. In some embodiments, the substrate 300A is considered as a circuit structure (e.g. an organic substrate with circuitry structure embedded therein, such as a PCB).

As illustrated in FIG. 12A and FIG. 12B, in some embodiments, the supporting structure 10 is located inside the substrate 300A. For example, a portion of each layer (e.g. 324a-324c) of the conductive layers 324A of the routing portion 320A, a portion of the through holes 314 of the core portion 310 and a portion of each layer (e.g. 324a-324c) of the conductive layers 324B of the routing portion 320B, which are located within the second region 302 of the substrate 300, together constitute the supporting structure 10. In some embodiments, the supporting structure 10 penetrates through the routing portion 320A, the substrate 310 and the routing portion 320B. In other words, the supporting structure 10 may penetrate through the substrate 300A. As shown in FIG. 12A, for example, a thickness T2 of the supporting structure 10 is substantially equal to a thickness T1 of the substrate 300A. The disclosure is not limited thereto; alternatively, the supporting structure in the disclosure may not penetrate through the substrate. In the disclosure, the supporting portion 10 may be referred to as a metallic or conductive supporting structure.

In some embodiments, the supporting structure 10 is electrically isolated from portions of the routing portions 320A, 320B and portions of the core portion 310 included in the substrate 300A that are used for providing routing function to the later-formed or later-provided semiconductor component disposed within the first regions 302. That is, there is no electrical impact (e.g. negative effects such as noises or the like) induced by the supporting structure 10 to the later-formed or later-provided semiconductor component. On the other hand, the supporting structure 10 may be electrically coupled to other portions of the routing portions 320A, 320B and other portions of the core portion 310 included in the substrate 300A that are not used for providing routing function to the later-formed or later-provided semiconductor component disposed within the first regions 302. That is, the supporting structure 10 may be electrically floating or electrically grounded through the substrate 300A. However, the disclosure is not limited; alternatively, the supporting structure 10 may be electrically isolated to the substrate 300A. That is, the supporting structure 10 may be electrically floating or electrically grounded through itself.

For example, as shown in FIG. 12A and FIG. 16A, the supporting structure 10 includes a first portion 11, a second portion 12 and a third portion 13 located between and electrically connecting the first portion 11 and the second portion 12. In some embodiments, the first portion 11 includes the portions of the routing portion 320A, such as a portion of the conductive layer 324a, a portion of the conductive layer 324b and a portion of the conductive layer 324c included in the routing portion 320A that are located within the second region of the substrate 300A. In some embodiments, the second portion 12 includes the portions of the routing portion 320B, such as a portion of the conductive layer 324a, a portion of the conductive layer 324b and a portion of the conductive layer 324c included in the routing portion 320B that are located within the second region of the substrate 300A. In some embodiments, the third portion 13 includes the portions of the core portion 310, such as the through holes 324 included in the core portion 310 that are located within the second region of the substrate 300A. For example, as shown in FIG. 12B, the supporting structure 10 is in a form of a full (continuous) frame annulus. In some embodiments, at least one or all of the portions of the conductive layers 324a-324c included in the first portion 11 is in a form of a full (continuous) frame annulus. In some embodiments, at least one or all of the portions of the conductive layers 324a-324c included in the second portion 12 is in a form of a full (continuous) frame annulus. In some embodiments, the third portion 13 includes one or more than one through hole 314, where such through hole(s) 314 is in a form of a full (continuous) frame annulus.

As shown in FIG. 12A and FIG. 16A, for example, a sidewall of the supporting structure 10 is in a wave-shape form. In some embodiments, the cross-section shape of the conductive layers 324a-324c included in the supporting structure 10 includes a T-shape.

However, the disclosure is not specifically limited thereto. In some alternative embodiments, the sidewall of the supporting structure is in non-wave-shape form. For example, a supporting structure 10a includes a continuous and vertical sidewall, see FIG. 16B. In some embodiments, the cross-section shape of the conductive layers 324a-324c included in the supporting structure 10a of FIG. 16B includes a rectangular shape.

In alternative embodiments, a supporting structure 10b includes discontinuous and planar sidewalls. For example, a supporting structure 10b and a supporting structure 10c each includes a sidewall including a continuous and slant sidewall of the first portion 11, a continuous and slant sidewall of the second portion 12 and a continuous and vertical sidewall of the third portion 13, see FIG. 16C and FIG. 16D. In some embodiments, the cross-section shape of the conductive layers 324a-324c in the first portion 11 included in the supporting structure 10b of FIG. 16C includes a trapezoid shape having a size gradually decreasing from the core portion 310 toward the solder resistor layer 330A, and the cross-section shape of the conductive layers 324a-324c in the second portion 12 included in the supporting structure 10b of FIG. 16C includes a trapezoid shape having a size gradually decreasing from the core portion 310 toward the solder resistor layer 330B. In some embodiments, the cross-section shape of the conductive layers 324a-324c in the first portion 11 included in the supporting structure 10c of FIG. 16D includes a trapezoid shape having a size gradually increasing from the core portion 310 toward the solder resistor layer 330A, and the cross-section shape of the conductive layers 324a-324c in the second portion 12 included in the supporting structure 10c of FIG. 16D includes a trapezoid shape having a size gradually increasing from the core portion 310 toward the solder resistor layer 330B.

Referring back to FIG. 12A and FIG. 16A, in some embodiments, for each routing layer in the routing portion 320A of the substrate 300A, a first ratio of a total volume of a conductive portion (e.g., one of 324a-324c) within the first region 302 to a total volume of the conductive portion (e.g., the one of 324a-324c) and a respective one dielectric portion (e.g., a respective one of 322a-322c) of the routing layer within the first region 302 is A, and a second ratio of a total volume of the conductive portion (e.g., the of 324a-324c) within the second region 304 to a total volume of the conductive portion (e.g., the one of 324a-324c) and the respective one dielectric portion (e.g., the respective one of 322a-322c) of the routing layer within the second region 304 is B, where the first ratio A is less than the second ration B. In some embodiments, the first ratio A is less than 80%. For example, the first ratio A is approximately greater than or substantially equal to 60% and is approximately less than 80%. In some embodiments, the second ratio B is great than or substantially equal to 80%. For example, the second ratio B is approximately greater than or substantially equal to 80% and is approximately less than or substantially equal to 100%.

In some embodiments, for each routing layer in the routing portion 320B of the substrate 300A, a third ratio of a total volume of a conductive portion (e.g., one of 324a-324c) within the first region 302 to a total volume of the conductive portion (e.g., the one of 324a-324c) and a respective one dielectric portion (e.g., a respective one of 322a-322c) of the routing layer within the first region 302 is C, and a fourth ratio of a total volume of the conductive portion (e.g., the of 324a-324c) within the second region 304 to a total volume of the conductive portion (e.g., the one of 324a-324c) and the respective one dielectric portion (e.g., the respective one of 322a-322c) of the routing layer within the second region 304 is D, where the third ratio C is less than the fourth ration D. In some embodiments, the third ratio C is less than 80%. For example, the third ratio C is approximately greater than or substantially equal to 60% and is approximately less than 80%. In some embodiments, the fourth ratio D is great than or substantially equal to 80%. For example, the fourth ratio D is approximately greater than or substantially equal to 80% and is approximately less than or substantially equal to 100%.

In some embodiments, for the core portion 310 of the substrate 300A, a fifth ratio of a total volume of a conductive portion (e.g., the through vias 314) within the first region 302 to a total volume of the conductive portion (e.g., the through vias 314) and a respective one dielectric portion (e.g., the core dielectric layer 312) within the first region 302 is E, and a sixth ratio of a total volume of the conductive portion (e.g., the through vias 314) within the second region 304 to a total volume of the conductive portion (e.g., the through vias 314) and the respective one dielectric portion (e.g., the core dielectric layer 312) within the second region 304 is F, where the fifth ratio E is less than the sixth ration F. In some embodiments, the fifth ratio E is less than 80%. For example, the fifth ratio E is approximately greater than or substantially equal to 60% and is approximately less than 80%. In some embodiments, the sixth ratio F is great than or substantially equal to 80%. For example, the sixth ratio F is approximately greater than or substantially equal to 80% and is approximately less than or substantially equal to 100%. In the embodiments of which the sixth ratio F is substantially equal to 100%, there is no dielectric in the second region 304.

In one embodiment, the first ratio A, the third ratio C and the fifth ratio E are substantially equal to one another. In an alternative embodiment, the first ratio A, the third ratio C and the fifth ratio E are different from one another, in part or all. In one embodiment, the routing layers included in the routing portion 310A have the same first ratio A. Alternatively, the routing layers included in the routing portion 310A have different first ratio A, in part or all. In one embodiment, the routing layers included in the routing portion 310B have the same third ratio C. Alternatively, the routing layers included in the routing portion 310B have different third ratio C, in part or all.

Similarly, in one embodiment, the second ratio B, the fourth ratio D and the sixth ratio F are substantially equal to one another. In an alternative embodiment, the second ratio B, the fourth ratio D and the sixth ratio F are different from one another, in part or all. In one embodiment, the routing layers included in the routing portion 310A have the same second ratio B. Alternatively, the routing layers included in the routing portion 310A have different second ratio B, in part or all. In one embodiment, the routing layers included in the routing portion 310B have the same fourth ratio D. Alternatively, the routing layers included in the routing portion 310B have different fourth ratio D, in part or all.

In one embodiment, the substrate 300A includes active and/or passive devices (not shown), such as transistors, capacitors, resistors, combinations thereof, or the like which may be used to generate the functional design for the package structure 1000A. The active and/or passive devices may be formed using any suitable methods. However, the disclosure is not limited thereto; in an alternative embodiment, the substrate 300A is substantially free of active and/or passive devices.

Figure 13A:
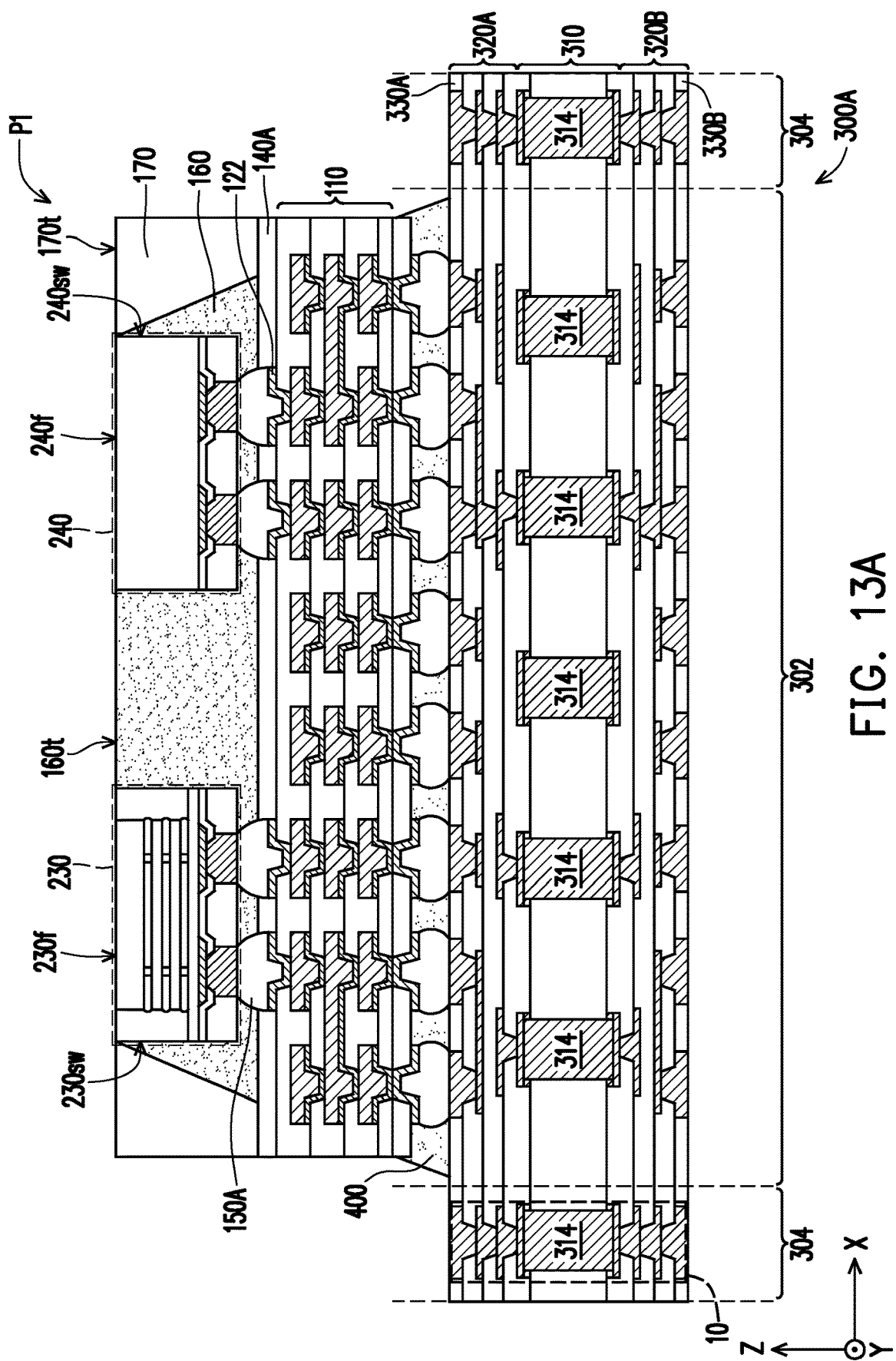
Figure 13B:
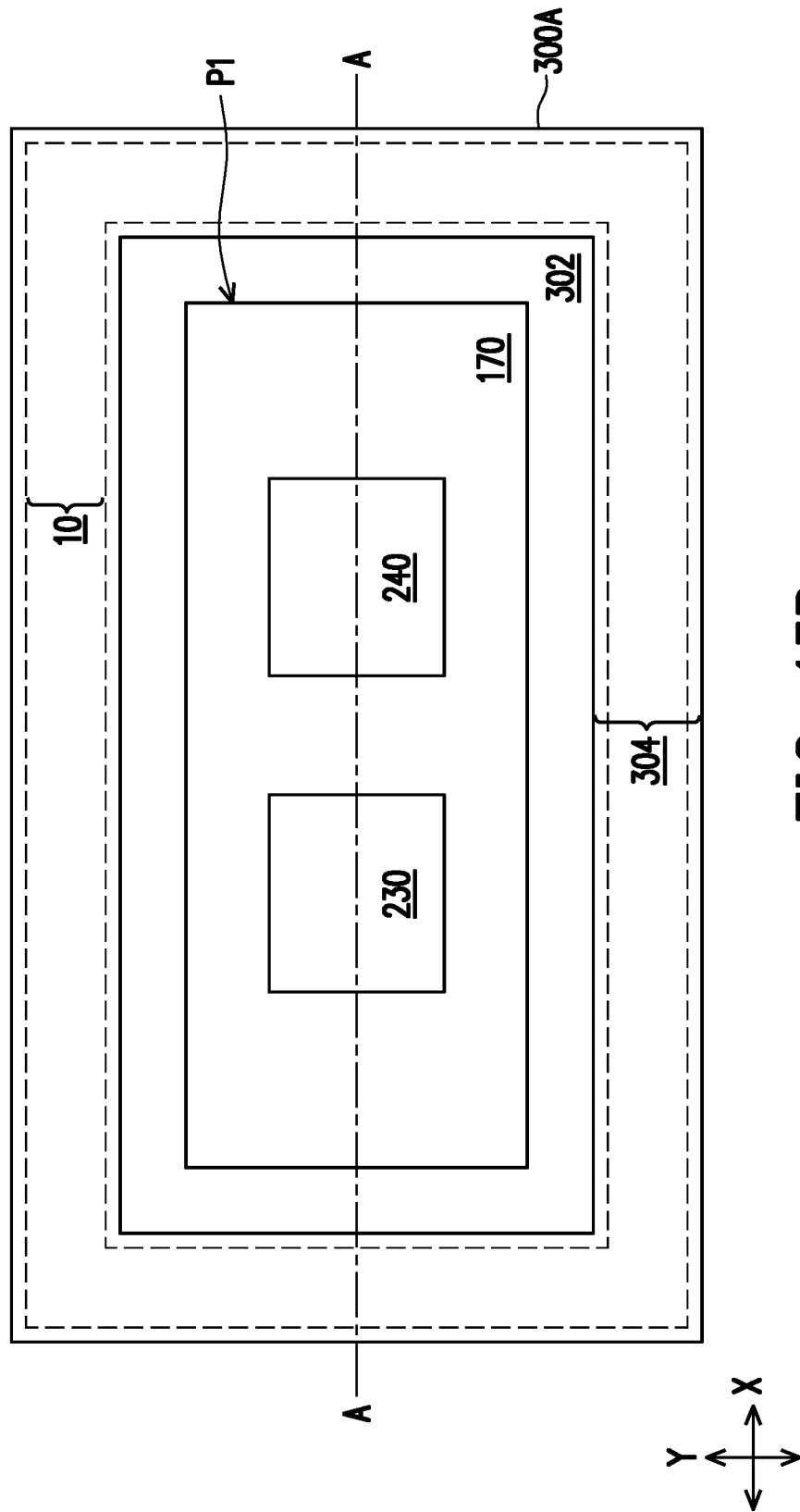

Referring to FIG. 13A and FIG. 13B, in some embodiments, the semiconductor device P1 is placed over and mounted onto the substrate 300A within the first region 302, in accordance with a step S20 of FIG. 15. For example, the semiconductor device P1 is picked and placed on the substrate 300A, and then is bonded to the substrate 300A by flip chip bonding. In some embodiments, the semiconductor device P1 is electrically coupled to the substrate 300A through connecting the conductive terminals 150B to the routing portion 320A (e.g. the outermost conductive layers (e.g. 324c) exposed by the solder resist layer 330A). Through the conductive terminals 150B, the semiconductor device P1 is mechanically and electrically connected to the substrate 300A, for example. In some embodiments, the semiconductor device P1 is electrically isolated to the supporting structure 10. Although only one semiconductor device P1 is shown in FIG. 13A and FIG. 13B for illustrative purposes, the number of the semiconductor device P1 may be one or more than one based on the demand and design layout.

In alternative embodiments, prior to mounting the semiconductor device P1 on the substrate 300A, a plurality of solder regions (not shown) may be formed on the outermost conductive layer (e.g. 324c) of the routing portion 320A exposed by the solder resist layer 330A. The solder regions may be pre-solder pastes, which are formed by printing or the like. In some embodiments, the material of the solder regions may include a lead-free solder material (such as Sn—Ag base or Sn—Ag—Cu base materials) with or without additional impurity (such as Ni, Bi, Sb, Au, or the like).

In some embodiments, as shown in FIG. 13A, an underfill material 400 is formed on the substrate 300A to fill the gap between the semiconductor device P1 and the substrate 300A, and wraps sidewalls of the conductive terminals 150B. Due to the underfill material 400, a bonding strength between the semiconductor device P1 and the substrate 300A is enhanced, thereby ensuring the electrical coupling of the semiconductor device P1 and the substrate 300A. The formation and material of the underfill material 400 may be the same or similar to the process and material of forming the underfill material 160 as described in FIG. 6, and thus are not repeated therein for brevity. In an alternative embodiment, the underfill 400 can be omitted.

In the embodiments of which the passivation layer 140B, the UBM patterns 124 and the conductive terminals 150B are omitted, the semiconductor device P1 can be mounted to the substrate 300A by hybrid bonding (involving a metal-to-metal bonding and a dielectric-to-dielectric bonding). The disclosure is not limited thereto.

In other alternative embodiments, prior to mounting the semiconductor device P1 onto the substrate 300A, the semiconductor device P1 may be mounted to an interposer (not shown), where the interposer is further mounted onto the substrate 300A through additional conductive connectors. For example, such interposer is sandwiched between the semiconductor device P1 and the substrate 300A. The interposer may provide further routing function to the semiconductor device P1, where may be or may include in a type of a substrate having through-substrate vias with/without additional routing layers or in a type of a redistribution circuit structure, the disclosure is not limited thereto. In the embodiments of which the interposer is included, the manufactured package structure is referred to as a chip-on-wafer-on-substrate (CoWoS) package. The additional conductive connectors may be micro-bumps, metal pillars, electroless nickel-electroless palladium-immersion gold (ENEPIG) formed bumps, controlled collapse chip connection (C4) bumps (for example, which may have, but not limited to, a size of about 80 µm), a ball grid array (BGA) bumps or balls (for example, which may have, but not limited to, a size of about 400 µm), solder balls, or the like. The disclosure is not limited thereto.

Figure 14A:
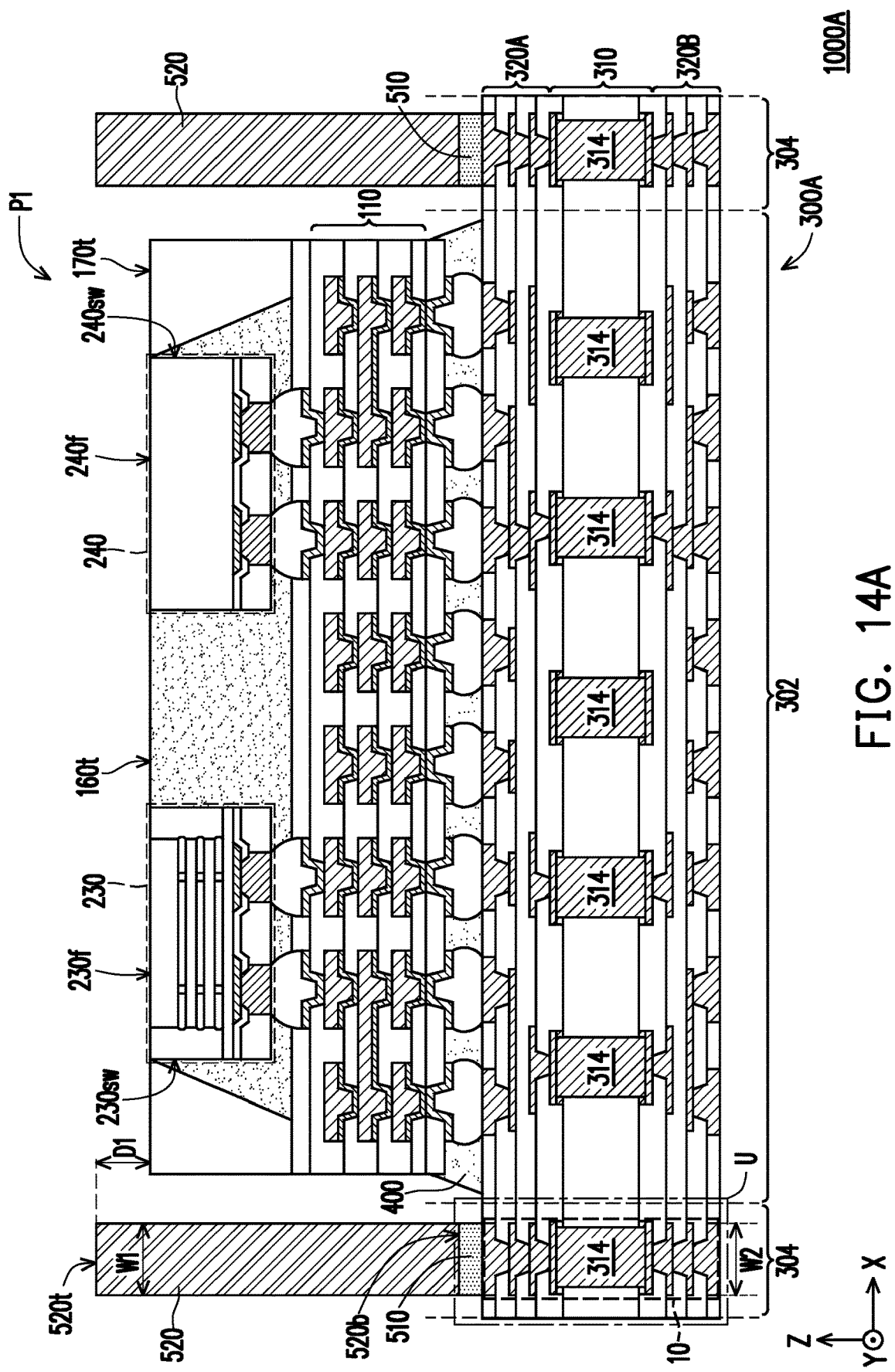
Figure 14B:
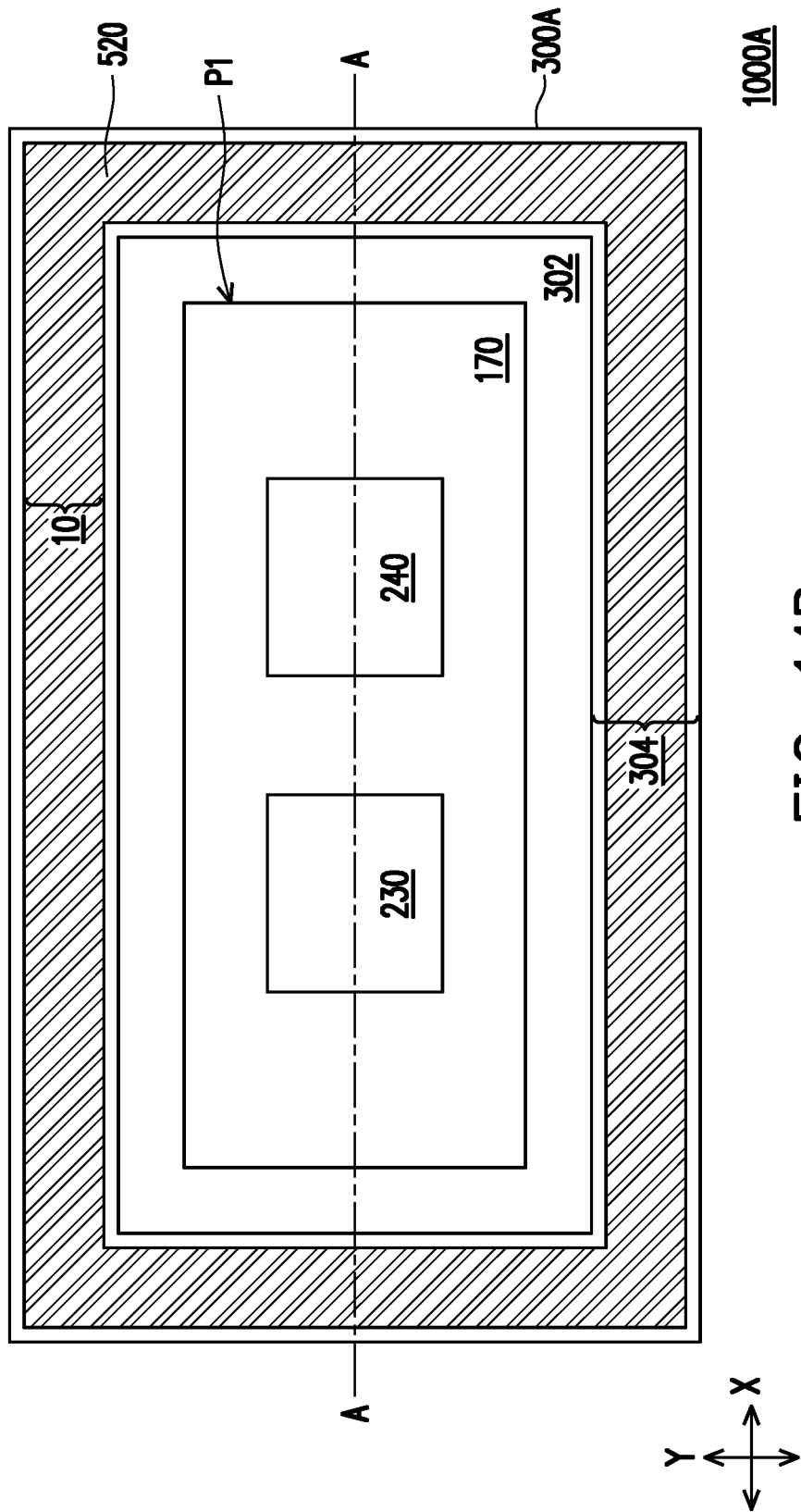
Figure 15:
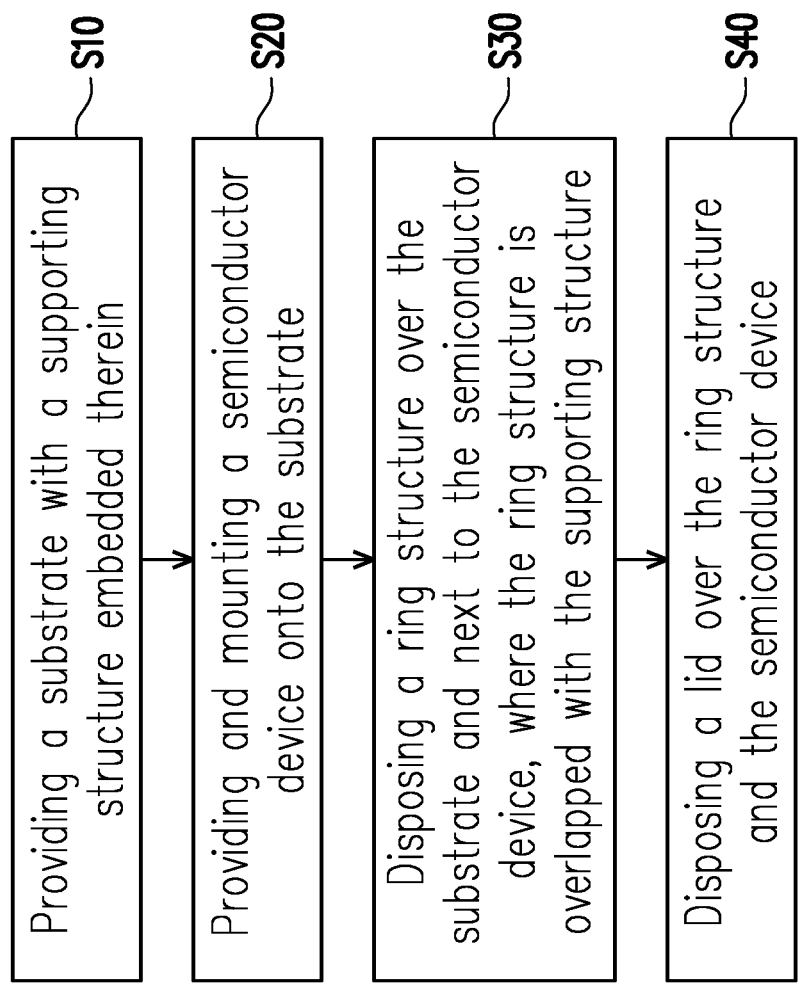
FIG. 15 is a flow chart illustrating a method of manufacturing a package structure in accordance with some embodiments of the disclosure.

Referring to FIG. 14A and FIG. 14B, in some embodiments, a ring structure 520 is provided and then bonded to the substrate 300A within the second region 304, in accordance with a step S30 of FIG. 15. For example, a bottom surface 520b of the ring structure 520 is adhered to an illustrated top surface of the substrate 300A through an adhesive 510, where the ring structure 520 surrounds the semiconductor device P1. In some embodiments, in the plane view (e.g., the X-Y plane), the ring structure 520 is in a form of a full (continuous) frame annulus having an inner sidewall (not labeled) facing a sidewall of the semiconductor device P1 and an outer sidewall (not labeled) opposite to the inner sidewall. For example, the ring structure 520 is next to and separated from the semiconductor device P1 by a gap, in the plane view. Up to here, the package structure 1000A is manufactured. The package structure 1000A may be referred to as a flip chip package (with an InFO package). Owing to the ring structure 520, the loading effect (e.g., between the first region 302 and the second region 304) of the substrate 300A is suppressed, the warpage control of the package structure 1000A is achieved.

In some embodiments, a material of the ring structure 520 includes an electrically conductive material, a thermally conductive material or an electrically and thermally conductive material. In some embodiments, the material of the ring structure 520 includes metals or metal alloys, such as copper, aluminum, their alloys, combinations thereof or the like. In some embodiments, the adhesive 510 includes an electrically conductive adhesive, a thermally conductive adhesive or an electrically and thermally conductive adhesive. The adhesive 510 may further include a filler. For example, the filler includes a metal filler or a metal alloy filler. Through the adhesive 510, the ring structure 520 is electrically and thermally connected to the substrate 300A. As shown in FIG. 14A, in some embodiments, after the ring structure 520 is mounted onto the substrate 300A, an illustrated top surface (e.g. 170t/160t) of the semiconductor device P1 is lower than a top surface 520t of the ring structure 520 by a distance D1, where the top surface 520t is opposite to the bottom surface 520b in the direction Z. With such, the ring structure 520 further provides a protection for the semiconductor device P1 from physical damages during transportation, transferring and/or operation. In some embodiments, the ring structure 520 is electrically isolated to the semiconductor device P1. That is, there is no electrical impact (e.g. negative effects such as noises or the like) induced by the ring structure 520 to the semiconductor device P1.

In some embodiments of the package structure 1000A as shown in FIG. 14A and FIG. 14B, a positioning location of the ring structure 520 is overlapped with a positioning location of the supporting structure 10 in a vertical projection on the substrate 300A along the direction Z. In some embodiments, a width (e.g. a lateral size or a horizontal dimension) W1 of the ring structure 520 is substantially equal to a width (e.g. a lateral size or a horizontal dimension) W2 of the supporting structure 10. Owing the configuration of the ring structure 520 and the supporting structure 10, a CTE mismatch between the ring structure 510 and the substrate 300A is further suppressed, a better warpage control of the package structure 1000A is thus ensured. The disclosure is not limited thereto; other possible profiles or lateral size (in the cross-sectional view) may be adopted by the supporting structure 10 as long as the positioning location of the ring structure 520 is overlapped with the positioning location of the supporting structure 10. For example, the width of the supporting structure can be greater than or less than the width of the ring structure as other alternatives.

Figure 17:
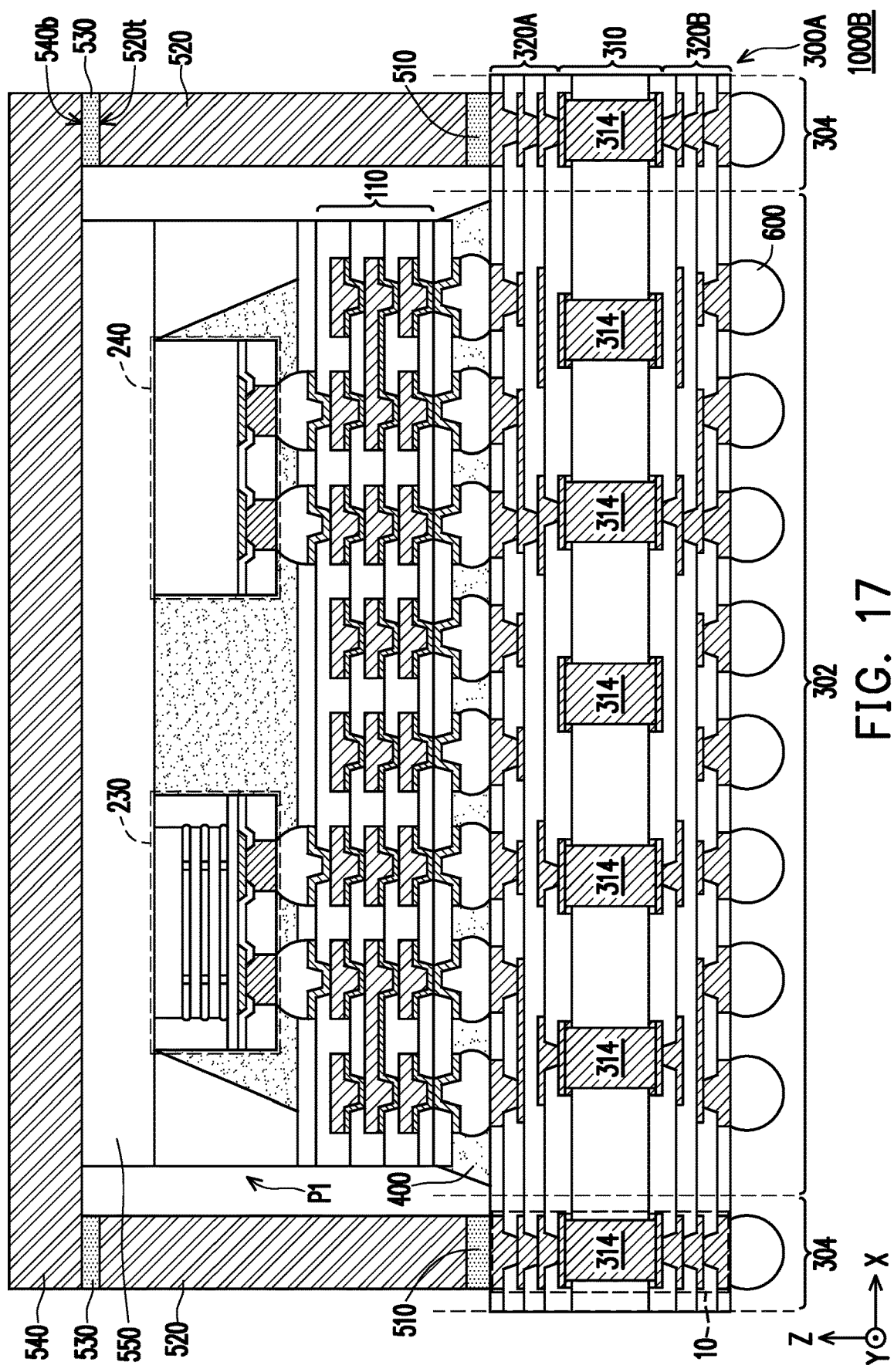
FIG. 17 is a schematic cross-sectional view showing a package structure in accordance with alternative embodiments of the disclosure.

FIG. 17 is a schematic cross-sectional view showing a package structure 1000B in accordance with alternative embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. Referring to FIG. 17, in some embodiments, the package structure 1000B is manufactured by providing a lid 540 and mounting the lid 540 onto the ring structure 520, following the process as described in FIG. 14A; in accordance with a step S40 of FIG. 15.

For example, a bottom surface 540b of the lid 540 is adhered to the top surface 520t of the ring structure 520 through an adhesive 530, where the lid 540, the adhesive 530, the ring structure 520, the adhesive 510 and the substrate 300A together confine an accommodating space (not labeled) enclosing the semiconductor device P1. In some embodiments, in the plane view (not shown), the lid 540 is in a form of a solid block having the sidewall substantially aligned with the outer sidewall of the substrate 300A in the direction Z. The lid 540 may be referred to as the heat dissipating element of the package structure 1000B. Alternatively, the lid 540, the ring structure 520 and the adhesive 530 therebetween together may be referred to as the heat dissipating element of the package structure 1000B. Owing to such heat dissipating element, the heat dissipation of the semiconductor device P1 in the package structure 1000B is improved.

In addition, the thermal interface material may be coated on the semiconductor device P1 to facilitate the heat dissipation of the package structure 1000B. As illustrated in the package structure 1000B of FIG. 17, a thermal interface material 550 is located between the illustrated top surface (e.g. 170t/160t) of the semiconductor device P1 and the bottom surface 540b of the lid 540 to thermally couple the semiconductor device P1 to the lid 540, which further helps to dissipate heat from the semiconductor device P1 to the lid 540.

The thermal interface material 550 may include any suitable thermally conductive material such as a polymer having a good thermal conductivity, which may be between about 3 W/(m·K) to about 10 W/(m·K) or more, and may be formed on the illustrated top surface (e.g. 170t/160t) of the semiconductor device P1 by liquid dispensing. In some embodiments, the thermal interface material 550 is a film type thermal interface material, such as graphene sheet, carbon nanotube sheet or the like, and is formed on the illustrated top surface (e.g. 170t/160t) of the semiconductor device P1 by lamination or the like. The disclosure does not specifically limit a thickness of the thermal interface material 550 as long as the thermal interface material 550 is thick enough to sufficiently dissipating heat from the semiconductor device P1 to the lid 540.

However, the disclosure is not limited thereto; alternatively, the thermal interface material 550 may be omitted, where the lid 540 is separated apart from (e.g. the illustrated top surface (e.g. 170t/160t) of) the semiconductor device P1 by a gap, such as an air gap.

In some embodiments, a material of the lid 540 includes an electrically conductive material, a thermally conductive material or an electrically and thermally conductive material. In some embodiments, the material of the lid 540 includes metals or metal alloys, such as copper, aluminum, their alloys, combinations thereof or the like. In some embodiments, the adhesive 530 includes an electrically conductive adhesive, a thermally conductive adhesive or an electrically and thermally conductive adhesive. The adhesive 530 may further include a filler. For example, the filler includes a metal filler or a metal alloy filler. The material of the adhesive 510 may be the same to the material of the adhesive 530. Alternatively, the material of the adhesive 510 may be the different from the material of the adhesive 530. In addition, the material of the ring structure 520 may be the same to the material of the lid 540. Alternatively, the material of the ring structure 520 may be the different from the material of the lid 540.

Through the adhesive 530, the lid 540 is electrically and thermally connected to the ring structure 520, and is further electrically and thermally connected to the substrate 300A through the ring structure 520 and the adhesive 510. In some embodiments, the lid 540, the adhesive 530, the ring structure 520 and the adhesive 510 together constitute an electromagnetic interference (EMI) shielding structure (which is electrically connected to the substrate 300A) for the semiconductor device P1. Owing to such EMI shielding structure, the impact caused by electromagnetic wave generated from other electronic elements located outside the package structure 1000B can be suppressed, thereby enhancing reliability and performance of the package structure 1000B.

In some embodiments, a thickness of the ring structure 520 is greater than the thickness of the lid 540, as measured along the direction Z. However, the disclosure is not limited thereto; alternatively, the thickness of the ring structure 520 may be less than or substantially equal to the thickness of the lid 540, as measured along the direction Z.

In some embodiments, the package structure 1000B further includes a plurality of conductive terminals 600 disposed on an illustrated bottom surface of the substrate 300A, as shown in FIG. 17. In some embodiments, some of the conductive terminals 600 are electrically connected to the semiconductor device P1 through the substrate 300A. In some embodiments, some of the conductive terminals 600 are electrically connected to the supporting structure 10. The conductive terminals 600 may be used to physically and electrically connect the substrate 300A and/or the supporting structure 10 to other devices, packages, connecting components, and the like. The conductive terminals 600 are referred to as conductive connectors of the package structure 1000B (serving as conductive input/output terminals of the semiconductor device P1) for providing physical and/or electrical connection to external components, in some embodiments. In alternative embodiments, the conductive terminals 600 may also be adopted in the package structure 1000A.

The number of the conductive terminals 600 is not limited to the embodiments, and may be selected based on the demand and design layout. The conductive terminals 600 may be micro-bumps, metal pillars, electroless nickel-electroless palladium-immersion gold (ENEPIG) formed bumps, controlled collapse chip connection (C4) bumps (for example, which may have, but not limited to, a size of about 80 µm), a ball grid array (BGA) bumps or balls (for example, which may have, but not limited to, a size of about 400 µm), solder balls, or the like. The disclosure is not limited thereto. When solder is used, the solder may include either eutectic solder or non-eutectic solder. The solder may include lead or be lead-free, and may include Sn—Ag, Sn—Cu, Sn—Ag—Cu, or the like. In alternative embodiments, the conductive terminals 600 may be omitted from the package structure 1000B.

In other embodiments, additional semiconductor devices (not shown) are adopted to be formed on at least one of the illustrated top or bottom surfaces of the substrate 300A in the package structures 1000A and 1000B. The additional semiconductor devices may be referred to surface devices used to provide additional functionality or programming to the semiconductor device P1. For example, the additional semiconductor devices include surface mount devices (SMDs) or an integrated passive devices (IPDs) that comprise passive devices such as resistors, inductors, capacitors, jumpers, combinations of these, or the like that are desired to be connected to and utilized in conjunction with the semiconductor device P1. The additional semiconductor devices are electrically connected to the semiconductor device P1 through the substrate 300A, for example. The number of the additional semiconductor devices is not limited, and may be selected based on the demand and design layout.

Figure 18:
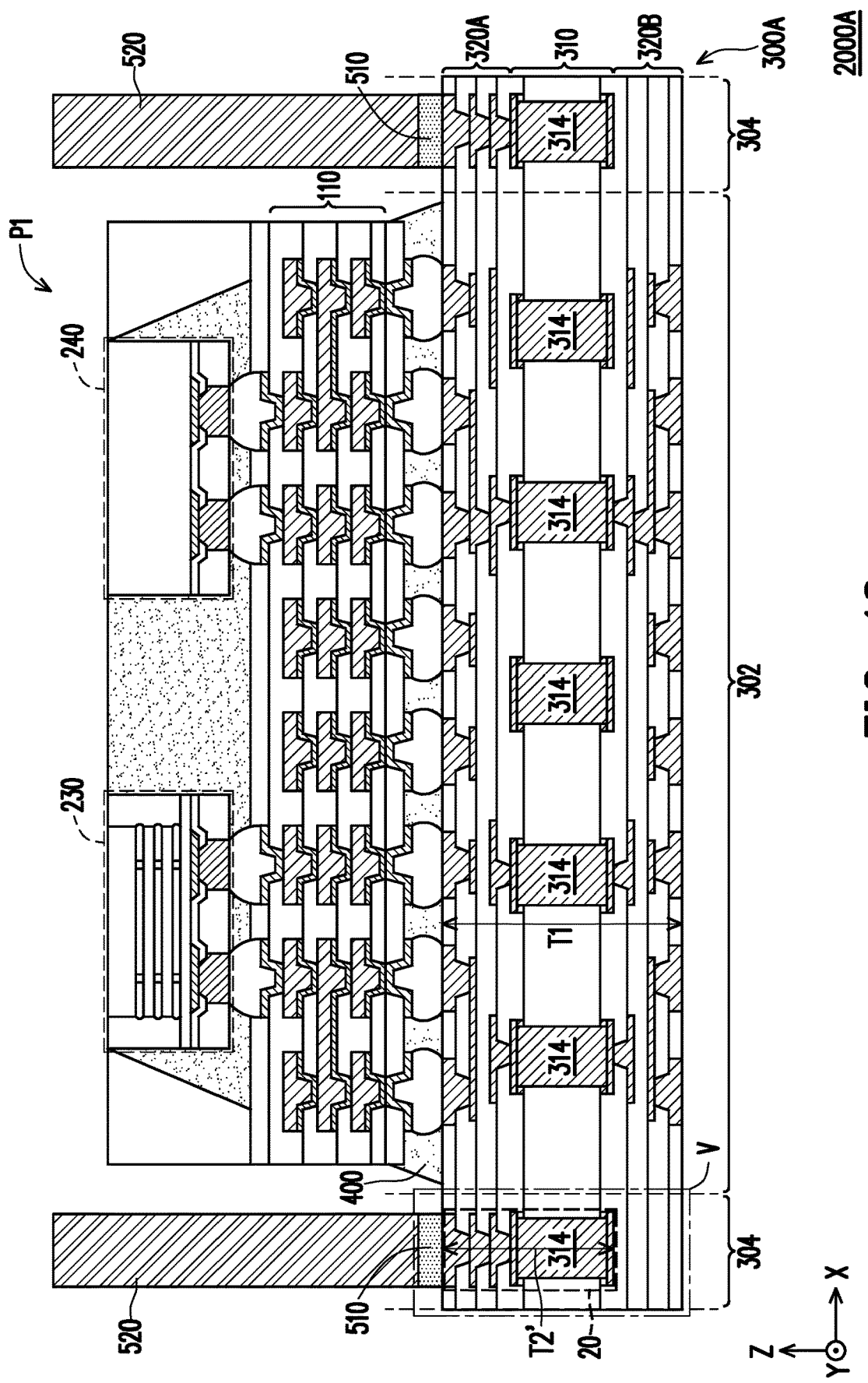
FIG. 18 is a schematic cross-sectional view showing a package structure in accordance with some embodiments of the disclosure.

FIG. 18 is a schematic cross-sectional view showing a package structure 2000A in accordance with some embodiments of the disclosure. FIG. 19A through FIG. 19D are schematic and enlarged cross-sectional views showing various embodiments of a supporting structure in a dashed area V outlined in FIG. 18 in accordance with some embodiments of the disclosure. FIG. 20 is a schematic cross-sectional view showing a package structure 2000B in accordance with alternative embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

In some embodiments, the package structure 2000A of FIG. 18 is similar to the package structure 1000A of FIGS. 14A and 14B; the difference is that, in the package structure 2000A, the supporting structure 10 is substituted with a supporting structure 20, where the supporting structure 20 includes a first portion 11 and a third portion 13 connecting to the first portion 11. In other words, the supporting structure 20 excludes the second portion 12 of the supporting structure 10. For example, the supporting structure 20 does not penetrate through the substrate 300A. As shown in FIG. 18, for example, a thickness T2' of the supporting structure 20 is less than the thickness T1 of the substrate 300A. In some embodiments, the supporting structure 20 penetrates through the routing portion 320A and the core portion 310, where the routing portion 320B is free from the supporting structure 20. The details of the first portion 11 and the third portion 13 of the supporting structure 20 are identical to the first portion 11 and the third portion 13 of the supporting structure 10 previously described in FIG. 12A, FIG. 12B and FIG. 16A, and the configuration of the supporting structure 20 and the ring structure 520 are the same as or similar to the configuration of the supporting structure 10 and the ring structure 520 previously described in FIG. 14A and FIG. 14B; thus are not repeat herein for brevity. In some embodiments, the width of the supporting structure 20 is substantially equal to the width of the ring structure 520. Alternatively, the width of the supporting structure 20 may be greater than or less than the width of the ring structure 520 as other alternatives.

Figure 19A:
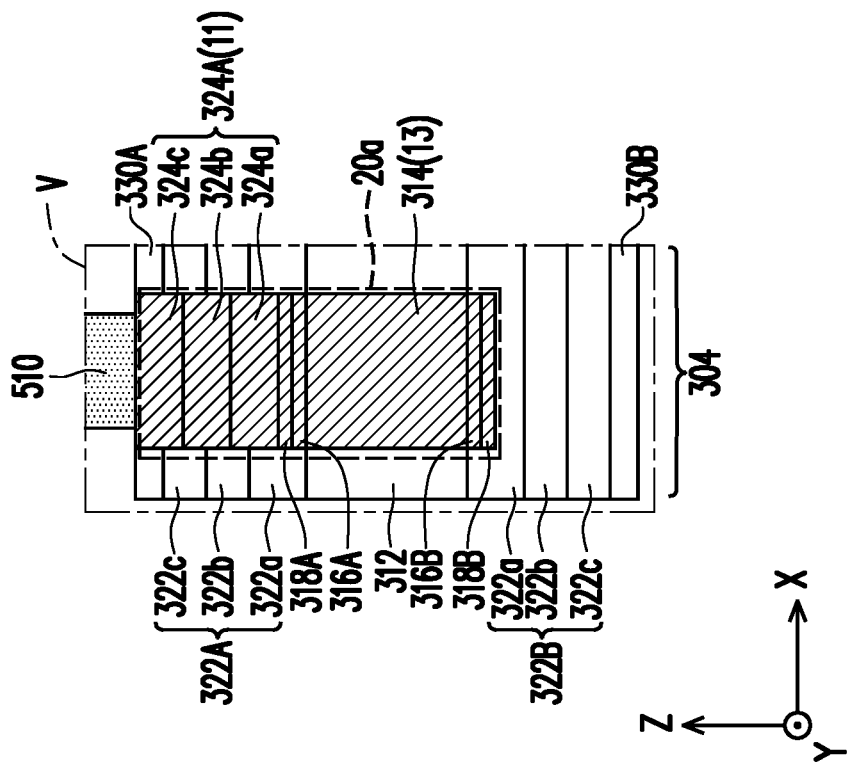
FIG. 19A through FIG. 19D are schematic and enlarged cross-sectional views showing various embodiments of a supporting structure in a dashed area V outlined in FIG. 18 in accordance with some embodiments of the disclosure.
Figure 19B:
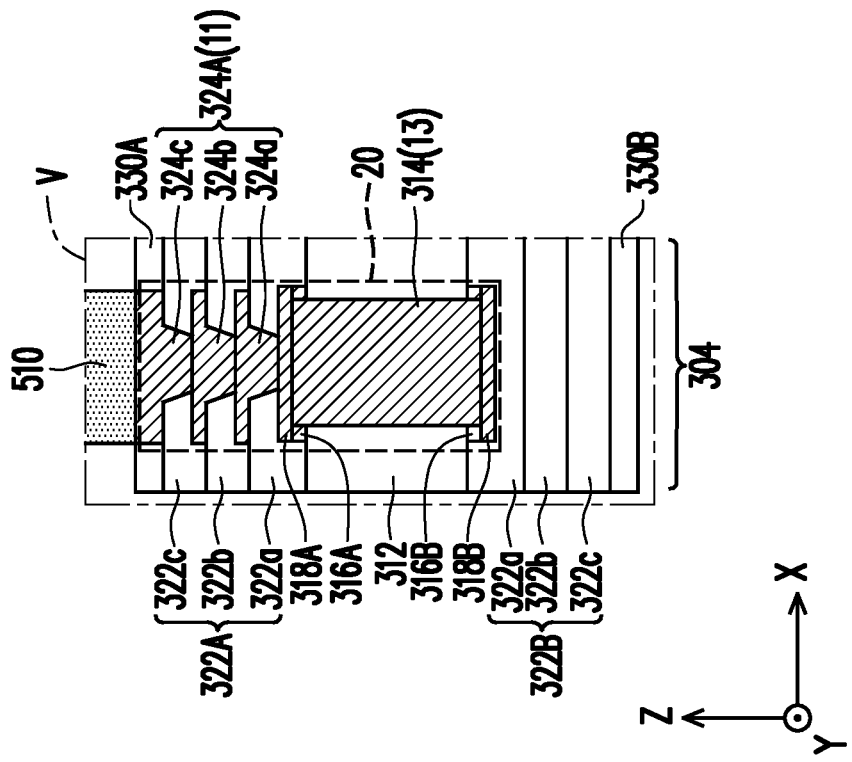
Figure 19C:
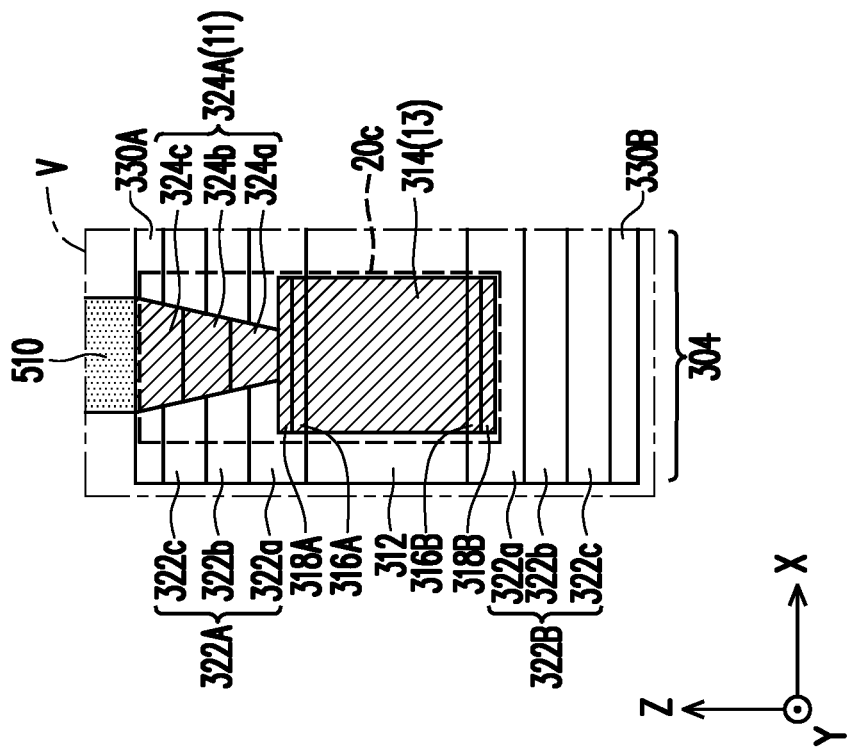
Figure 19D:
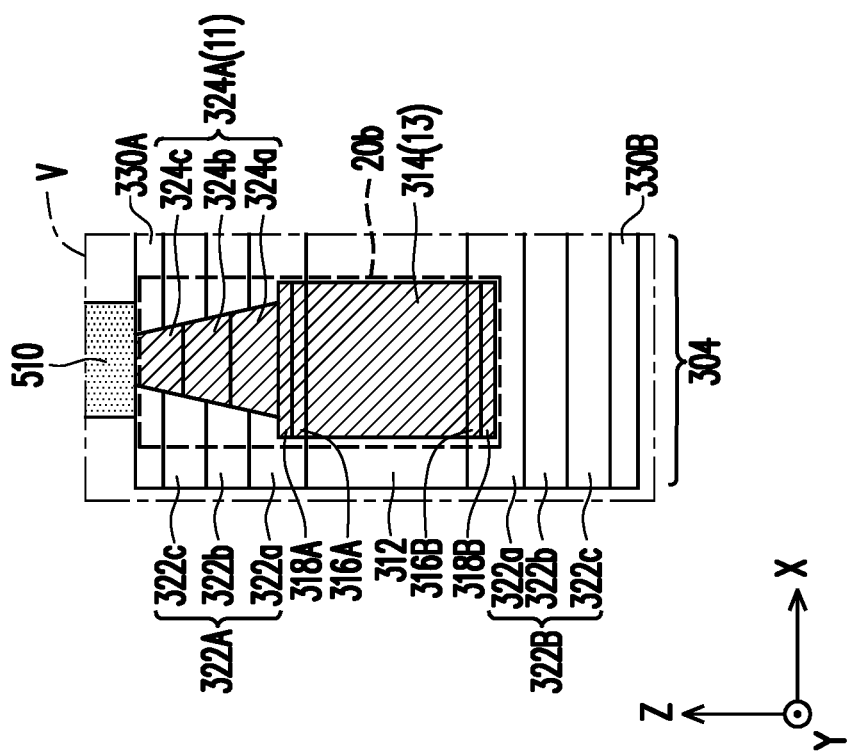
Figure 20:
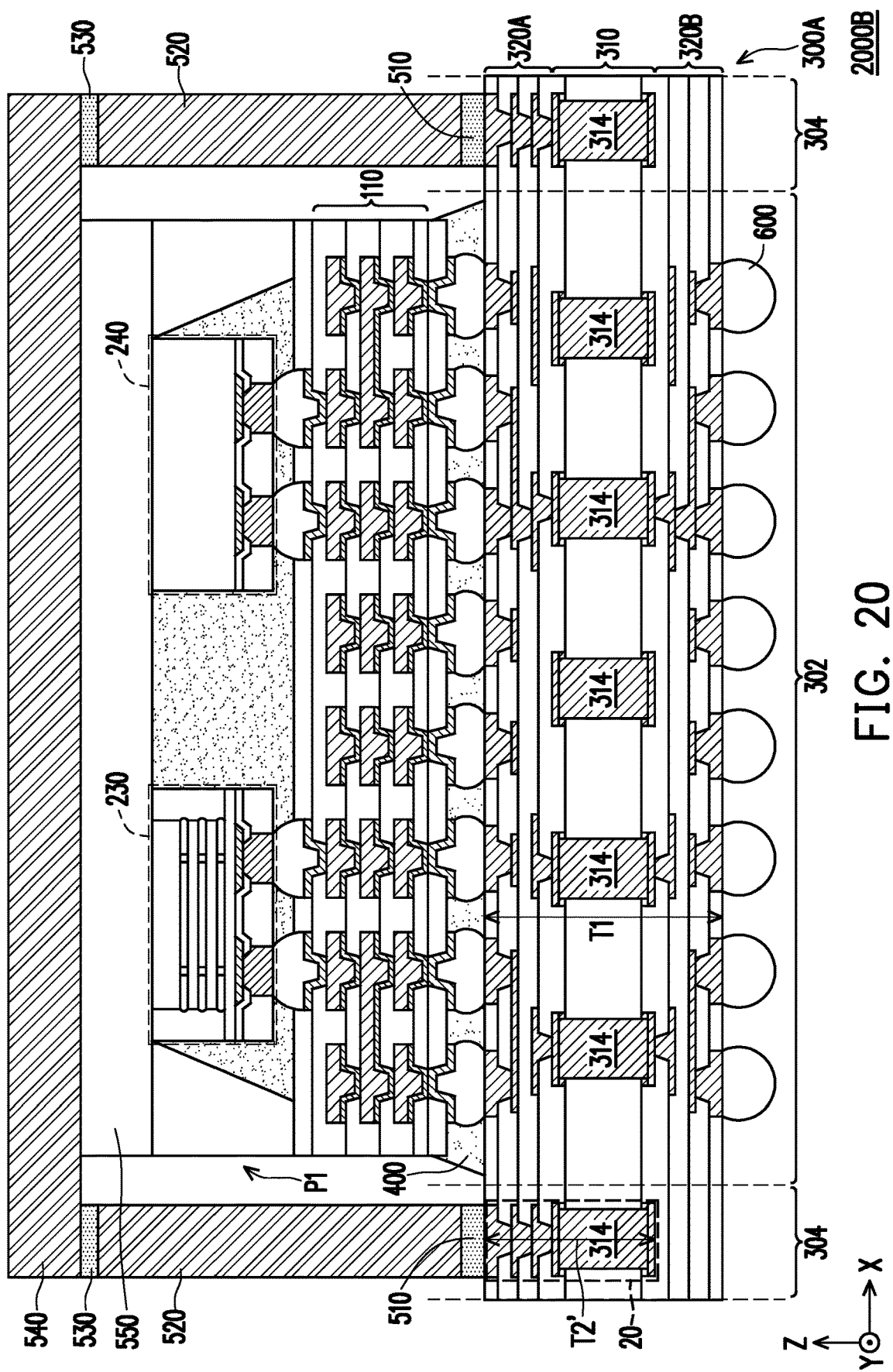
FIG. 20 is a schematic cross-sectional view showing a package structure in accordance with alternative embodiments of the disclosure.

Similar to the supporting structure 10, a sidewall of the supporting structure 20 is in a wave-shape form as shown in FIG. 18 and FIG. 19A, where the cross-section shape of the conductive layers 324a-324c included in the supporting structure 20 includes a T-shape. It is appreciated that the modifications to the supporting structure 10 may also be adopted by the supporting structure 20, see a supporting structure 20a of FIG. 19B, a supporting structure 20b of FIG. 19C, and a supporting structure 20c of FIG. 19D. For example, the supporting structure 20a of FIG. 19B includes a continuous and vertical sidewall, where the cross-section shape of the conductive layers 324a-324c included in the supporting structure 20a includes a rectangular shape. For other examples, the supporting structure 20b of FIG. 19C and the supporting structure 20c of FIG. 19D each include discontinuous and planar sidewalls, where the cross-section shape of the conductive layers 324a-324c in the first portion 11 included in the supporting structure 20b of FIG. 19C includes a trapezoid shape having a size gradually decreasing from the core portion 310 toward the solder resistor layer 330A, and the cross-section shape of the conductive layers 324a-324c in the first portion 11 included in the supporting structure 20c of FIG. 19D includes a trapezoid shape having a size gradually increasing from the core portion 310 toward the solder resistor layer 330A.

The disclosure is not limited thereto; other possible profiles or lateral width (in the cross-section view) may be adopted by the supporting structure 20 as long as the positioning location of the ring structure 520 is overlapped with the positioning location of the supporting structure 20.

In addition, a lid may be adopted for better heat dissipation. For example, the package structure 2000B of FIG. 20 and the package structure 2000A of FIG. 18 are similar; the difference is that, the package structure 2000B further includes an adhesive 530, a lid 540, a thermal interface material 550 and a plurality of conductive terminals 600. As shown in the package structure 2000B of FIG. 20, in some embodiments, the lid 540 is adhered to the ring structure 520 through the adhesive 530 and adhered to the semiconductor device P1 through the thermal interface material 550, and the conductive terminals 600 are connected to the substrate 300A opposite to the semiconductor device P1.

For example, the lid 540, the adhesive 530, the ring structure 520, the adhesive 510 and the substrate 300A together confine an accommodating space (not labeled) enclosing the semiconductor device P1. The lid 540 (or in combined with the ring structure 520 and the adhesive 530 therebetween together) may be referred to as the heat dissipating element of the package structure 2000B. Owing to such heat dissipating element, the heat dissipation of the semiconductor device P1 in the package structure 2000B is improved. In some embodiments, the lid 540, the adhesive 530, the ring structure 520 and the adhesive 510 together constitute an EMI shielding structure (which is electrically connected to the substrate 300A) for the semiconductor device P1. Owing to such EMI shielding structure, the impact caused by electromagnetic wave generated from other electronic elements located outside the package structure 2000B can be suppressed, thereby enhancing reliability and performance of the package structure 2000B.

Owing to the thermal interface material 550 thermally couples the lid 540 and the semiconductor device P1, the heat dissipation is further improved. However, the thermal interface material 550 may be omitted. In some embodiments, the conductive terminals 600 are used to physically and electrically connect the substrate 300A and/or the supporting structure 20 for further electrical connections to other devices, packages, connecting components, and the like. However, the thermal interface material 550 and/or the conductive terminals 600 may be omitted. The details, formation and material of the adhesive 530, the lid 540, the thermal interface material 550 and the conductive terminals 600 have described in FIG. 17, and thus are not repeated herein for simplicity. In alternative embodiments, the conductive terminals 600 may also be adopted in the package structure 2000A for further electrical connection to external components.

Figure 21:
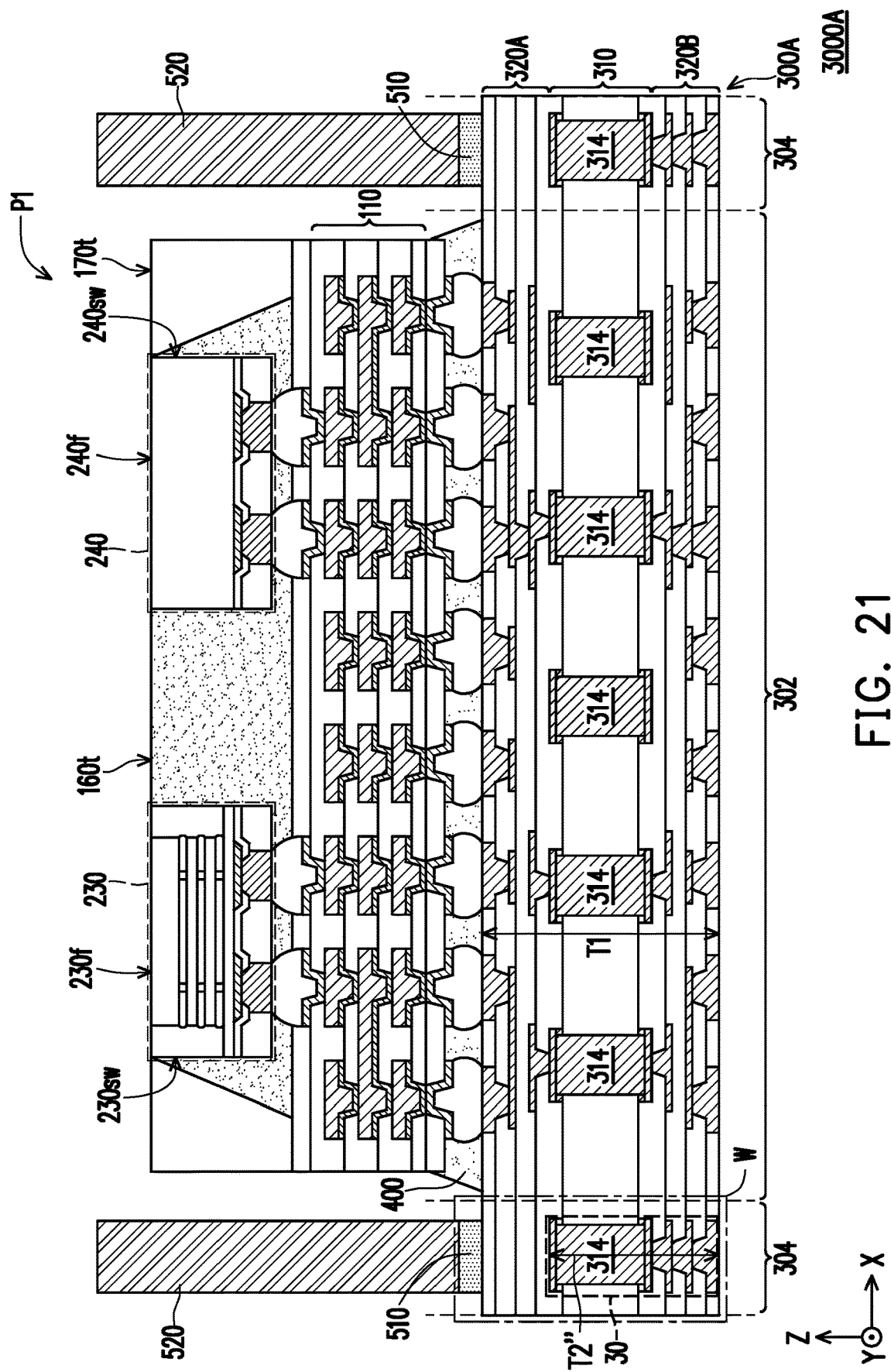
FIG. 21 is a schematic cross-sectional view showing a package structure in accordance with some embodiments of the disclosure.

FIG. 21 is a schematic cross-sectional view showing a package structure 3000A in accordance with some embodiments of the disclosure. FIG. 22A through FIG. 22D are schematic and enlarged cross-sectional views showing various embodiments of a supporting structure in a dashed area W outlined in FIG. 21 in accordance with some embodiments of the disclosure. FIG. 23 is a schematic cross-sectional view showing a package structure 3000B in accordance with alternative embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

In some embodiments, the package structure 3000A of FIG. 21 is similar to the package structure 1000A of FIGS. 14A and 14B; the difference is that, in the package structure 3000A, the supporting structure 10 is substituted with a supporting structure 30, where the supporting structure 30 includes a second portion 12 and a third portion 13 connecting to the second portion 12. In other words, the supporting structure 30 excludes the first portion 11 of the supporting structure 10. For example, the supporting structure 30 does not penetrate through the substrate 300A. As shown in FIG. 21, for example, a thickness T2" of the supporting structure 30 is less than the thickness T1 of the substrate 300A. In some embodiments, the supporting structure 30 penetrates through the routing portion 320B and the core portion 310, where the routing portion 320A is free from the supporting structure 30. The details of the second portion 12 and the third portion 13 of the supporting structure 30 are identical to the second portion 12 and the third portion 13 of the supporting structure 10 previously described in FIG. 12A, FIG. 12B and FIG. 16A, and the configuration of the supporting structure 30 and the ring structure 520 are the same as or similar to the configuration of the supporting structure 10 and the ring structure 520 previously described in FIG. 14A and FIG. 14B; thus are not repeat herein for brevity. In some embodiments, the width of the supporting structure 30 is substantially equal to the width of the ring structure 520. Alternatively, the width of the supporting structure 30 may be greater than or less than the width of the ring structure 520 as other alternatives.

Figure 22A:
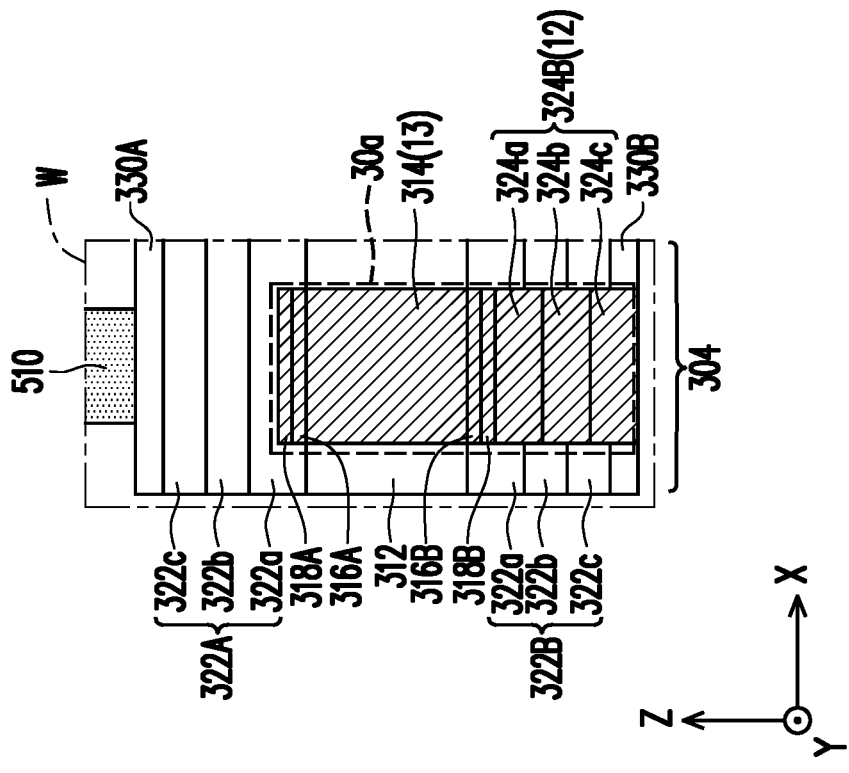
FIG. 22A through FIG. 22D are schematic and enlarged cross-sectional views showing various embodiments of a supporting structure in a dashed area W outlined in FIG. 21 in accordance with some embodiments of the disclosure.
Figure 22B:
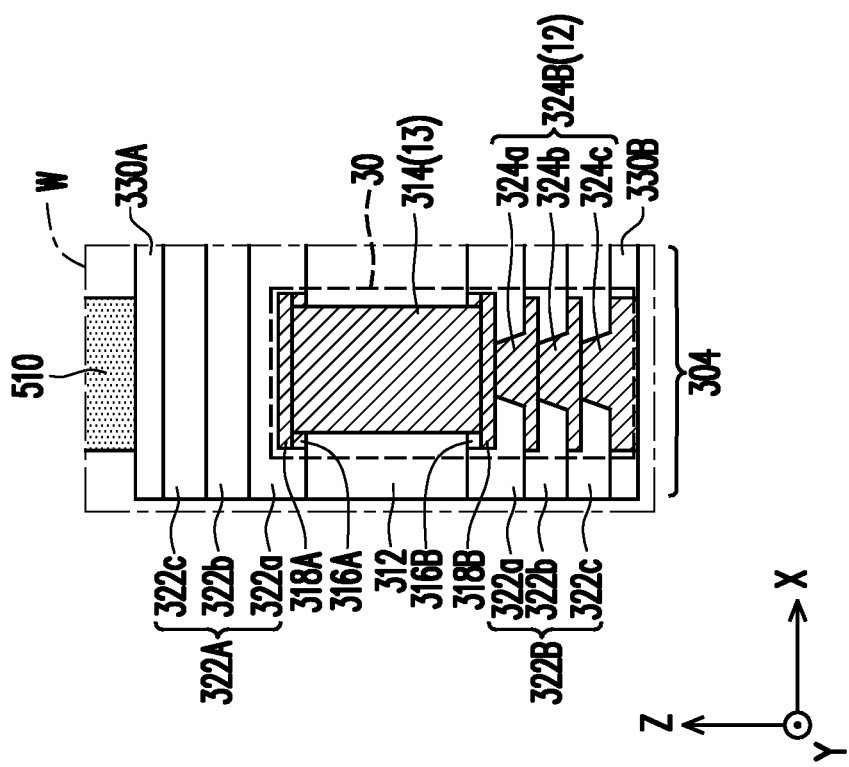
Figure 22D:
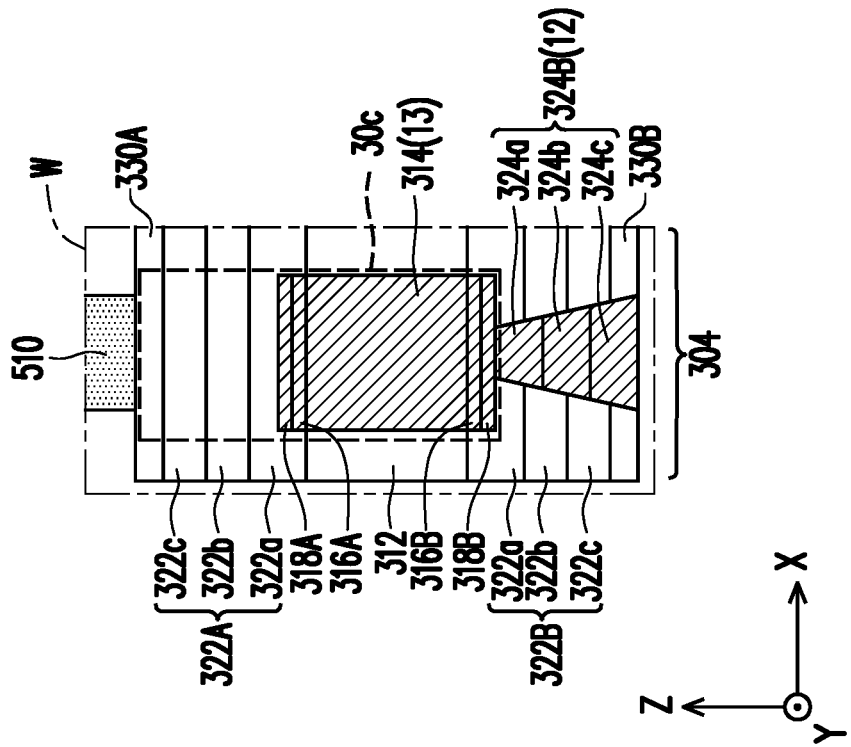
Figure 22C:
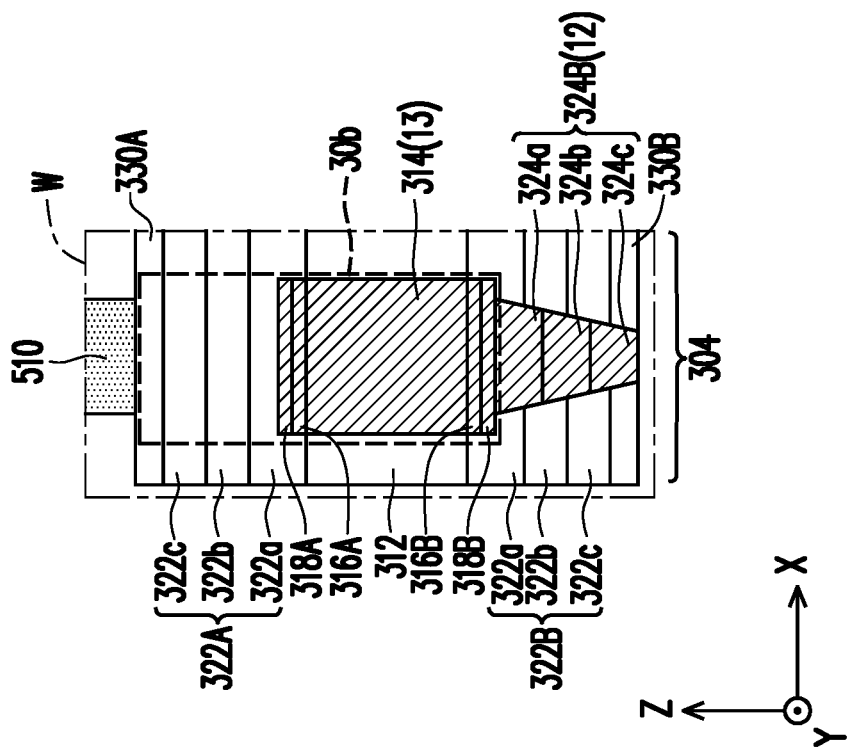
Figure 23:
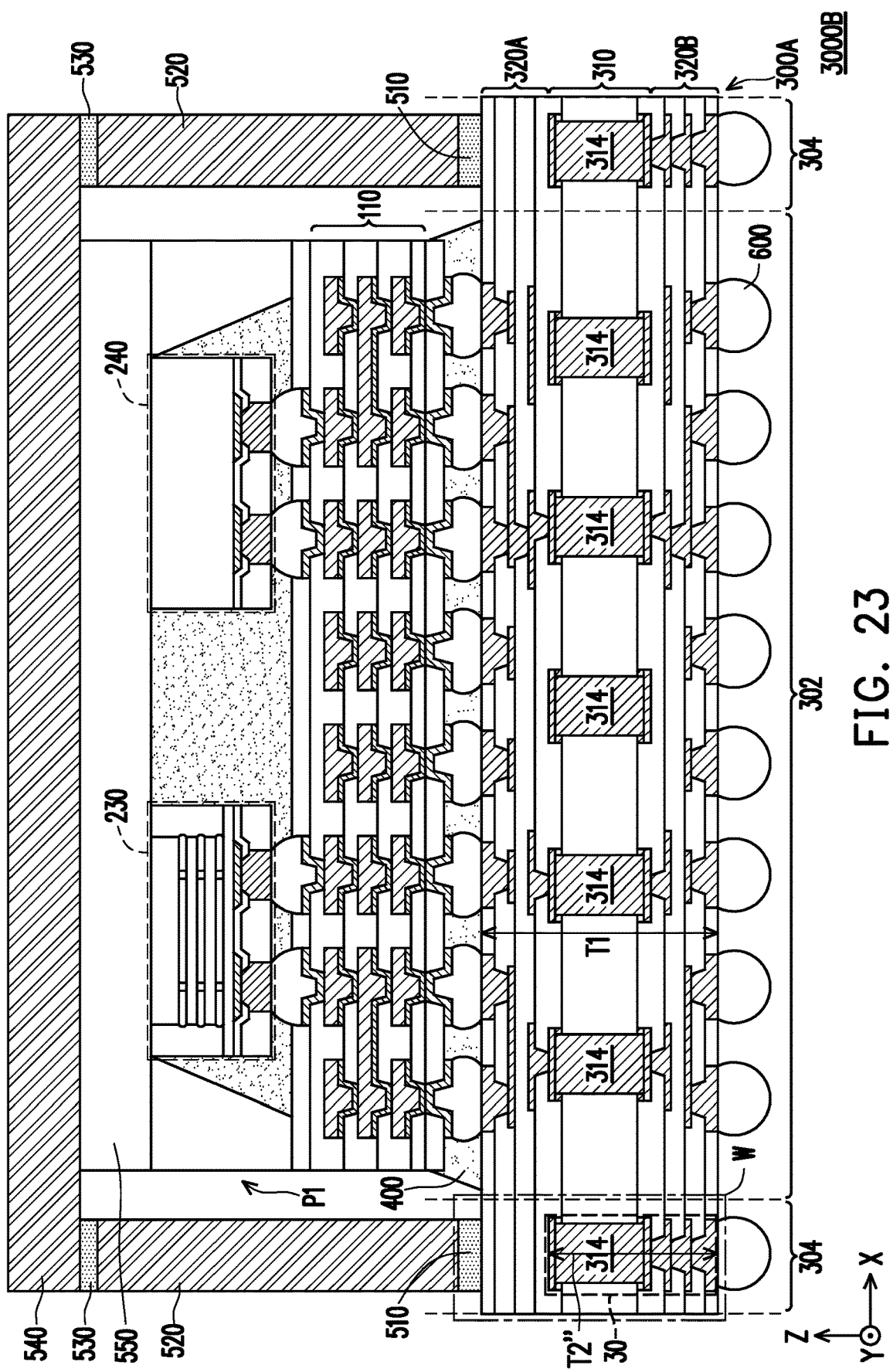
FIG. 23 is a schematic cross-sectional view showing a package structure in accordance with alternative embodiments of the disclosure.

Similar to the supporting structure 10, a sidewall of the supporting structure 30 is in a wave-shape form as shown in FIG. 21 and FIG. 22A, where the cross-section shape of the conductive layers 324a-324c included in the supporting structure 30 includes a T-shape. It is appreciated that the modifications to the supporting structure 10 may also be adopted by the supporting structure 30, see a supporting structure 30a of FIG. 22B, a supporting structure 30b of FIG. 22C, and a supporting structure 30c of FIG. 22D. For example, the supporting structure 30a of FIG. 22B includes a continuous and vertical sidewall, where the cross-section shape of the conductive layers 324a-324c included in the supporting structure 30a includes a rectangular shape. For other examples, the supporting structure 30b of FIG. 22C and the supporting structure 30c of FIG. 22D each include discontinuous and planar sidewalls, where the cross-section shape of the conductive layers 324a-324c in the second portion 12 included in the supporting structure 30b of FIG. 22C includes a trapezoid shape having a size gradually decreasing from the core portion 310 toward the solder resistor layer 330B, and the cross-section shape of the conductive layers 324a-324c in the second portion 12 included in the supporting structure 30c of FIG. 22D includes a trapezoid shape having a size gradually increasing from the core portion 310 toward the solder resistor layer 330B. The disclosure is not limited thereto; other possible profiles or lateral width (in the cross-sectional view) may be adopted by the supporting structure 30 as long as the positioning location of the ring structure 520 is overlapped with the positioning location of the supporting structure 30.

In addition, a lid may be adopted for better heat dissipation. For example, the package structure 3000B of FIG. 23 and the package structure 3000A of FIG. 21 are similar; the difference is that, the package structure 3000B further includes an adhesive 530, a lid 540, a thermal interface material 550 and a plurality of conductive terminals 600. As shown in the package structure 3000B of FIG. 22, in some embodiments, the lid 540 is adhered to the ring structure 520 through the adhesive 530 and adhered to the semiconductor device P1 through the thermal interface material 550, and the conductive terminals 600 are connected to the substrate 300A opposite to the semiconductor device P1 for further electrical connection to external components. In some alternative embodiments, the thermal interface material 550 and/or the conductive terminals 600 may be omitted. The details, formation and material of the adhesive 530, the lid 540, the thermal interface material 550 and the conductive terminals 600 have described in FIG. 17, and thus are not repeated herein for simplicity. In other alternative embodiments, the conductive terminals 600 may also be adopted in the package structure 3000A.

Figure 24A:
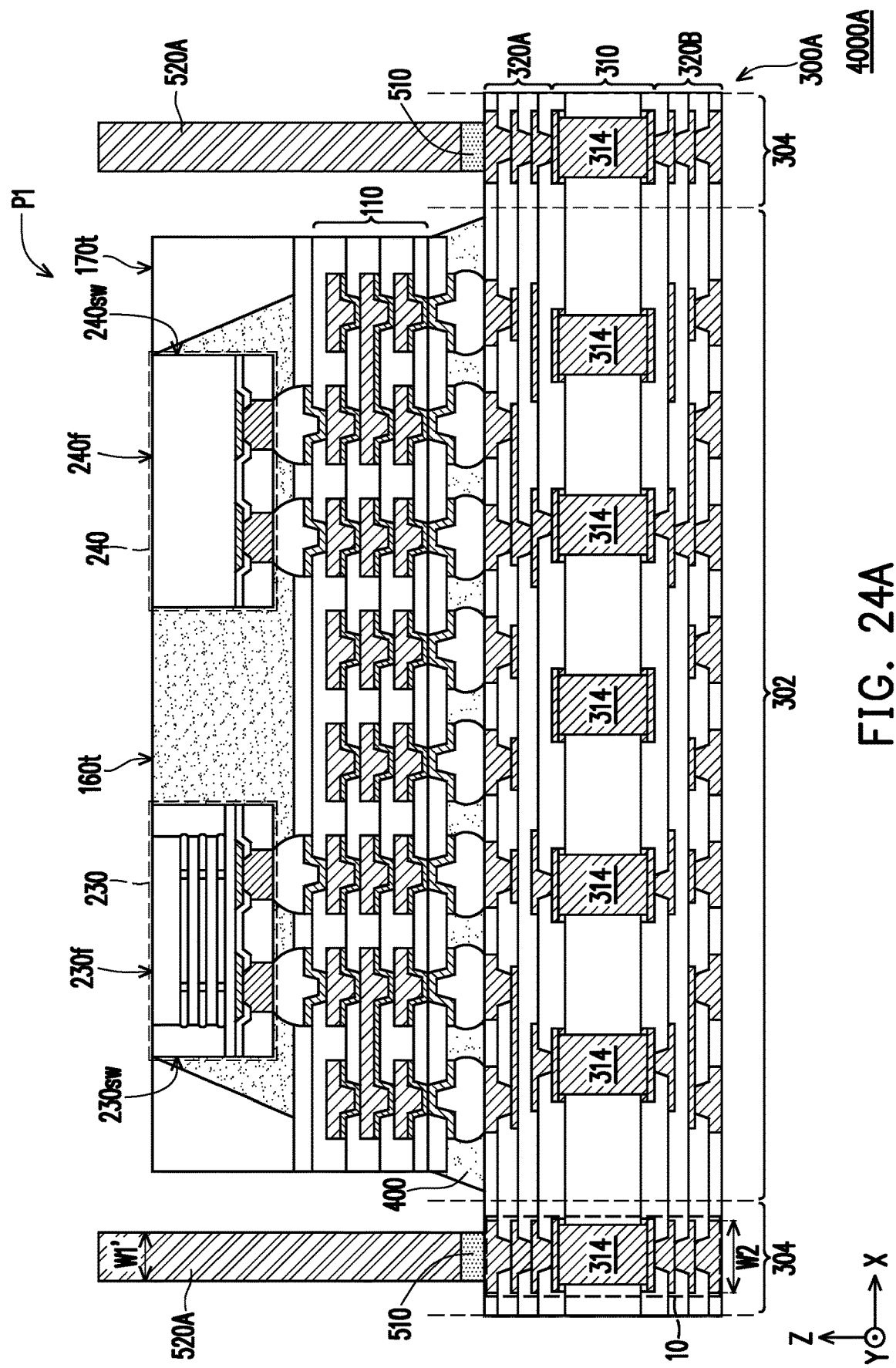
FIG. 24A is a schematic cross-sectional view showing a package structure in accordance with some embodiments of the disclosure.
Figure 24B:
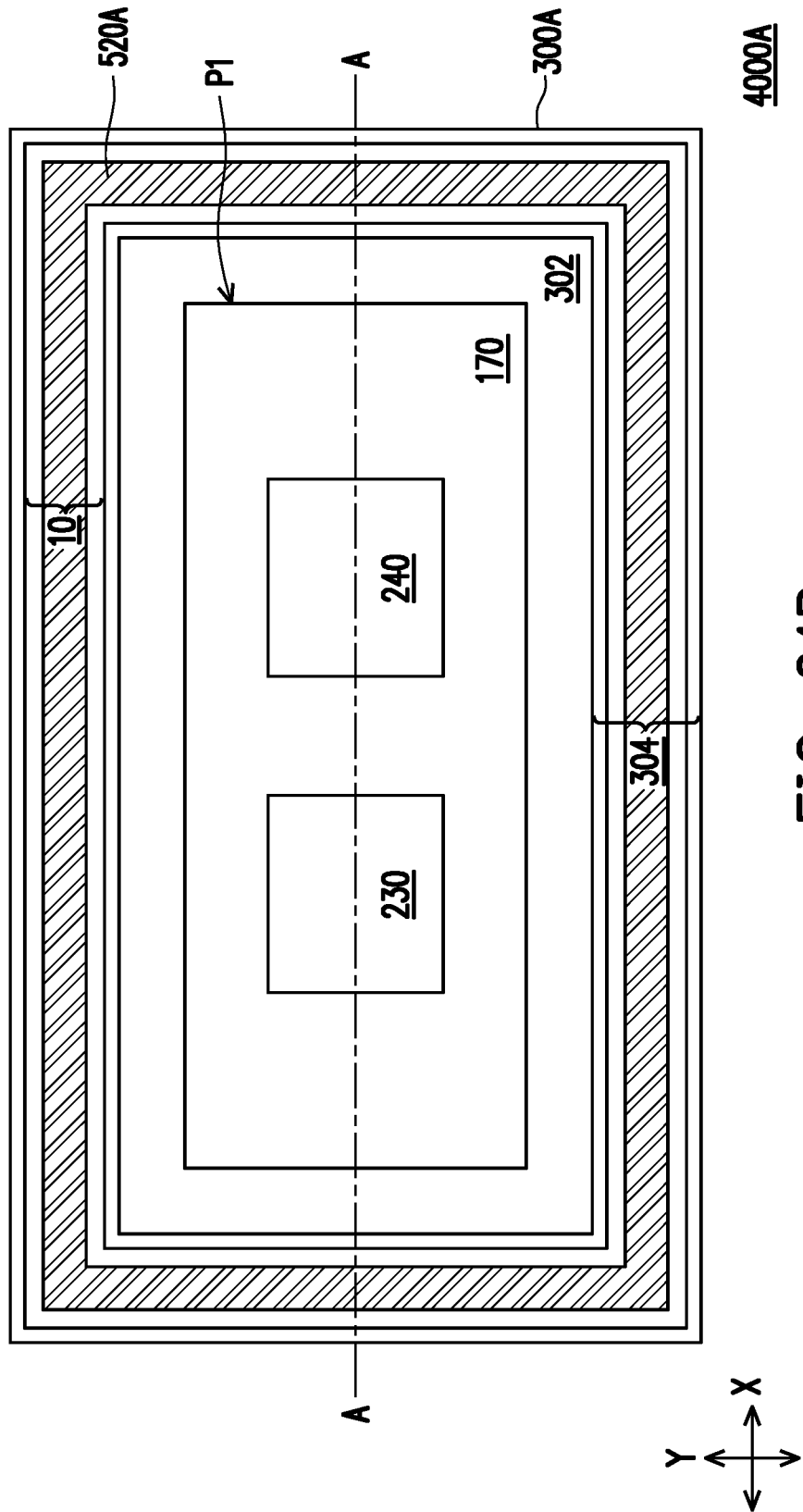
FIG. 24B is a schematic plane view showing the package structure depicted in FIG. 24A.
Figure 25:
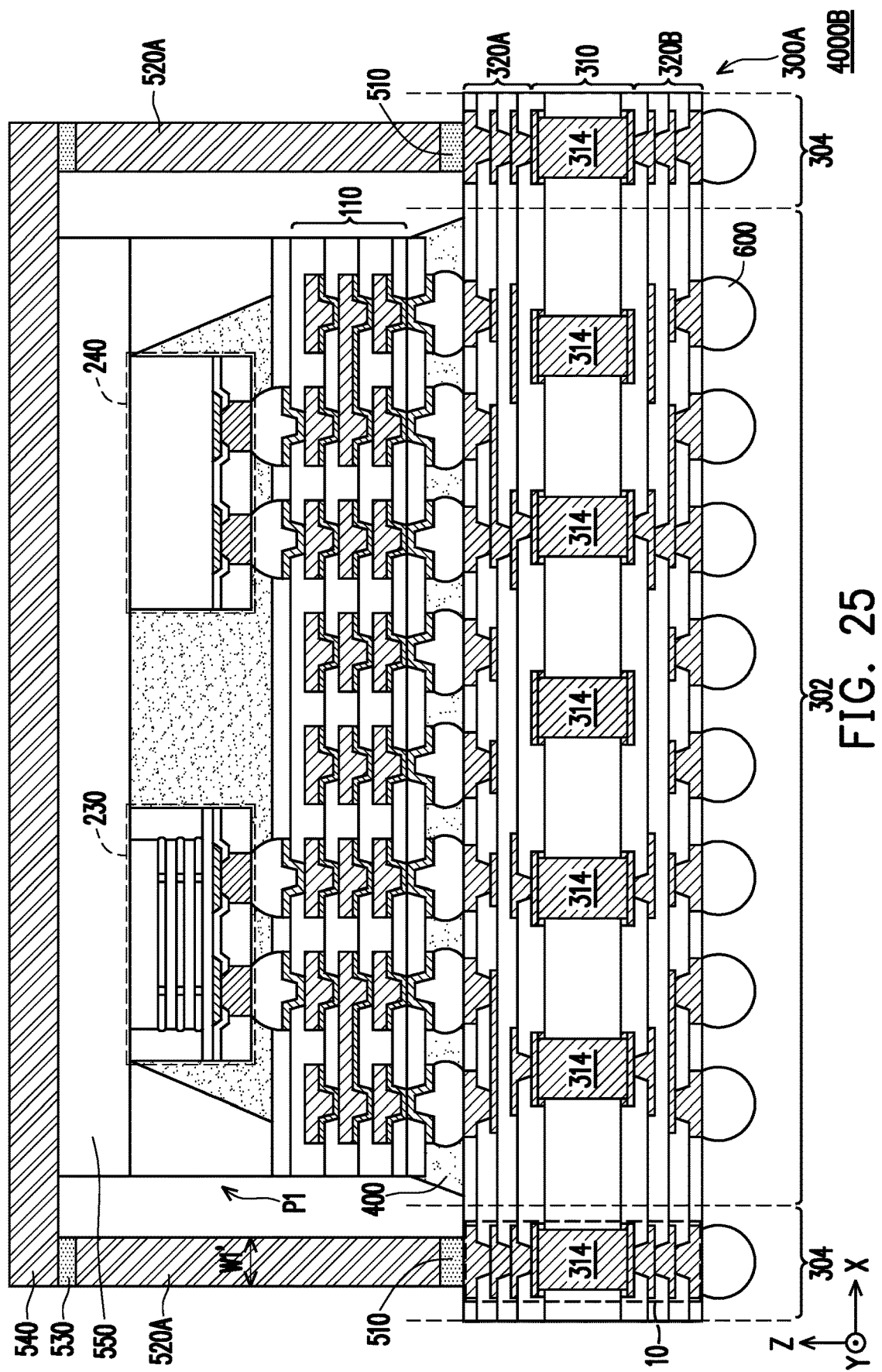
FIG. 25 is a schematic cross-sectional view showing a package structure in accordance with alternative embodiments of the disclosure.
Figure 26A:
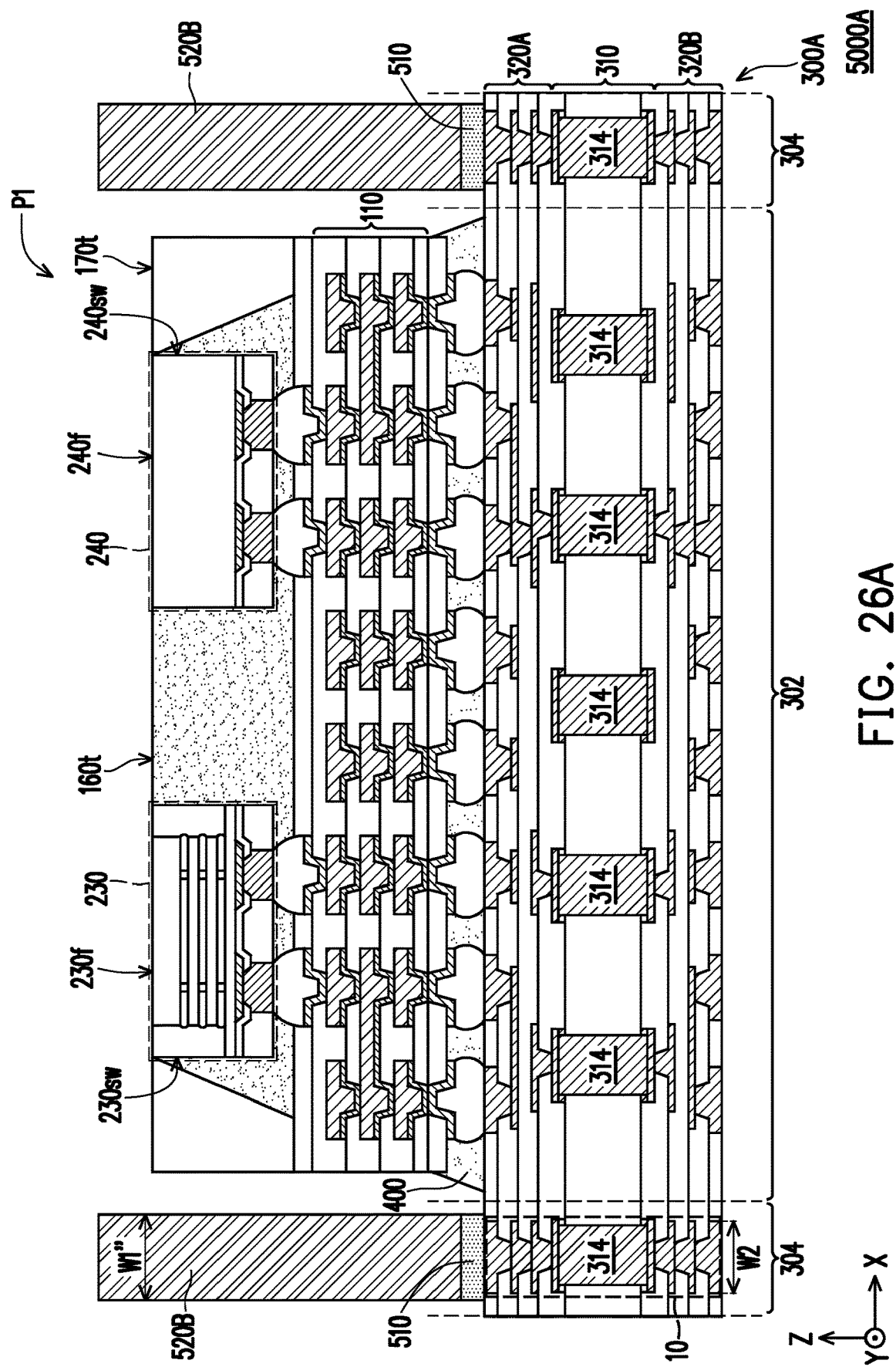
FIG. 26A is a schematic cross-sectional view showing a package structure in accordance with some embodiments of the disclosure.
Figure 26B:
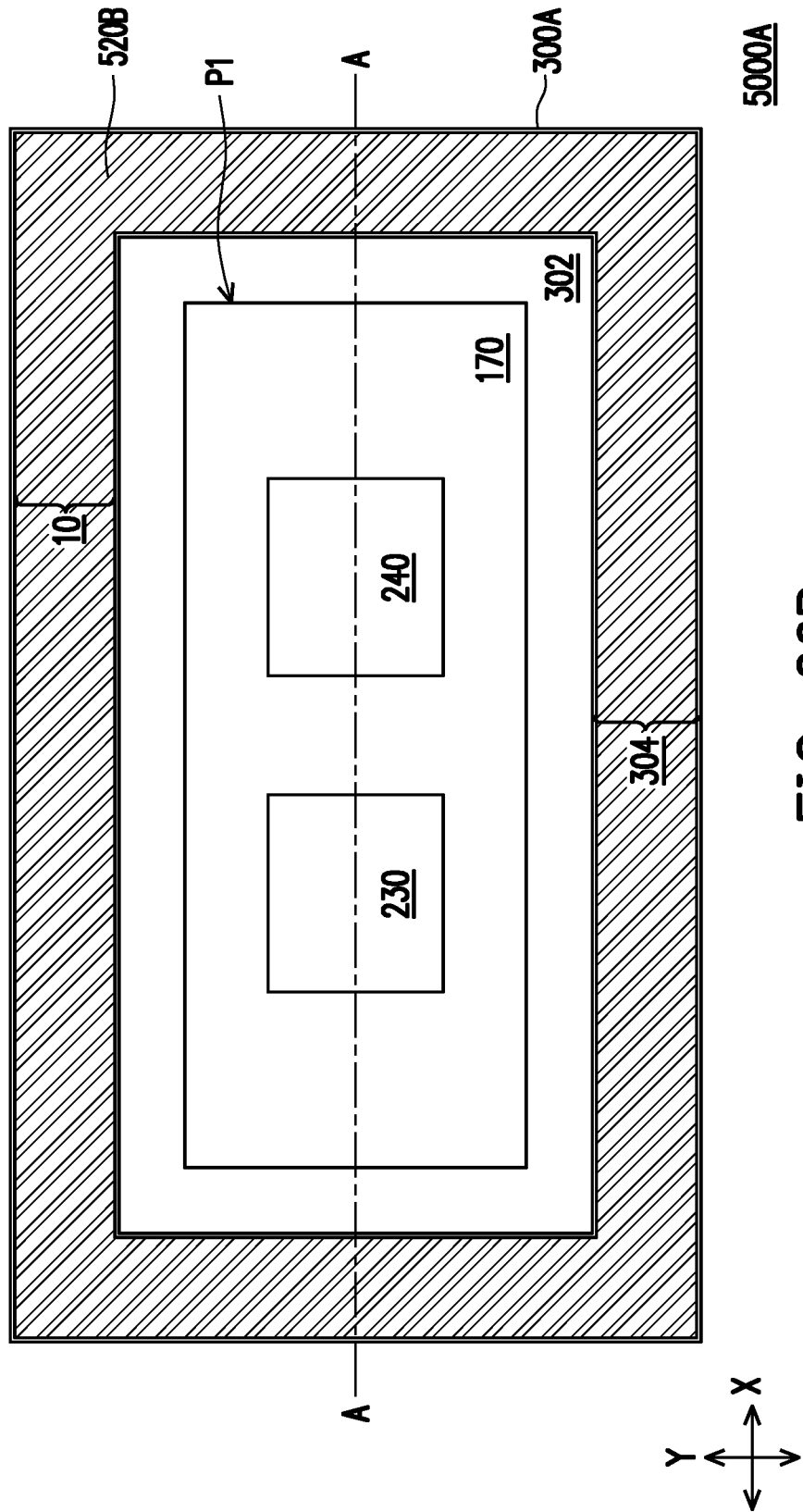
FIG. 26B is a schematic plane view showing the package structure depicted in FIG. 26A.
Figure 27:
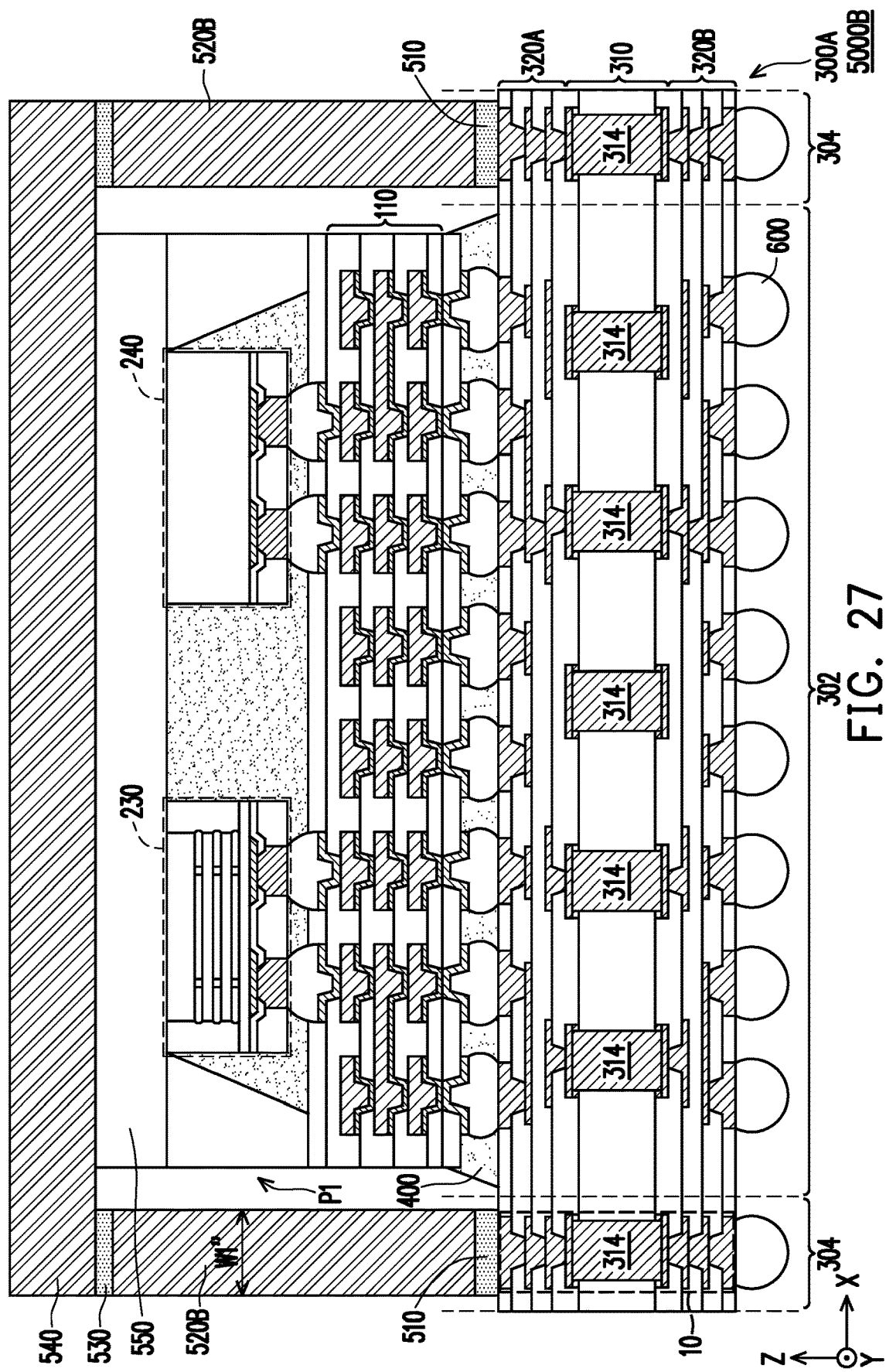
FIG. 27 is a schematic cross-sectional view showing a package structure in accordance with alternative embodiments of the disclosure.

In alternative embodiments, the width of the supporting structure in the disclosure can be greater than or less than the width of the ring structure. FIG. 24A and FIG. 24B are a schematic cross-sectional view and a schematic plane view of a package structure 4000A, and FIG. 25 is a schematic cross-sectional view of a package structure 4000B, in various embodiments. FIG. 26A and FIG. 26B are a schematic cross-sectional view and a schematic plane view of a package structure 5000A, and FIG. 27 is a schematic cross-sectional view of a package structure 5000B, in various embodiments. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

In some embodiments, the package structure 4000A of FIG. 24A and FIG. 24B is similar to the package structure 1000A of FIGS. 14A and 14B; the difference is that, in the package structure 4000A, the ring structure 520 is substituted with a ring structure 520A, where a width W1' of the ring structure 520 is less than the width W2 of the supporting structure 10. In some embodiments, the positioning location of the ring structure 520A completely overlaps with (e.g. completely falls within) the positioning location of the supporting structure 10 in the vertical projection on the substrate 300A along the direction Z. In addition, a lid (e.g. 540) may be adopted for better heat dissipation and a plurality of conductive terminals (e.g. 600) may be adopted for further electrical connection to the external components, see the package structure 4000B of FIG. 25. In other alternative embodiments, the conductive terminals (e.g. 600) may also be adopted in the package structure 3000A.

In some embodiments, the package structure 5000A of FIG. 26A and FIG. 26B is similar to the package structure 1000A of FIGS. 14A and 14B; the difference is that, in the package structure 5000A, the ring structure 520 is substituted with a ring structure 520B, where a width W1" of the ring structure 520 is greater than the width W2 of the supporting structure 10. In some embodiments, the positioning location of the supporting structure 10 completely overlaps with (e.g. completely falls within) the positioning location of the ring structure 520A in the vertical projection on the substrate 300A along the direction Z. In addition, a lid may be adopted for better heat dissipation and a plurality of conductive terminals (e.g. 600) may be adopted for further electrical connection to the external components, see the package structure 5000B of FIG. 27. In other alternative embodiments, the conductive terminals (e.g. 600) may also be adopted in the package structure 5000A.

Alternatively, the width of the ring structure 520 may be remained the same while the width of the supporting structure 520 can be modified (such as reduced width or an increased width as compared to the width W2), as long as the positioning location of the ring structure 520 is overlapped with the positioning location of the supporting structure 10. The disclosure is not limited thereto.

Figure 29:
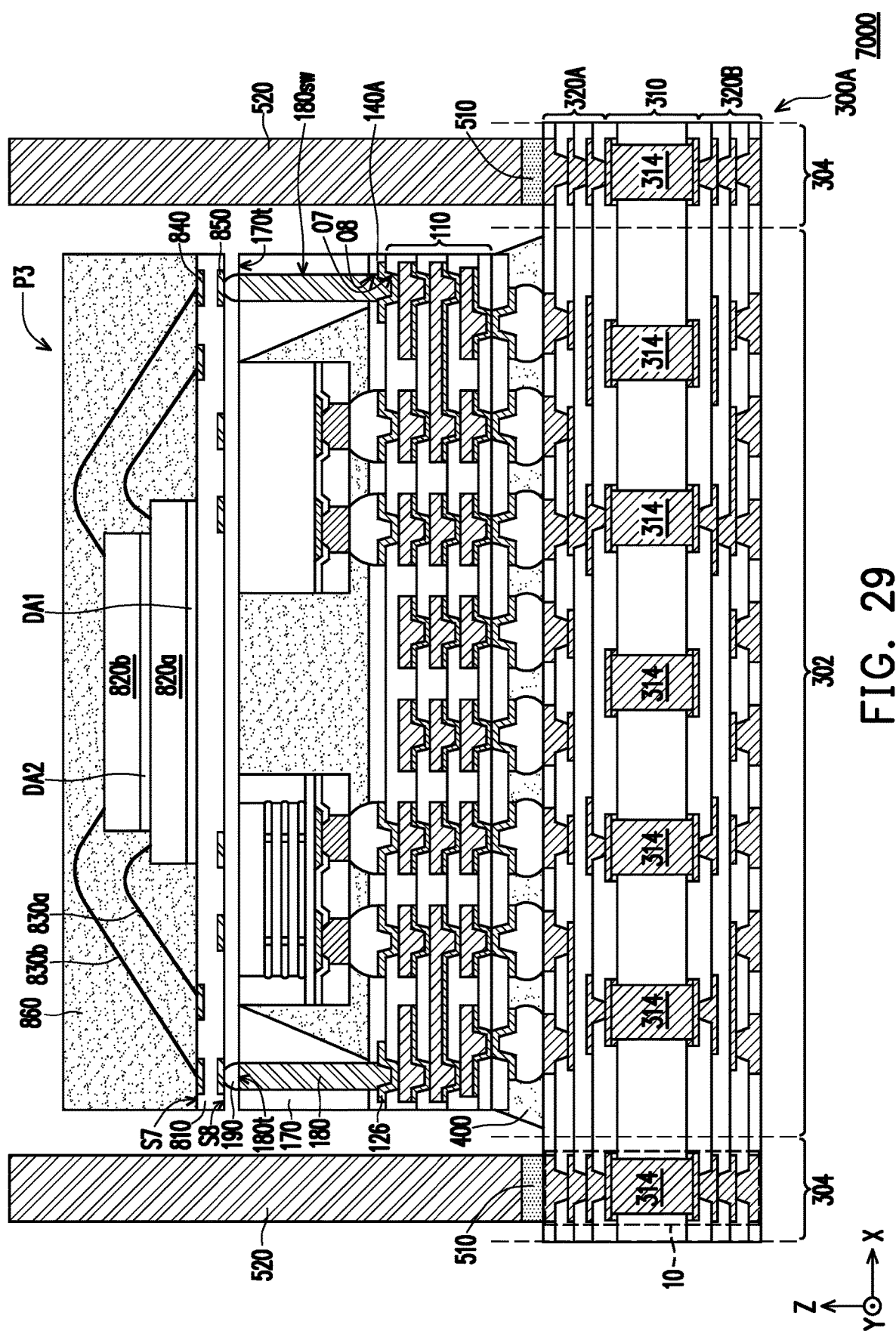
FIG. 29 is a schematic cross-sectional view showing a package structure in accordance with some embodiments of the disclosure.

FIG. 29 is a schematic cross-sectional view showing a package structure 7000 in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. In some embodiments, the package structure 7000 of FIG. 29 is similar to the package structure 1000A of FIGS. 14A and 14B; the difference is that, in the package structure 7000, the semiconductor device P1 is substituted with a semiconductor device P3. The semiconductor device P3 is similar to the semiconductor device P1, except that, the semiconductor device P3 further includes a plurality of conductive pillars 180 and a plurality of conductive terminals 190 are included and encapsulated in the insulating encapsulation 170 to electrically connect the semiconductor dies 230 and 240 and a package 800.

Referring to FIG. 29, in some embodiments, the conductive pillars 180 are formed on the redistribution circuit structure 110 (e.g. on the side where the outermost surface S110t located at). In some embodiments, the conductive pillars 180 may be through integrated fan-out (InFO) vias.

As shown in FIG. 29, the conductive pillars 180 are physically connected to the metallization layer ML3 of the redistribution circuit structure 110 through UBM patterns 126 formed on the dielectric layer 118 and extending into openings O7 formed in the dielectric layer 118, so that the conductive pillars 180 are electrically connected to the redistribution circuit structure 110. In some embodiments, the UBM patterns 126 are exposed by the passivation layer 140A through openings O8 formed therein. The formation and material of the UBM patterns 126 are similar to or the same as the formation and material of the UBM patterns 122 as described in FIG. 3, the formations of the openings O7 and O8 are respectively similar to or the same as the formations of the openings O4 and O5 as described in FIG. 1 through FIG. 4, and thus are not repeated herein. In some embodiments, the conductive pillars 180 are arranged aside of the semiconductor dies 230 and 240 and are located along the periphery of the semiconductor device P3. The number of the conductive pillars 180 is not limited to the drawing of FIG. 29, and may be adjusted by changing the number of the openings O7 and O8 based on the demand and design requirement.

In some embodiments, the conductive pillars 180 are formed by photolithography, plating, photoresist stripping processes or any other suitable method. For example, the plating process may include an electroplating plating, an electroless plating, or the like. For example, the conductive pillars 180 may be formed by forming a mask pattern (not shown) covering the redistribution circuit structure 110 with openings exposing the UBM patterns 126 exposed by the openings O8 formed in the passivation layer 140A, forming a metallic material filling the openings formed in the mask pattern and the openings O8 to form the conductive pillars 180 by electroplating or deposition, and then removing the mask pattern. In one embodiment, the mask pattern may be removed by acceptable ashing process and/or photoresist stripping process, such as using an oxygen plasma or the like. In some embodiments, the material of the conductive pillars 180 may include a metal material such as copper or copper alloys, or the like.

However, the disclosure is not limited thereto. In alternative embodiments, the conductive pillars 180 may be pre-fabricated conductive pillars which may be disposed on the redistribution circuit structure 110 by picking-and-placing. Alternatively, the UBM patterns 126 may be omitted.

Thereafter, in some embodiments, a plurality of conductive terminals 190 are formed on the surfaces 180t of the conductive pillars 180, respectively. For example, the conductive terminals 190 are bonded to the conductive pillars 180 through soldering process. The materials of the conductive terminals 190 may include solder balls or BGA balls. In some embodiments, as shown in FIG. 29, the conductive terminals 190 are electrically connected to the redistribution circuit structure 110 through the conductive pillars 180 and the UBM patterns 126. That is, for example, some of the conductive terminals 190 are electrically connected to the semiconductor die 230 through the redistribution circuit structure 110, the respective conductive pillars 180 and the respective UBM patterns 126, and some of the conductive terminals 190 are electrically connected to the semiconductor die 240 through the redistribution circuit structure 110, the respective conductive pillars 180 and the respective UBM patterns 126.

In some embodiments, the conductive pillars 180 are formed on the redistribution circuit structure 110 before disposing the semiconductor dies 230 and 240 over the redistribution circuit structure 110. In alternative embodiments, the conductive pillars 180 are formed on the redistribution circuit structure 110 after disposing the semiconductor dies 230 and 240 over the redistribution circuit structure 110. In some embodiments, the insulating encapsulation 170 is formed by transfer or compression molding process followed by a CMP process, such that surfaces 180*t* of the conductive pillars 180 are substantially coplanar to the surface 170*t* of the insulating encapsulation 170, as shown in FIG. 29.

As illustrated in FIG. 29, for example, the conductive pillars 180 are embedded inside the insulating encapsulation 170, where the conductive terminals 190 are disposed on the surfaces 180*t* of the conductive pillars 180 exposed by the insulating encapsulation 170. In some embodiments, the underfill material 160, the conductive pillars 180 and the semiconductor dies 230, 240 are encapsulated in the insulating encapsulation 170, where the surface 160*t* of the underfill material 160, the surfaces 180*t* of the conductive pillars 180, the backside surface 230*f* of the semiconductor dies 230, the backside surface 240*f* of the semiconductor dies 240 are substantially levelled with and coplanar to (e.g. accessibly revealed by) the surface 170*t* of the insulating encapsulation 170.

In some embodiments, the package 800 is provided and bonded to the conductive pillars 180 through the conductive terminals 190 exposed by the insulating encapsulation 170 for forming the semiconductor device P3. In some embodiments, the package 800 has a substrate 810, semiconductor dies 820*a* and 820*b*, bonding wires 830*a* and 830*b*, conductive pads 840, conductive pads 850, an insulating encapsulation 860, and the joining solder balls (not shown). As shown in FIG. 29, for example, the semiconductor die 820*a* with a connecting film DA1 disposed thereon and the semiconductor die 820*b* with a connecting film DA2 are provided and are disposed on the substrate 810. In some embodiments, the connecting film DA1 is located between the semiconductor die 820*a* and the substrate 810, and the connecting film DA2 is located between the semiconductor die 820*a* and the semiconductor die 820*b*. In some embodiments, due to the connecting films DA1 and DA2 respectively provided between the semiconductor die 820*a* and the substrate 810 and between the semiconductor dies 820*a* and 820*b*, the semiconductor dies 820*a*, 820*b* are stably adhered to the substrate 810. In some embodiments, the connecting films DA1, DA2 may be, for example, a die attach film, a layer made of adhesives or epoxy resin, or the like.

For example, the semiconductor dies 820*a* and 820*b* are mounted on a side (e.g. a surface S7) of the substrate 810. In some embodiments, the semiconductor dies 820*a* and 820*b* may be logic chips (e.g., central processing units, microcontrollers, etc.), memory chips (e.g., dynamic random access memory (DRAM) chips, static random access memory (SRAM) chips, etc.), power management chips (e.g., power management integrated circuit (PMIC) chips), radio frequency (RF) chips, sensor chips, signal processing chips (e.g., digital signal processing (DSP) chips), front-end chips (e.g., analog front-end (AFE) chips, the like, or a combination thereof). The semiconductor dies 820*a* and 820*b* are DRAM chips, as shown in FIG. 29, for example. In one embodiment, the semiconductor dies 820*a* and 820*b* may be the same. However, the disclosure is not limited thereto; in an alternative embodiment, the semiconductor dies 820*a* and 820*b* may be different from each other. The number of each of the semiconductor dies 820*a* and 820*b* may be one or more than one, the disclosure is not specifically limited thereto.

In some embodiments, the bonding wires 830*a* and 830*b* are respectively used to provide electrical connections between the semiconductor dies 820*a*, 820*b* and some of the conductive pads 840 (such as bonding pads) located on the surface S7 of the substrate 810. Owing to the bonding wires 830*a* and 830*b*, the semiconductor dies 820*a* and 820*b* are electrically connected to the substrate 810.

In some embodiments, the insulating encapsulation 860 is formed on the surface S7 of the substrate 810 to encapsulate the semiconductor dies 820*a*, 820*b*, the bonding wires 830*a*, 830*b*, and the conductive pads 840 to protect these components. In some embodiments, the material of the insulating encapsulation 860 is the same as the insulating encapsulation 170*m*/170 or the encapsulation 235, and thus is not repeated herein. In one embodiment, the material of the insulating encapsulation 860 is different from the insulating encapsulation 170*m*/170 or the encapsulation 235, the disclosure is not limited thereto.

In some embodiments, interconnects (not shown) or through insulator vias (not shown) embedded in the substrate 810 may be used to provide electrical connection between the conductive pads 840 and the conductive pads 850 (such as bonding pads) that are located on another surface (e.g. a surface S8 opposite to the surface S7 along the direction Z) of the substrate 810. In certain embodiments, some of the conductive pads 850 are electrically connected to the semiconductor dies 820*a* and 820*b* through these through insulator vias or interconnects (not shown) in addition to some of the conductive pads 840 and the bonding wires 830*a*, 830*b*.

In some embodiments, the conductive pads 850 of the package 800 are electrically connected to the conductive pillars 180 through the conductive terminals 190 that are sandwiched therebetween. In some embodiments, the redistribution circuit structure 110 is electrically connected to the substrate 810 of the package 800 through the conductive pillars 180, the conductive terminals 190, and the conductive pads 850. In some embodiments, some of the conductive terminals 150A are electrically connected to the substrate 810 of the package 800 through the redistribution circuit structure 110, the conductive pillars 180, the conductive terminals 190, and the conductive pads 850. In some embodiments, the semiconductor dies 230, 240 are, independently, electrically connected to the semiconductor dies 820*a*, 820*b* of the package 800 through the redistribution circuit structure 110, the conductive pillars 180, the conductive terminals 190, the conductive pads 850, the conductive pads 840, and the bonding wires 830*a*, 830*b*. In other words, the semiconductor dies 820*a*, 820*b* are electrically communicated to the semiconductor dies 230, 240, for example. In some embodiments, the semiconductor device P3 is referred to as an InFO package of a PoP structure. The package structure 7000 may be referred to as a flip chip package with a PoP InFO package.

Figure 30:
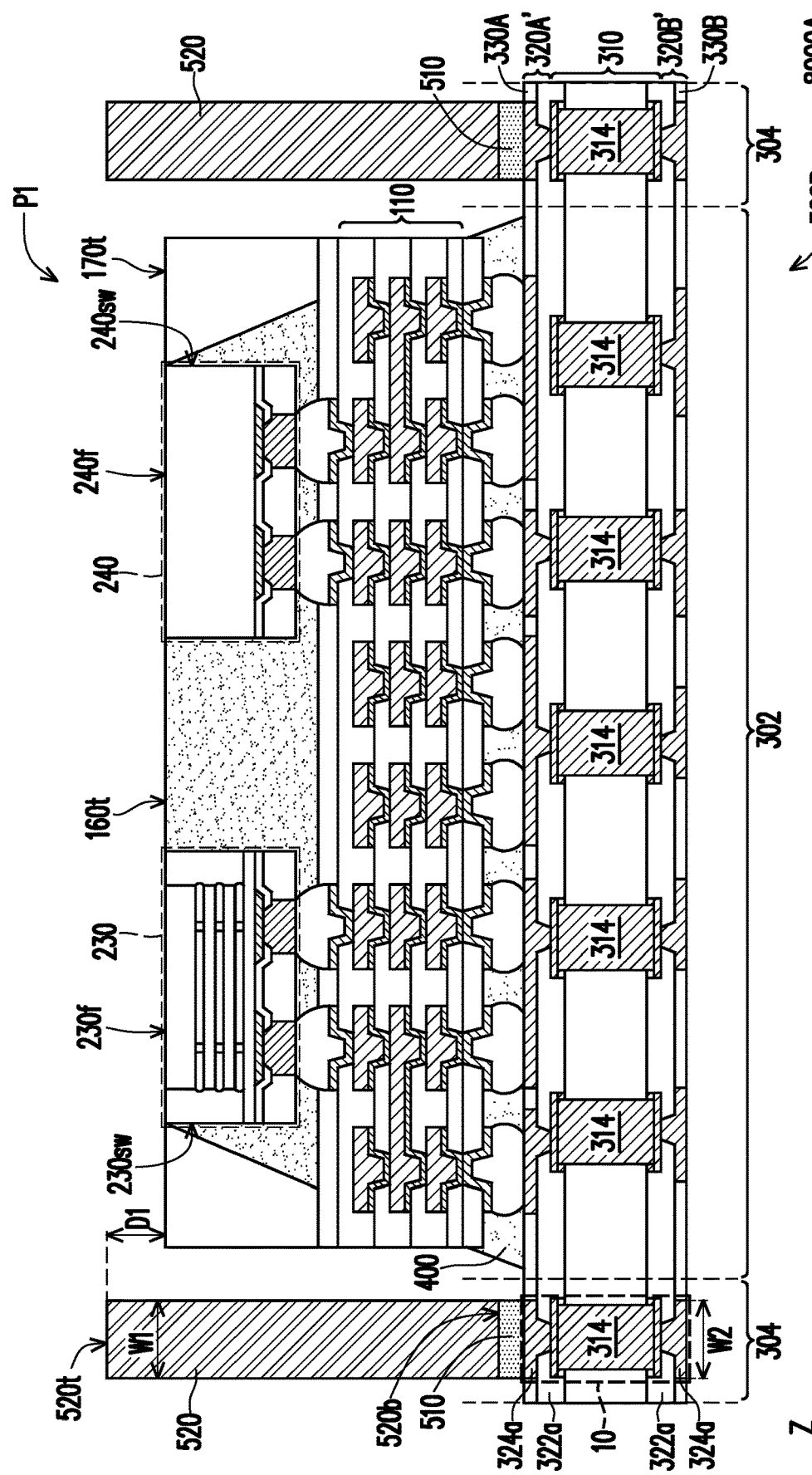
FIG. 30 is a schematic cross-sectional view showing a package structure in accordance with some embodiments of the disclosure.
Figure 31:
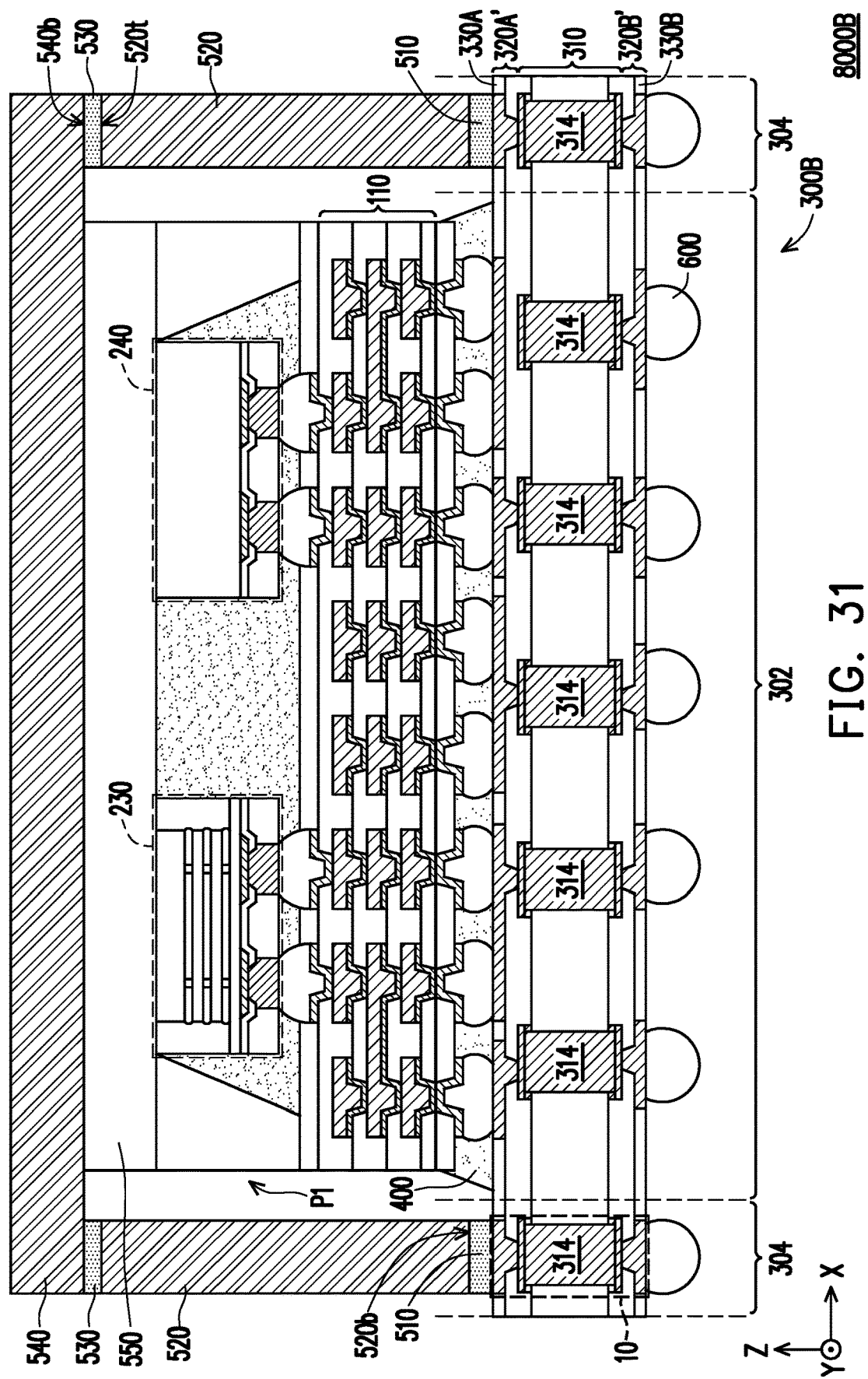
FIG. 31 is a schematic cross-sectional view showing a package structure in accordance with some embodiments of the disclosure.

FIG. 30 is a schematic cross-sectional view showing a package structure 8000A in accordance with some embodiments of the disclosure. FIG. 31 is a schematic cross-sectional view showing a package structure 8000B in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. In some embodiments, the package structure 8000A of FIG. 30 is similar to the package structure 1000A of FIGS. 14A and 14B; the difference is that, in the package structure 8000A, the substrate 300A is substituted with a substrate 300B, where the substrate 300B includes a core portion 310, a routing portion 320A', a routing portion 320B', a solder resist layer 330A and a solder resist layer 330B. The details of the core portion 310, the solder resist layer 330A and the solder resist layer 330B have been previously described in FIG. 12A, FIG. 12B and FIG. 16A, and the formation, material and configuration of the routing portions 320A' and 320B' are similar to or the same as to the process, material and configuration of forming the routing portions 320A and 320B as previously described in FIG. 12A, FIG. 12B and FIG. 16A; thus are not repeat herein for brevity.

In some embodiments, the routing portion 320A' and the routing portion 320B' are disposed on two opposite sides of the core portion 310, the solder resist layer 330A is disposed on the routing portion 320A', and the solder resist layer 330B is disposed on the routing portion 320B'. The routing portions 320A' and 320B' are electrically coupled to each other through the core portion 310. As shown in FIG. 30, for example, the routing portion 320A' and the routing portion 320B' each include only one routing layer, such as the dielectric layer 322a and the conductive layer 324a disposed thereon. The formation, material and configuration of the routing portions 320A' and 320B' are similar to or the same as to the process, material and configuration of forming the routing portions 320A and 320B as previously described in FIG. 12A, FIG. 12B and FIG. 16A, and thus are not repeated herein for brevity. In addition, a lid (e.g. 540) may be adopted for better heat dissipation and a plurality of conductive terminals (e.g. 600) may be adopted for further electrical connection to the external components, see the package structure 8000B of FIG. 31. In other alternative embodiments, the conductive terminals (e.g. 600) may also be adopted in the package structure 8000A.

In the above embodiments, the substrate 300A and the substrate 300B are a cored substrate or a cored circuit substrate. However, the disclosure is not limited thereto; alternatively, a substrate (e.g. 300C, 300D, and 300E) of the disclosure may be a coreless substrate or a coreless circuit substrate.

Figure 32:
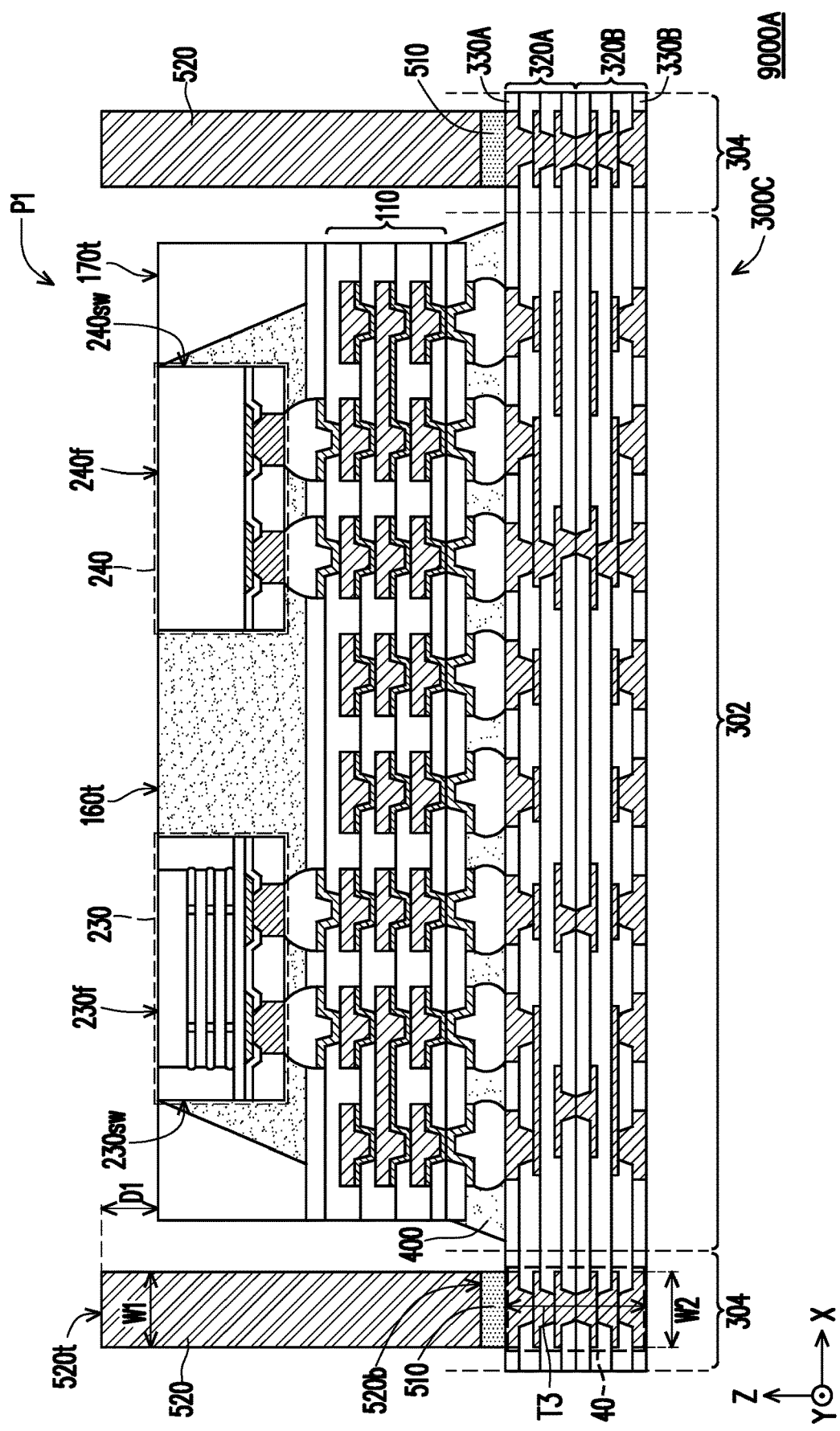
FIG. 32 is a schematic cross-sectional view showing a package structure in accordance with some embodiments of the disclosure.
Figure 33:
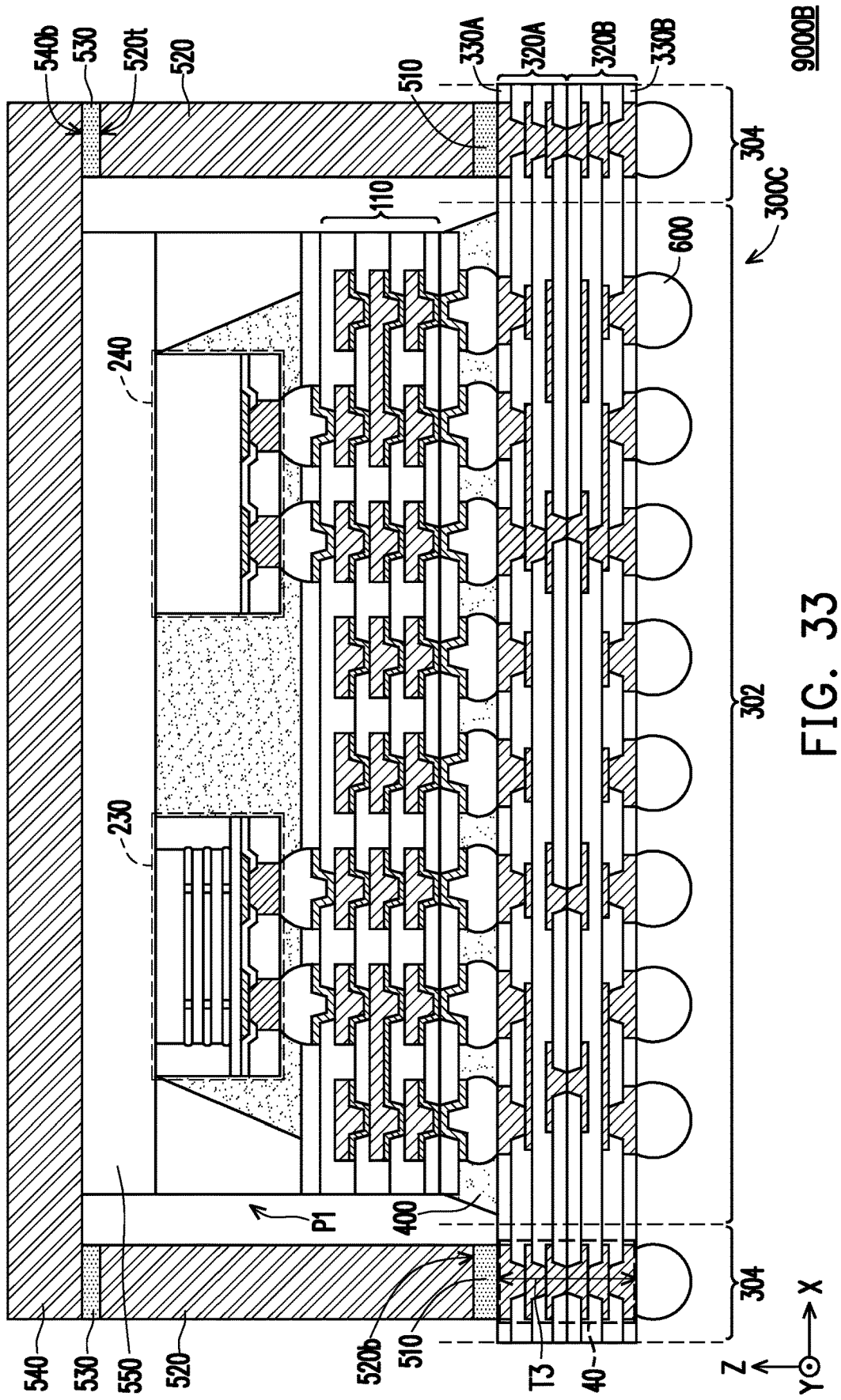
FIG. 33 is a schematic cross-sectional view showing a package structure in accordance with some embodiments of the disclosure.

FIG. 32 is a schematic cross-sectional view showing a package structure 9000A in accordance with some embodiments of the disclosure. FIG. 33 is a schematic cross-sectional view showing a package structure 9000B in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. In some embodiments, the package structure 9000A of FIG. 32 is similar to the package structure 1000A of FIGS. 14A and 14B; the difference is that, in the package structure 9000A, the substrate 300A is substituted with a substrate 300C, where the substrate 300C includes a routing portion 320A, a routing portion 320B, a solder resist layer 330A and a solder resist layer 330B. The details of the routing portion 320A, the routing portion 320B, the solder resist layer 330A and the solder resist layer 330B have been previously described in FIG. 12A, FIG. 12B and FIG. 16A; thus, are not repeat herein for brevity.

In such embodiments, the ring structure 10 is substituted by a ring structure 40, where the ring structure 40 includes a first portion 11 and a second portion 12 connected thereto. The details of the first portion 11 and the second portion 12 of the supporting structure 40 are identical to the first portion 11 and the second portion 12 of the supporting structure 10 previously described in FIG. 12A, FIG. 12B and FIG. 16A, and the configuration of the supporting structure 40 and the ring structure 520 are the same as or similar to the configuration of the supporting structure 10 and the ring structure 520 previously described in FIG. 14A and FIG. 14B; thus are not repeat herein for brevity. In some embodiments, the routing portion 320A is connected to (e.g. in contact with) the routing portion 320B, the solder resist layer 330A is disposed on the routing portion 320A, and the solder resist layer 330B is disposed on the routing portion 320B. That is, for example, the routing portions 320A and 320B are electrically coupled to each other, directly. In addition, a lid (e.g. 540) may be adopted for better heat dissipation and a plurality of conductive terminals (e.g. 600) may be adopted for further electrical connection to the external components, see the package structure 9000B of FIG. 33. In other alternative embodiments, the conductive terminals (e.g. 600) may also be adopted in the package structure 9000A.

As shown in FIG. 32 and FIG. 33, a thickness T3 of the supporting structure 40 is substantially the same as a thickness (not labeled) of the substrate 300C as measured along the direction Z. However, the disclosure is not limited thereto; alternatively, the thickness T3 of the supporting structure 40 may be less than the thickness of the substrate 300C.

In one embodiment, the supporting structure included in the package structures 9000A and/or 9000B may include only the first portion 11 or the second portion 12. In other words, if considering the supporting structure included in the package structures 9000A and/or 9000B includes only the first portion 11, the supporting structure may extend from a first outermost surface of the substrate 300C into the substrate 300C and may not be accessibly revealed by a second outmost surface of the substrate 300C. For example, the first outermost surface of the substrate 300C is opposite to the second outermost surface of the substrate 300C, and the first outmost surface is disposed with the semiconductor device P1.

On the other hand, if considering the supporting structure included in the package structures 9000A and/or 9000B includes only the second portion 12, the supporting structure may extend from a second outermost surface of the substrate 300C into the substrate 300C and may not be accessibly revealed by a first outmost surface of the substrate 300C. For example, the first outermost surface of the substrate 300C is opposite to the second outermost surface of the substrate 300C, and the first outmost surface is disposed with the semiconductor device P1.

In addition, in some other embodiments, the supporting structure included in the package structures 9000A and/or 9000B may include the first portion 11 and a part of the second portion 12 or includes the second portion 12 and a part of the first portion 11, which has the thickness less than the thickness of the substrate 300C and may be only accessibly exposed by the first outermost surface of the substrate 300C or the second outermost surface of the substrate 300C.

Figure 34:
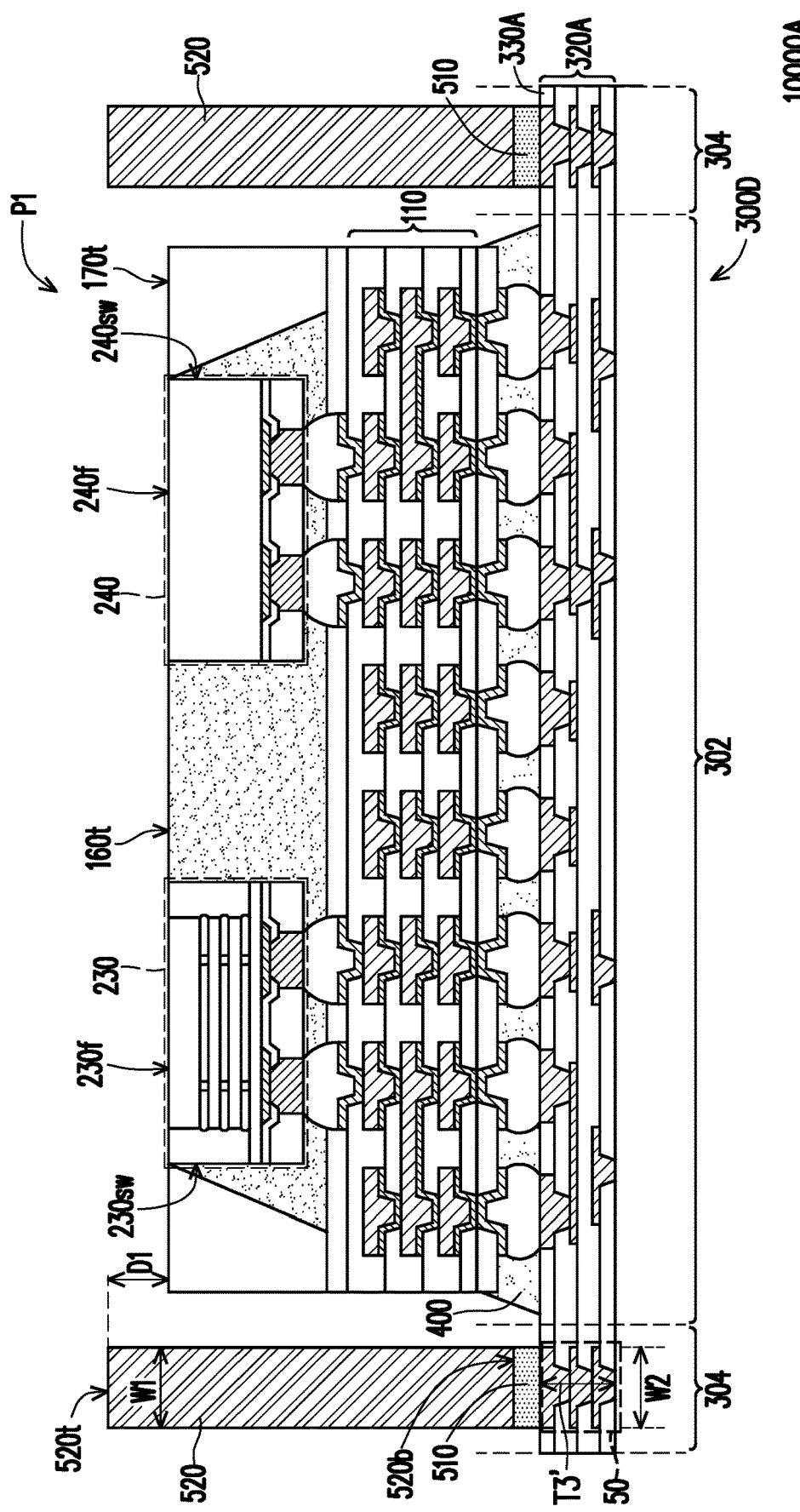
FIG. 34 is a schematic cross-sectional view showing a package structure in accordance with some embodiments of the disclosure.
Figure 35:
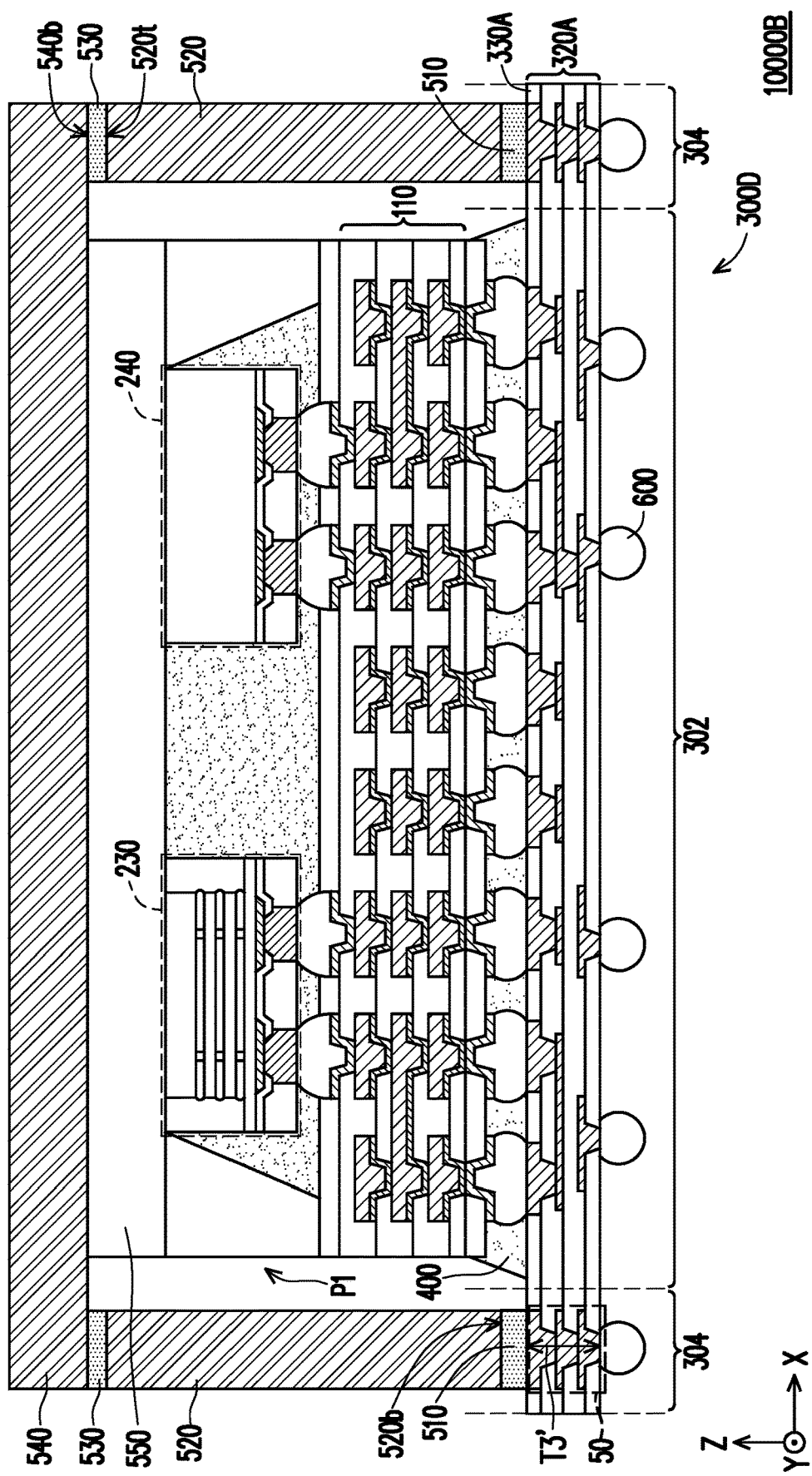
FIG. 35 is a schematic cross-sectional view showing a package structure in accordance with some embodiments of the disclosure.

FIG. 34 is a schematic cross-sectional view showing a package structure 10000A in accordance with some embodiments of the disclosure. FIG. 35 is a schematic cross-sectional view showing a package structure 10000B in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. In some embodiments, the package structure 10000A of FIG. 34 is similar to the package structure 1000A of FIGS. 14A and 14B; the difference is that, in the package structure 10000A, the substrate 300A is substituted with a substrate 300D, where the substrate 300D includes a routing portion 320A and a solder resist layer 330A disposed thereon. The details of the routing portion 320A and the solder resist layer 330A have been previously described in FIG. 12A, FIG. 12B and FIG. 16A; thus, are not repeat herein for brevity.

In the embodiments, the ring structure 10 is substituted by a ring structure 50, where the ring structure 50 may include a first portion 11, only. The details of the first portion 11 of the supporting structure 50 are identical to the first portion 11 of the supporting structure 10 previously described in FIG. 12A, FIG. 12B and FIG. 16A, and the configuration of the supporting structure 50 and the ring structure 520 are the same as or similar to the configuration of the supporting structure 10 and the ring structure 520 previously described in FIG. 14A and FIG. 14B; thus are not repeat herein for brevity. In addition, a lid (e.g. 540) may be adopted for better heat dissipation and a plurality of conductive terminals (e.g. 600) may be adopted for further electrical connection to the external components, see the package structure 10000B of FIG. 35. In other alternative embodiments, the conductive terminals (e.g. 600) may also be adopted in the package structure 10000A.

As shown in FIG. 34 and FIG. 35, a thickness T3' of the supporting structure 50 is substantially the same as a thickness (not labeled) of the substrate 300D as measured along the direction Z. However, the disclosure is not limited thereto; alternatively, the thickness T3' of the supporting structure 50 may be less than the thickness of the substrate 300D. In one embodiment, the supporting structure included in the package structures 10000A and/or 10000B has a number of routing layers include in the first portion 11 being less than a number of routing layers include in the routing portion 320A of the substrate 300D. In other words, if considering the routing layers included in the routing portion 320A of the substrate 300D is three, the routing layers included in the first portion 11 of the supporting structure is greater than one and less than three. For one example, the supporting structure is extended from a first outermost surface of the substrate 300D into the substrate 300D and is not accessibly revealed by a second outmost surface of the substrate 300D. For another one example, the supporting structure is extended from a second outermost surface of the substrate 300D into the substrate 300D and is not accessibly revealed by a first outmost surface of the substrate 300D. In some embodiments, the first outermost surface of the substrate 300D is opposite to the second outermost surface of the substrate 300D, and the first outmost surface is disposed with the semiconductor device P1.

However, the disclosure is not limited thereto; alternatively, the package structure 10000A and/or 10000B may include a routing portion 320B and a solder resist layer 330B disposed thereon, instead. In such alternative embodiments, the supporting structure included in the package structures 10000A and/or 10000B has a number of routing layers include in the second portion 12 being less than a number of routing layers include in the routing portion 320B of the substrate 300D. In other words, if considering the routing layers included in the routing portion 320B of the substrate 300D is three, the routing layers included in the second portion 12 of the supporting structure is greater than one and less than three. For one example, the supporting structure is extended from a first outermost surface of the substrate 300D into the substrate 300D and is not accessibly revealed by a second outmost surface of the substrate 300D; or, the supporting structure is extended from a second outermost surface of the substrate 300D into the substrate 300D and is not accessibly revealed by a first outmost surface of the substrate 300D. In some embodiments, the first outermost surface of the substrate 300D is opposite to the second outermost surface of the substrate 300D, and the first outmost surface is disposed with the semiconductor device P1.

Figure 36:
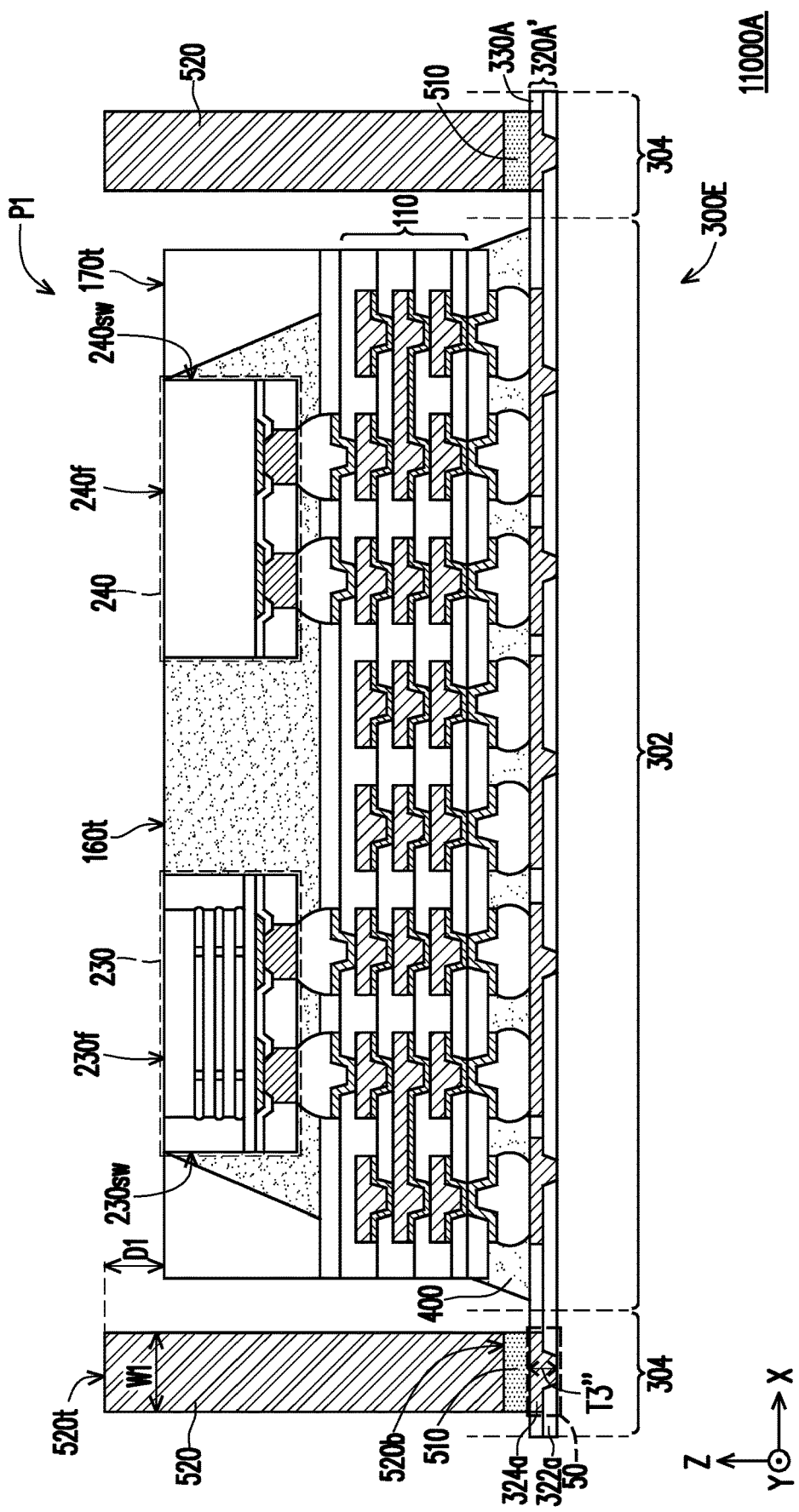
FIG. 36 is a schematic cross-sectional view showing a package structure in accordance with some embodiments of the disclosure.
Figure 37:
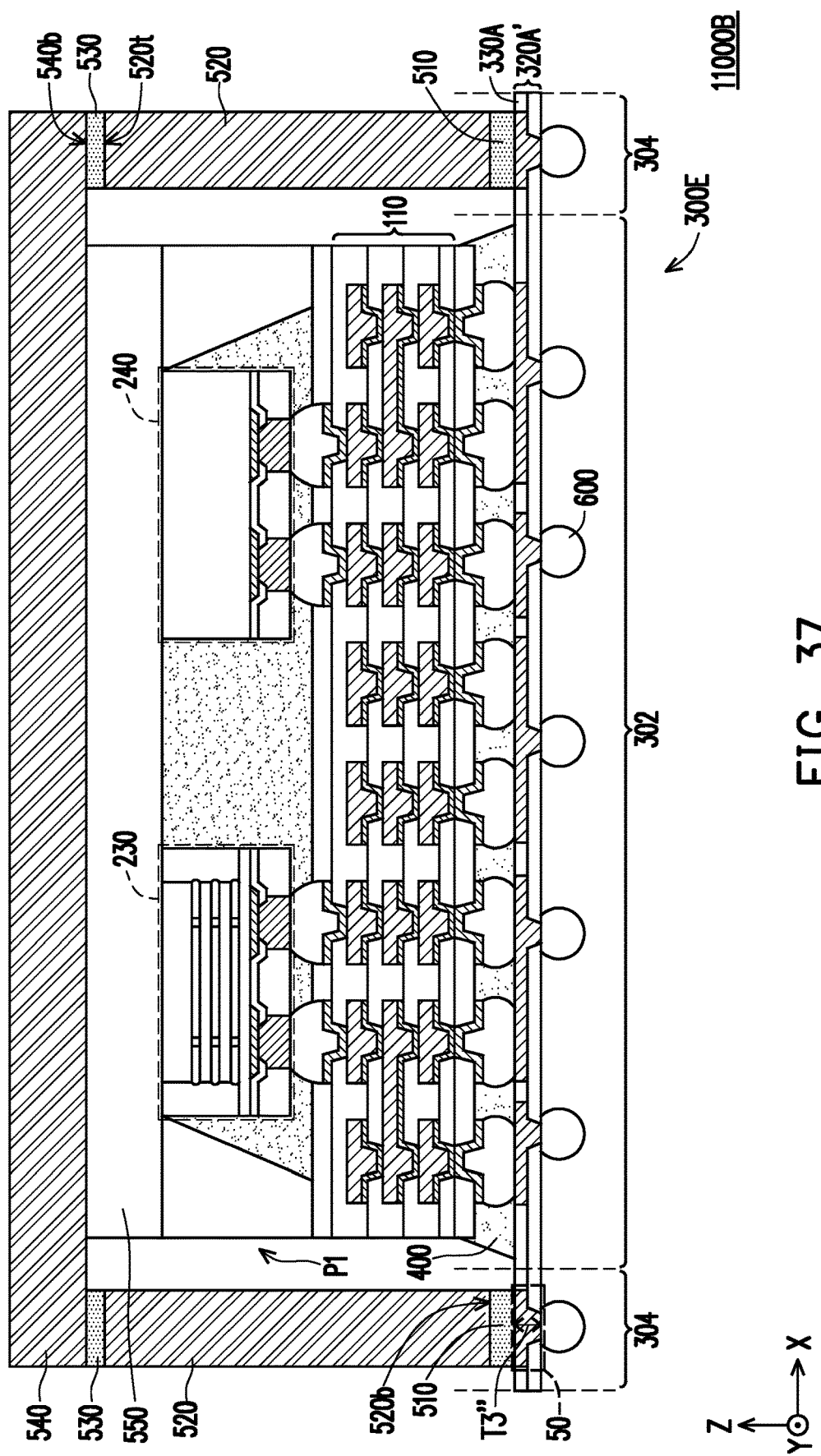
FIG. 37 is a schematic cross-sectional view showing a package structure in accordance with some embodiments of the disclosure.

FIG. 36 is a schematic cross-sectional view showing a package structure 11000A in accordance with some embodiments of the disclosure. FIG. 37 is a schematic cross-sectional view showing a package structure 11000B in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. In some embodiments, the package structure 11000A of FIG. 36 is similar to the package structure 1000A of FIGS. 14A and 14B; the difference is that, in the package structure 11000A, the substrate 300A is substituted with a substrate 300E, where the substrate 300E includes a routing portion 320A' and a solder resist layer 330A disposed thereon. The details of the solder resist layer 330A have been previously described in FIG. 12A, FIG. 12B and FIG. 16A, and the formation, material and configuration of the routing portion 320A are similar to or the same as to the process, material and configuration of forming the routing portion 320A as previously described in FIG. 12A, FIG. 12B and FIG. 16A; thus are not repeat herein for brevity. As shown in FIG. 36, for example, the routing portion 320A' includes only one routing layer, such as the dielectric layer 322a and the conductive layer 324a disposed thereon.

In the embodiments, the ring structure 10 is substituted by a ring structure 50, where the ring structure 50 may include a first portion 11, only. The details of the first portion 11 of the supporting structure 50 are identical to the first portion 11 of the supporting structure 10 previously described in FIG. 12A, FIG. 12B and FIG. 16A, and the configuration of the supporting structure 50 and the ring structure 520 are the same as or similar to the configuration of the supporting structure 10 and the ring structure 520 previously described in FIG. 14A and FIG. 14B; thus are not repeat herein for brevity. In addition, a lid (e.g. 540) may be adopted for better heat dissipation and a plurality of conductive terminals (e.g. 600) may be adopted for further electrical connection to the external components, see the package structure 11000B of FIG. 37. In other alternative embodiments, the conductive terminals (e.g. 600) may also be adopted in the package structure 11000A.

As shown in FIG. 36 and FIG. 37, for example, a thickness T3" of the supporting structure 50 is substantially the same as a thickness (not labeled) of the substrate 300E as measured along the direction Z. In some embodiments, the supporting structure 50 is extended from a first outermost surface of the substrate 300E into the substrate 300E and is accessibly revealed by a second outmost surface of the substrate 300D. For example, the first outermost surface of the substrate 300E is opposite to the second outermost surface of the substrate 300E, and the first outmost surface is disposed with the semiconductor device P1. That is, the supporting structure 50 penetrates through the substrate 300E.

However, the disclosure is not limited thereto; alternatively, the package structure 11000A and/or 11000B may include a routing portion 320B' and a solder resist layer 330B disposed thereon, instead. For example, the routing portion 320B' includes only one routing layer, such as the dielectric layer 322a and the conductive layer 324a disposed thereon.

It is appreciated that the modifications to the package structure 1000A may also be adopted by the package structures 7000, 8000A, 8000B, 9000A, 9000B, 10000A, 10000B, 11000A, 11000B, if applicable. Since the details of the modifications to the package structure 1000A have been described in FIG. 16A through FIG. 28, the detailed descriptions are omitted for brevity.

In accordance with some embodiments, a package structure includes a circuit substrate, a semiconductor device and a ring structure. The circuit substrate has a first region and a second region connected to the first region, where the circuit substrate includes at least one routing layer. The at least one routing layer includes a dielectric portion and a conductive portion disposed over the dielectric portion, where a first ratio of a total volume of the conductive portion of the at least one routing layer within the first region to a total volume of the dielectric portion and the conductive portion of the at least one routing layer within the first region is less than a second ratio of a total volume of the conductive portion of the at least one routing layer within the second region to a total volume of the dielectric portion and the conductive portion of the at least one routing layer within the second region. The semiconductor device is disposed over the circuit substrate within the first region, where the semiconductor device is electrically coupled to the circuit substrate. The ring structure is disposed over the circuit substrate within the second region.

In accordance with some embodiments, a package structure includes a substrate, a semiconductor device, a metallic supporting structure and a ring structure. The substrate has a first region and a second region surrounding the first region. The semiconductor device is disposed over the substrate within the first region and electrically coupled to the substrate. The metallic supporting structure is located in the substrate within the second region and electrically isolated from the semiconductor device. The ring structure is disposed over the substrate within the second region, where the ring structure is overlapped with the metallic supporting structure in a vertical projection on the substrate along a stacking direction of the ring structure and the substrate.

In accordance with some embodiments, a method of manufacturing a package structure includes the following steps: providing a circuit substrate having a first region and a second region connected to the first region, the circuit substrate comprising at least one routing layer comprising a dielectric portion and a conductive portion disposed over the dielectric portion, and a first ratio of a total volume of the conductive portion comprised in the at least one routing layer within the first region to a total volume of the dielectric portion and the conductive portion comprised in the at least one routing layer within the first region being less than a second ratio of a total volume of the conductive portion comprised in the at least one routing layer within the second region to a total volume of the dielectric portion and the conductive portion comprised in the at least one routing layer within the second region; providing a semiconductor device over the circuit substrate; mounting the semiconductor device onto the circuit substrate within the first region, the semiconductor device being electrically coupled to the circuit substrate; and disposing a ring structure over the circuit substrate within the second region.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a circuit substrate, having a first region and a second region connected to and enclosing the first region, wherein a vertical projection of the first region is next to a vertical projection of the second region, wherein the circuit substrate comprises:
   a core substrate;
   a plurality of conductive vias, penetrating through the core substrate;
   at least one routing layer, comprising a dielectric portion and a conductive portion disposed over the dielectric portion; and
   at least one additional routing layer, wherein the at least one routing layer and the at least one additional routing layer are located on opposite sides of the core substrate and electrically coupled to each other through the plurality of conductive vias,
   wherein a first ratio of a total volume of the conductive portion of the at least one routing layer within the first region to a total volume of the dielectric portion and the conductive portion of the at least one routing layer within the first region is less than a second ratio of a total volume of the conductive portion of the at least one routing layer within the second region to a total volume of the dielectric portion and the conductive portion of the at least one routing layer within the second region,
   wherein a third ratio of a total volume of a conductive portion comprised in the core substrate within the first region to a total volume of a dielectric portion and a conductive portion comprised in the core substrate within the first region is less than a fourth ratio of a total volume of a conductive portion comprised in the core substrate within the second region to a total volume of a dielectric portion and a conductive portion comprised in the core substrate within the second region;
   a semiconductor device, disposed over the circuit substrate within the first region, wherein the semiconductor device is electrically coupled to the circuit substrate; and
   a ring structure, disposed over the circuit substrate within the second region.

2. The package structure of claim 1, wherein the first ratio is less than 80%, and the second ratio is greater than or substantially equal to 80%.

3. The package structure of claim 1, wherein there is no dielectric portion comprised in the at least one routing layer within the second region.

4. The package structure of claim 1, wherein the at least one routing layer comprises a plurality of routing layers stacked on and electrically coupled to one another in a stacking direction of the semiconductor device and the circuit substrate.

5. The package structure of claim 1, wherein:
the at least one routing layer is sandwiched between the semiconductor device and the core substrate, or
the at least one additional routing layer is sandwiched between semiconductor device and the core substrate.

6. The package structure of claim 1, wherein a fifth ratio of a total volume of a conductive portion comprised in the at least one additional routing layer within the first region to a total volume of a dielectric portion and a conductive portion comprised in the at least one additional routing layer within the first region is less than a sixth ratio of a total volume of a conductive portion comprised in the at least one additional routing layer within the second region to a total volume of a dielectric portion and a conductive portion comprised in the at least one additional routing layer within the second region.

7. The package structure of claim 1, wherein an peripheral edge of the first region is entirely in contact with the second region.

8. A package structure, comprising:
a substrate, having a first region and a second region surrounding the first region, wherein a vertical projection of the first region is next to a vertical projection of the second region, wherein the substrate comprises:
  a base substrate;
  a plurality of through vias, penetrating the base substrate;
  a first redistribution circuit structure, disposed over a first side of the base substrate and electrically connected to the plurality of through vias; and
  a second redistribution circuit structure, disposed over a second side of the base substrate and electrically connected to the plurality of through vias, wherein the first redistribution circuit structure is electrically coupled to the second redistribution circuit structure through the plurality of through vias;
a semiconductor device, disposed over the substrate within the first region and electrically coupled to the substrate;
a metallic supporting structure, located in the substrate within the second region and electrically isolated from the semiconductor device, wherein the metallic supporting structure is embedded in and penetrates through the base substrate and the first redistribution circuit structure; and
a ring structure, disposed over the substrate within the second region, wherein the ring structure is overlapped with the metallic supporting structure in a vertical projection on the substrate along a stacking direction of the ring structure and the substrate, and the first side is opposite to the second side along the stacking direction.

9. The package structure of claim 8, wherein the metallic supporting structure is free of the second redistribution circuit structure.

10. The package structure of claim 8, wherein the metallic supporting structure is further embedded in and penetrates through the second redistribution circuit structure.

11. The package structure of claim 8, wherein in a cross-section of the package structure along the stacking direction,
a lateral size of the metallic supporting structure is less than a lateral size of the second region, and the lateral size of the metallic supporting structure is greater than, less than or substantially equal to a lateral size of the ring structure.

12. The package structure of claim 8, wherein in a cross-section of the package structure along the stacking direction,
a lateral size of the metallic supporting structure is substantially equal to a lateral size of the second region, and the lateral size of the metallic supporting structure is greater than or substantially equal to a lateral size of the ring structure.

13. The package structure of claim 8, further comprising:
a lid, disposed over and thermally coupled to the ring structure and the semiconductor device; and
a thermal interface material, interposed between and thermally coupling the lid and the semiconductor device.

14. The package structure of claim 8, wherein in a cross-section of the package structure along the stacking direction,
the ring structure is completely outside the first region.

15. The package structure of claim 8, wherein the semiconductor device and the ring structure are located on the first side of the base substrate.

16. The package structure of claim 8, wherein the semiconductor device and the ring structure are located on the second side of the base substrate.

17. A method of manufacturing a package structure, comprising:
providing a circuit substrate having a first region and a second region connected to and enclosing the first region, the circuit substrate comprising a core substrate, a plurality of conductive vias penetrating through the core substrate, at least one routing layer comprising a dielectric portion and a conductive portion disposed over the dielectric portion and an additional routing layer, a first ratio of a total volume of the conductive portion comprised in the at least one routing layer within the first region to a total volume of the dielectric portion and the conductive portion comprised in the at least one routing layer within the first region being less than a second ratio of a total volume of the conductive portion comprised in the at least one routing layer within the second region to a total volume of the dielectric portion and the conductive portion comprised in the at least one routing layer within the second region, and a third ratio of a total volume of a conductive portion comprised in the core substrate within the first region to a total volume of a dielectric portion and a conductive portion comprised in the core substrate within the first region being less than a fourth ratio of a total volume of a conductive portion comprised in the core substrate within the second region to a total volume of a dielectric portion and a conductive portion comprised in the core substrate within the second region, wherein a vertical projection of the first region is next to a vertical portion projection of the second region;
providing a semiconductor device over the circuit substrate;
mounting the semiconductor device onto the circuit substrate within the first region, the semiconductor device being electrically coupled to the circuit substrate; and
disposing a ring structure over the circuit substrate within the second region.

18. The method of claim 17, wherein providing the circuit substrate comprises forming the at least one routing layer, wherein forming the at least one routing layer comprises:
  forming a dielectric material;
    patterning the dielectric material to form the dielectric portion within the first region and the second region; and
    forming a conductive material on the dielectric portion to form the conductive portion within the first region and the second region,
  wherein the first ratio is less than 80%, and the second ratio is greater than or substantially equal to 80%.

19. The method of claim 18, wherein providing the circuit substrate further comprises:
  forming the core substrate with the plurality of conductive vias penetrating therethrough prior to forming the at least one routing layer; and
  forming the at least one additional routing layer, comprising:
    forming an additional dielectric material over the core substrate;
    patterning the additional dielectric material to form an additional dielectric portion within the first region and the second region; and
    forming an additional conductive material over the additional dielectric portion to form an additional conductive portion within the first region and the second region,
  wherein the at least one routing layer and the at least one additional routing layer are located at opposite sides of the core substrate.

20. The method of claim 19, wherein the at least one additional routing layer is formed with a fifth ratio of a total volume of a conductive portion comprised in the at least one additional routing layer within the first region to a total volume of a dielectric portion and a conductive portion comprised in the at least one additional routing layer within the first region being less than a sixth ratio of a total volume of a conductive portion comprised in the at least one additional routing layer within the second region to a total volume of a dielectric portion and a conductive portion comprised in the at least one additional routing layer within the second region.

* * * * *